United States Patent [19]

Saitoh et al.

[11] Patent Number: 5,319,444
[45] Date of Patent: * Jun. 7, 1994

[54] POSITION DETECTING METHOD AND APPARATUS

[75] Inventors: Kenji Saitoh, Yokohama; Masakazu Matsugu, Atsugi; Yukichi Niwa, Narashino; Noriyuki Nose, Machida; Minoru Yoshii, Tokyo; Shigeyuki Suda, Yokohama, all of Japan

[73] Assignee: Canon Kabushiki Kaisha, Tokyo, Japan

[ * ] Notice: The portion of the term of this patent subsequent to May 19, 2009 has been disclaimed.

[21] Appl. No.: 20,464

[22] Filed: Feb. 22, 1993

Related U.S. Application Data

[63] Continuation of Ser. No. 784,622, Oct. 31, 1991, abandoned, which is a continuation of Ser. No. 311,298, Feb. 15, 1989, abandoned, which is a continuation-in-part of Ser. No. 264,084, Oct. 28, 1988, abandoned.

[30] Foreign Application Priority Data

Feb. 16, 1988 [JP] Japan .................. 63-033203
Dec. 29, 1988 [JP] Japan .................. 63-334733

[51] Int. Cl.$^5$ .................. G01B 11/14; G01N 21/86
[52] U.S. Cl. .................. 356/375; 356/401; 250/548
[58] Field of Search .................. 356/372, 375, 399–401; 250/548, 237 G, 557

[56] References Cited

U.S. PATENT DOCUMENTS

| | | |
|---|---|---|
| 4,037,969 | 7/1977 | Feldman et al. . |
| 4,265,542 | 5/1981 | Snow . |
| 4,326,805 | 4/1982 | Feldman et al. . |
| 4,360,273 | 11/1982 | Thaxter . |
| 4,498,762 | 2/1985 | Uehara et al. .............. 356/401 |
| 4,545,683 | 10/1985 | Markle .............. 356/400 |
| 4,600,309 | 7/1986 | Fay . |
| 4,662,753 | 5/1987 | Yabu . |
| 4,694,186 | 9/1987 | Onoda et al. . |
| 4,728,193 | 3/1988 | Bartelt et al. . |
| 4,769,523 | 9/1988 | Tanimoto et al. .............. 356/400 |
| 4,835,078 | 5/1989 | Harvey et al. . |
| 5,114,236 | 5/1992 | Matsugu et al. .............. 356/401 |
| 5,162,656 | 11/1992 | Matsugu et al. .............. 250/548 |

FOREIGN PATENT DOCUMENTS

| | | |
|---|---|---|
| 0100526 | 2/1984 | European Pat. Off. . |
| 0336537 | 10/1989 | European Pat. Off. . |
| 3727453 | 3/1988 | Fed. Rep. of Germany . |
| 56-157033 | 4/1981 | Japan . |
| 61-278136 | 12/1986 | Japan . |

OTHER PUBLICATIONS

H. Chau, "Properties of Two Overlapping Zone Plates of Different Focal Lengths," Journ. of the Opt. Soc. of America, Feb. 1970, vol. 60, No. 2 pp. 255–259.

Chau, "Moire Pattern Resulting From Superposition of Two Zone Plates," Applied Optics, Aug. 1969, vol. 8, No. 8, pp. 1707–1712.

"A Dual Grating Alignment Technique for X-Ray Lithography", J. Vac. Sci. Technol. B1 (4), Kinoshita, et al., Oct.–Dec. 1983, pp. 1276–1279.

"Opt.-Heterodyne Detect. of Mask-to-Wafer Displac. for Fine Align.", Japan. Journal of Appl. Physics, Itoh, et al., vol. 25, No. 8, Aug. 1986, L684–L686.

Primary Examiner—Richard A. Rosenberger
Assistant Examiner—Hoa Q. Pham
Attorney, Agent, or Firm—Fitzpatrick, Cella, Harper & Scinto

[57] ABSTRACT

A method of detecting relative positional deviation between first and second objects. The method includes the steps of providing the first object with a first mark which functions as a lens, providing the second object with a second mark which functions as a lens, providing an optical system between the first and second objects, directing a radiation beam through the first mark and the optical system to the second mark, and detecting any shift of the radiation beam from the second mark irradiated with the radiation beam from the optical system, to detect the relative positional deviation of the first and second objects.

115 Claims, 36 Drawing Sheets

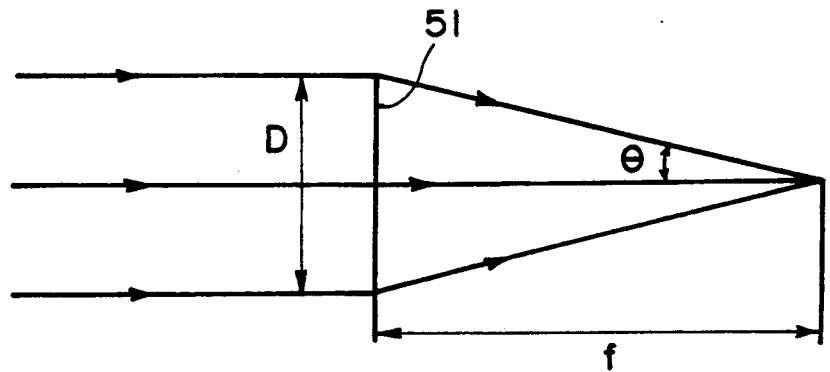
F I G. 7A
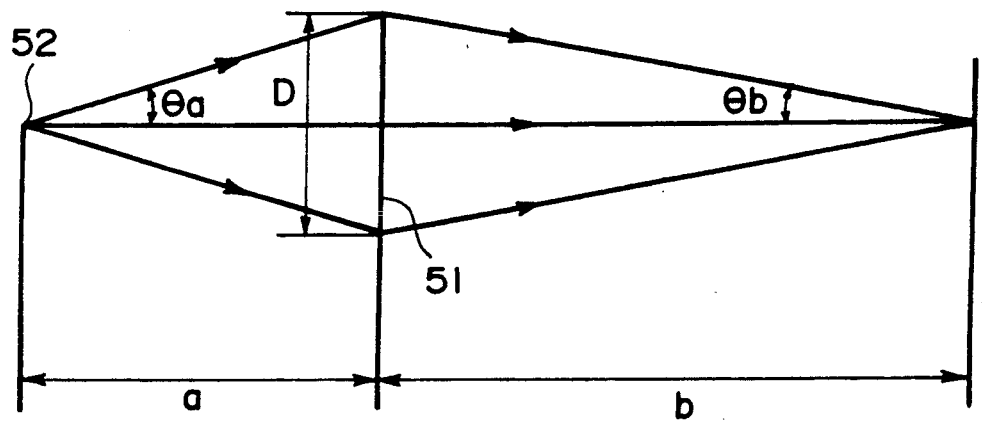
F I G. 7B

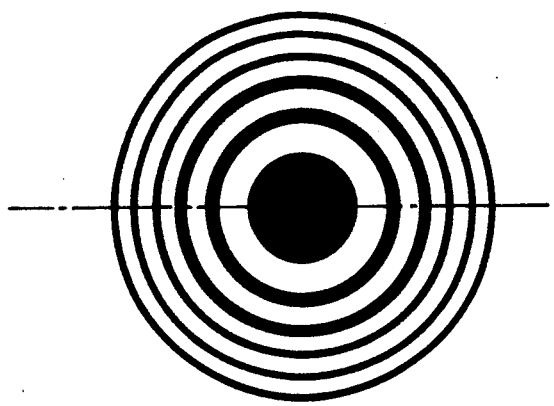 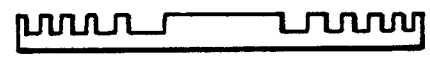
FIG. 8A.1  FIG. 8A.2
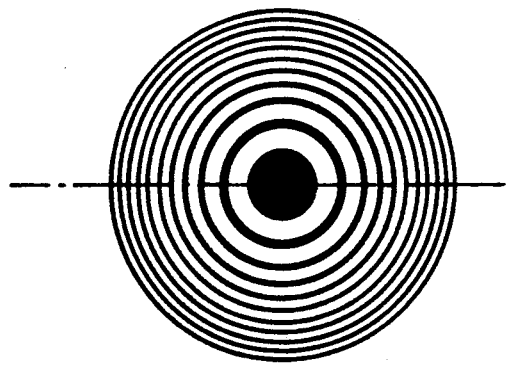 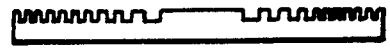
FIG. 8B.1  FIG. 8B.2

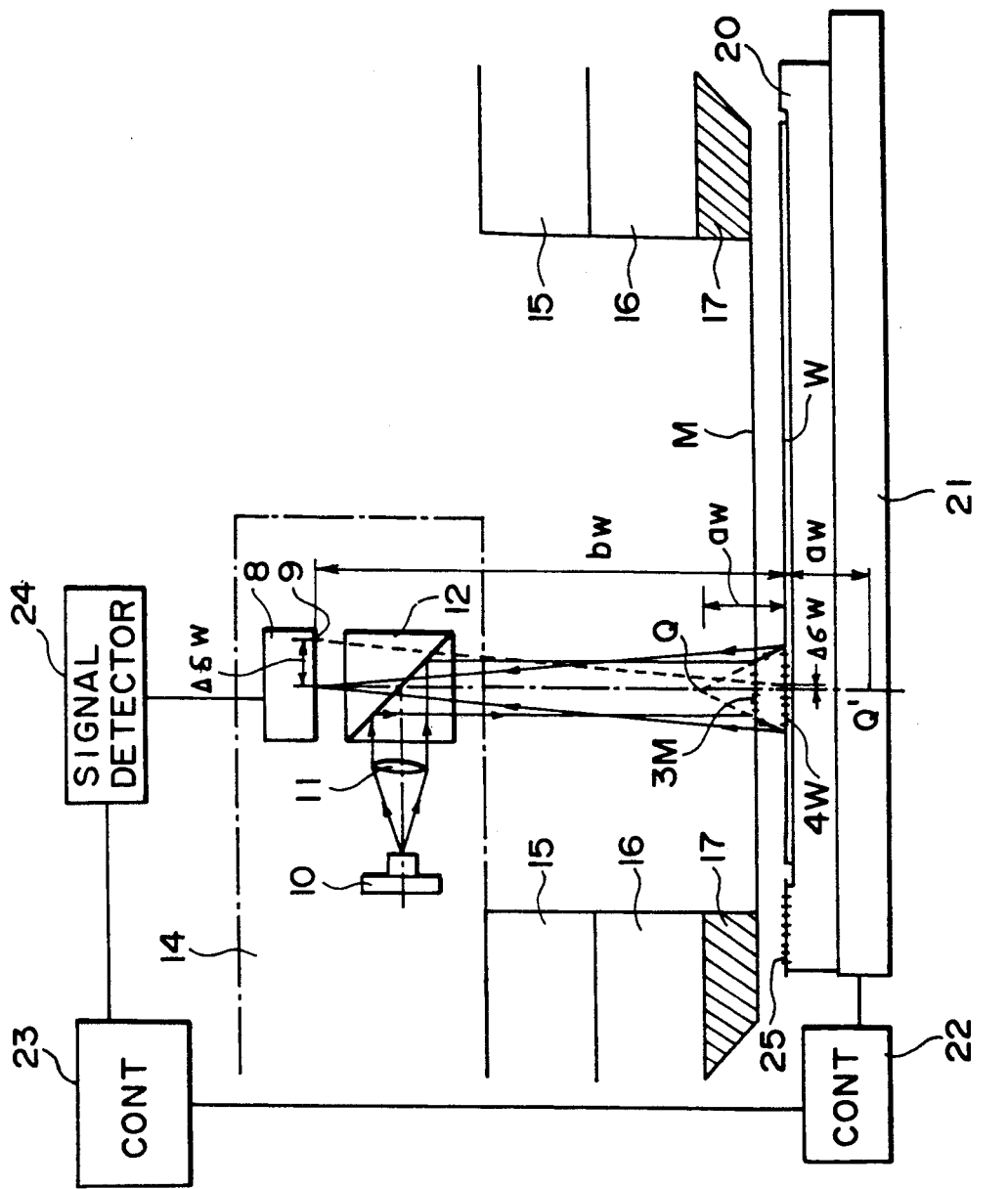
FIG. IIA

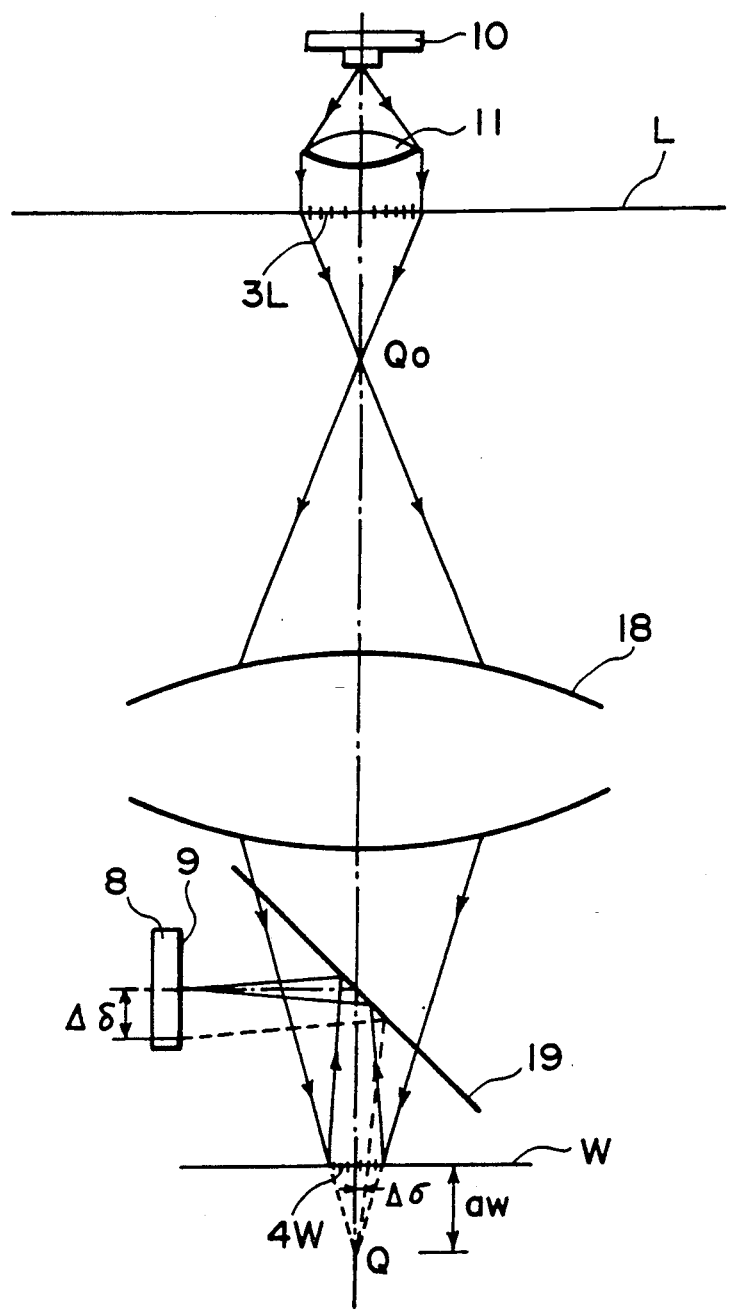
F I G. 18

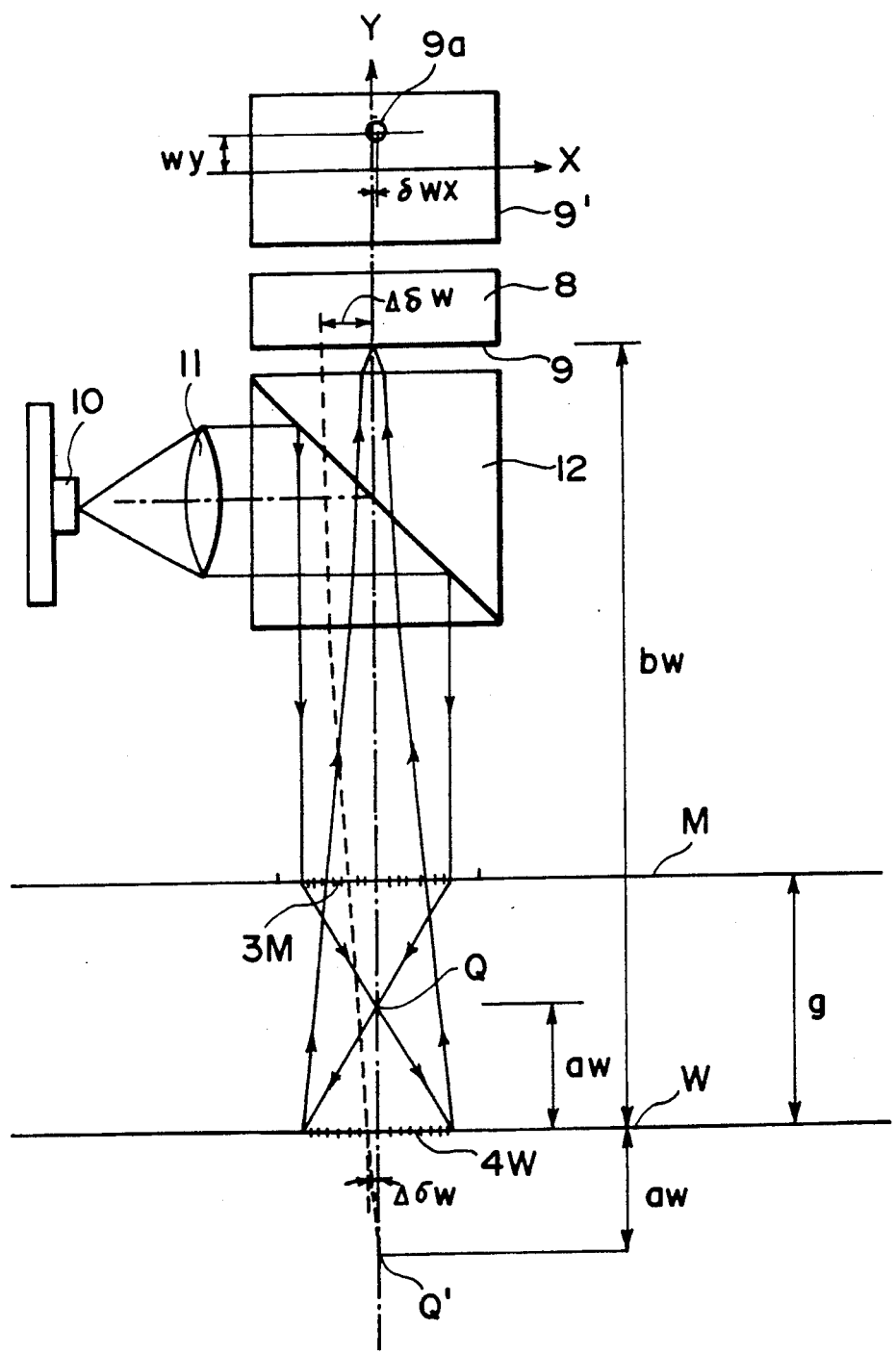
F I G. 19

POSITION DETECTING METHOD AND APPARATUS

This is a continuation of application Ser. No. 07/784,622 filed Oct. 31, 1991, now abandoned, which is a continuation of application Ser. No. 07/311,298 filed Feb. 15, 1989, now abandoned, which is a continuation-in-part of application Ser. No. 07/264,084 filed Oct. 28, 1988, now abandoned

FIELD OF THE INVENTION AND RELATED ART

This invention relates generally to an alignment system for correctly positioning an object. More particularly, the invention is concerned with a position detecting method and apparatus suitably usable in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, and for relatively positioning or aligning the mask and the wafer.

In exposure apparatuses for use in the manufacture of semiconductor devices, the relative alignment of a mask and a wafer is one important factor for ensuring improved performance. Particularly, as for alignment systems employed in recent exposure apparatuses, submicron alignment accuracies or more strict accuracies are required to satisfy the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. No. 4,037,969 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates.

In FIG. 1, a parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in a plane perpendicular to the optical axis containing the point 78, of an amount corresponding to the amount of deviation $\Delta\sigma$ of the wafer 60 with respect to the mask 68.

When in the illustrated alignment system the amount of relative positional deviation is to be determined, the lights from the zone plates provided on the mask and the wafer are independently imaged upon a predetermined plane at which the evaluation should be made, and the amount of deviation of each imaged light from a corresponding reference position is detected.

In this case, to simply evaluate direct images from the zone plates is not preferable because the displacement in the predetermined plane corresponding to the relative positional deviation is approximately of the same amount and is small. Therefore, in order to assure high-precision alignment, there is the necessity of using an enlarging system, for example, for enlarging the displacement in the predetermined plane.

If, however, such an enlarging system is provided, there arise some problems, an example of which is that the assembling precision of that system or any variation in the alignment process affects the accuracy, resulting in difficulty in detecting with high precision the amount of deviation of the light spot in the predetermined plane.

SUMMARY OF THE INVENTION

It is accordingly an object of the present invention to provide a position detecting method and apparatus which ensures high-precision position detection with a simple arrangement.

Briefly, in accordance with one aspect of the present invention, there is provided a device, usable in a proximity exposure apparatus for transferring a pattern formed on one of first and second objects onto the other, for detecting the relative position of the first and second objects in cooperation with first and second physical optic elements provided on the first and second objects, respectively, wherein each physical optic element has a lens function, the device comprising: a holder for holding the first and second objects in proximity to each other; light source means effective to project light upon the first physical optic element of the first object held by said holder, wherein the projected light is converged or diverged by the first physical optic element and impinges upon the second physical optic element of the second object held by the holder; light detecting means for detecting the light converged or diverged as a result of the impingement upon the second physical optic element, the light detecting means being adapted to detect the light having been influenced by a convex-lens action by one of the first and second physical optic elements and having been influenced by a concave-lens function by the other; and position detecting means for detecting the relative position of the first and second objects on the basis of the detection by the light detecting means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 7A and 7B illustrate the optical action of physical optic elements.

FIGS. 8A.1 and 8B.1 each exemplifies a pattern of a zone plate.

FIGS. 8A.2 and 8B.2 each is a section illustrating a phase type zone plate.

FIG. 11A is a schematic view showing a major portion of an exposure apparatus according to an embodiment of the present invention.

FIGS. 18–22 are schematic views each showing a major portion of an exposure apparatus according to an embodiment of the present invention.

DESCRIPTION OF THE PREFERRED EMBODIMENTS

Figure 1:
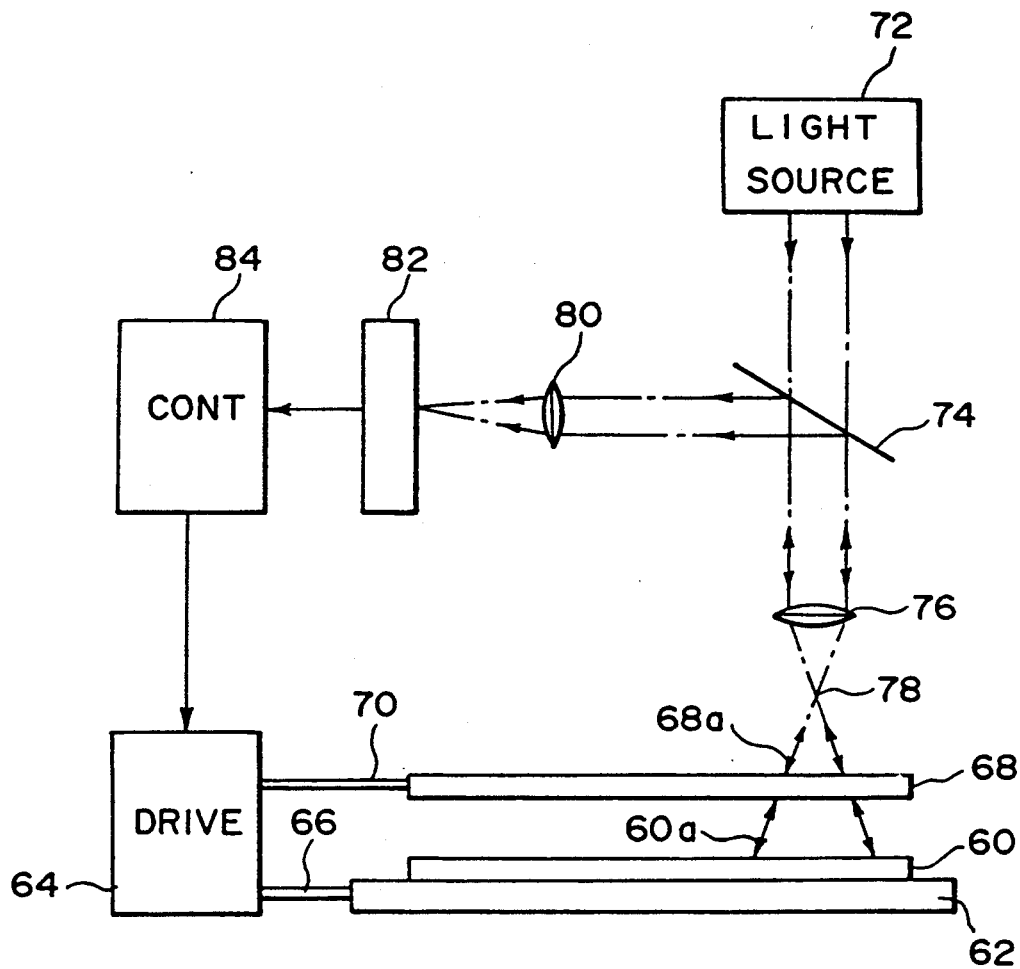
FIGS. 1 and 2 are schematic views for explicating a known type alignment system using zone plates.
Figure 2:
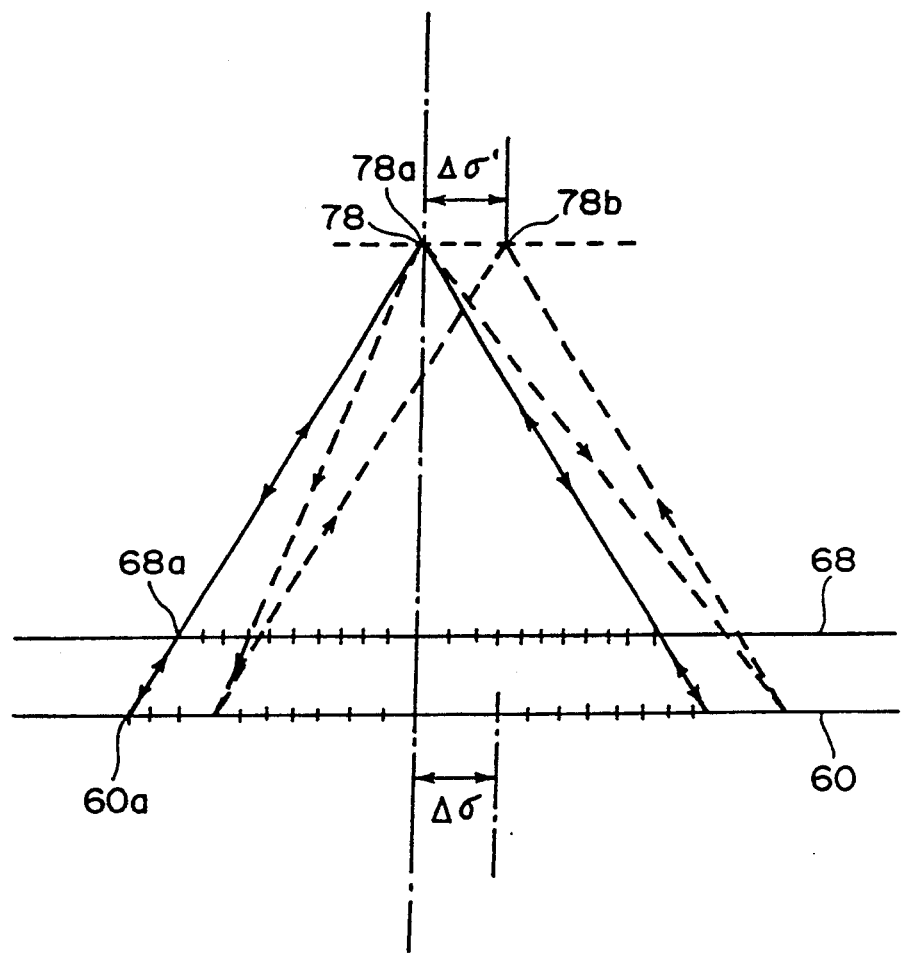

Where Fresnel zone plates are provided on two relatively movable objects and when they are placed one upon another and a collimated light such as a collimated laser beam is projected thereupon, the light is converged by these two Fresnel zone plates so that plural light spots are formed. The interval between these light spots is a function of the distance or deviation S of the centers of the two Fresnel zone plates. This is discussed in "Applied Optics", Aug. 1969, Vol. 8, No. 8, 1707–1712, by Henry H. M. Chau; and in "Journal of the Optics Society of America", Feb. 1970, Vol. 6, 255–259, by Henry H. M. Chau. Briefly, the present invention utilizes the phenomenon that the displacement of light that forms one spot corresponds to the change in the deviation of the centers of two Fresnel zone plates, and, by detecting such a light, the relative position of two objects is detected. Particularly, in the case where the two objects are a mask and a wafer which are used in a proximity type exposure apparatus wherein the mask and the wafer are placed in close proximity to each other and, by using a suitable radiation energy, a pattern formed on the mask is transferred onto the wafer, preferably two different physical optic elements such as Fresnel zone plates having different lens functions such as a concave-lens function and a convex-lens function are provided on the mask and the wafer, and the light having been influenced by the different lens functions of the two physical optic elements is detected. On the basis of this detection, the relative position of the mask and the wafer can be detected with high precision and high resolution.

The point of convergence or the origin of divergence of light converged or diverged by one of two physical optic elements provided on a mask and a wafer, respectively, is displaced only by substantially the same amount as the displacement of one physical optic element. When the thus converged or diverged light is converged or diverged by the other physical optic element and if this is done so that the distance between the other physical optic element and the point of convergence of the light emanating from the same physical optic element becomes greater than the distance between the other physical optic element and the point of convergence or the origin of divergence of the light which is going to enter the other physical optic element, then the point of convergence of the light emanating from the other physical optic element is displaced by an amount several times larger than the amount of relative displacement of the mask and the wafer. Therefore, by detecting, for example, the position of the point of convergence of the light forming the spot, it is possible to detect the amount of relative displacement of the mask and the wafer, at a certain enlarging magnification. As a result, the position detection can be made with significantly higher precision and higher resolution.

In the case where both of the two physical optic elements have a function of a convex lens, and in order to once focus the light at a location between the two physical optic elements so as to satisfy the above-described condition, it is necessary that each lens has a large power. In a proximity exposure apparatus wherein a mask and a wafer are placed with an interspacing of an order of 10 microns to 1 millimeters, the fabrication of a physical optic element having such a large power may not be so easy. Further, where both of the two physical optic elements have a function of a convex lens or a concave lens, it may be necessary to use a divergent or convergent light in order to satisfy the above-described condition in regard to the distance of the point of convergence. This is, however, is not convenient because in that case it is necessary to retain, with high precision, the position of the point of convergence or the origin of divergence of the light to be projected upon the first physical optic element. Therefore, there is a possibility of deteriorated detection accuracies, as compared with that as attainable in a case where parallel light is projected. In consideration of the above, preferably one of two physical optic element may have a function of a convex lens while the other may have a function of a concave lens. In that case, advantageously, a parallel light can be used and, in addition thereto, the fabrication of physical optic elements for use in a proximity exposure apparatus is facilitated.

For better understanding of the present invention, reference will now be made to FIG. 3. In this illustration, a light emitted from a light source 10 is collimated into a parallel light by means of a lens 11, and the parallel light illuminates a first physical optic element 3a which is provided on a first object 1 and which is formed by a zone plate, for example.

The first physical optic element 3a has a light converging function to focus the light, emanating therefrom, at a point Q which is at a distance $b_{1a}$ from the first physical optic element 3a. The light divergingly advancing from the point Q impinges on a second physical optic element 4a which is provided on a second object 2 disposed at a distance $a_{2a}$. Similarly, the second physical optic element 4a is formed by a zone plate, for example. Also, similarly to the first physical optic element 3a, the second physical optic element 4a has a light-converging function and focuses the light, emanating therefrom, upon a light detecting surface 9 of a detector (sensor) 8. Namely, in the illustrated example, the first and second physical optic elements 3a and 4a provide what can be called a "convex-convex system".

In a method of detecting relative positional deviation of first and second objects 1 and 2, according to one or more embodiments of the present invention which will be described later, a point image (real image or virtual image) as formed by a first physical optic element 3a is projected upon a sensor 8 by a second physical optic element 4a so that the absolute value of an imaging magnification be defined by "$b_{2a}/a_{2a}$" is large. By doing so, any positional deviation of the second physical optic element can be detected as a displacement of the point image upon the sensor 8, of an amount significantly larger than the amount of the positional deviation of the second physical optic element. Therefore, the resolution of the detection can be improved.

Usually, by increasing an effective diameter W of the second physical optic element 4a, the size of the point image (spot) on the sensor 8 can be reduced with a result of increased detection resolution. In semiconductor device manufacturing apparatuses, however, for a higher degree of integration of semiconductor devices, it is desired to reduce the size of a region to be occupied by an alignment mark. In consideration of this, it is not desirable to prepare so wide a region to be occupied by a mark.

On the other hand, for ensuring the diffraction effect, a physical optic element may have a minimum line width preferably not smaller than the wavelength $\lambda$ of light used for detection of the positional deviation. Also, from the viewpoint of fabrication thereof, it is preferable to use a light within the wavelength region of visible light, not less than 0.4 micron.

From the point of view of increasing the quantity of signal light, necessary for the detection, to improve the signal-to-noise ratio for assuring higher accuracies, the larger the number of bands or rings (number of zones or lines) of a physical optic element is, the better results are obtainable. Since usually each scribe line has a width not greater than 100 microns, use of a light having a wavelength not greater than 2 microns may be preferable.

In an embodiment of the present invention which will be described later, where the first and second objects are a mask and a wafer to be used in a proximity type exposure apparatus or if the spacing (proximity gap) d satisfies the relationship: "$d < 5F_1W$" (wherein $F_1$ is an effective F-number of a first physical optic element and W is the size of the aperture of a second physical optic element in the direction of alignment), use is made of a combination of first and second physical optic elements having refracting powers of "positive and negative" or "negative and positive" in the sign.

In that case, the focal lengths f1 and f2 of the first and second physical optic elements can be made longer than the spacing d, and the number of bands of each physical optic element can be made large. Additionally, the linewidth can be made relatively wide.

The structure in which a first physical optic element has a positive refracting power while a second physical optic element has a negative refracting power, has an important feature that, as compared with such a structure in which a first physical optic element has a negative refracting power while a second physical optic element has a positive refracting power, the focal lengths f1 and f2 can be increased slightly, provided that the dimension W of the second physical optic element, imaging magnification $|\beta|$ and the size $\phi$ of the point image or the distance $b_{2a}$ are the same.

On the other hand, the structure in which a first physical optic element has a negative refracting power while a second physical optic element has a positive refracting power, has an important feature that, as compared with a structure in which a first physical optic element has a positive refracting power while a second physical optic element has a negative refracting power, the region to be occupied by a mark can be reduced.

If the spacing d between the first and second objects satisfies a relationship "$d > 5F_1W$", preferably a first physical optic element may have a positive refracting power while a second physical optic element may have a positive or negative refracting power.

In that case, if, for example, the size M of the first physical optic element is fixed, the enlargement of the size W of the second physical optic element can be effectively prevented because the spacing d is large.

If, on the other hand, the size W of the second physical optic element is fixed, the reduction in the size M of the first physical, optic element (which results in a reduction in the level of the signal light) can be effectively prevented, such that sufficient diffraction efficiency is attainable.

The structure in which both of first and second physical optic elements have a positive refracting power, has an important feature that, as compared with a case where a first physical optic element has a positive refracting power while a second physical optic element has a negative refracting power, the focal length f1 of the first physical optic element can be reduced by an amount corresponding to $2|a_{2a}|$, provided that the size W of the second physical optic element and the absolute value $|\beta 2|$ of the imaging magnification are fixed. As a result, the number of zones (bands) can be increased and, therefore, the diffraction efficiency can be improved.

In a case where the light source 10 (FIG. 3) is at a finite distance, the aforementioned value F1 may be determined by the following equation:

$$F_1 = b_{1a}/m$$

where M is the diameter of light emitted from the light source 10 and entering the first physical optic element 3a, and $b_{1a}$ is the distance from the first object to the point of convergence of diffracted light caused by the first physical optic element 3a.

Figure 3:
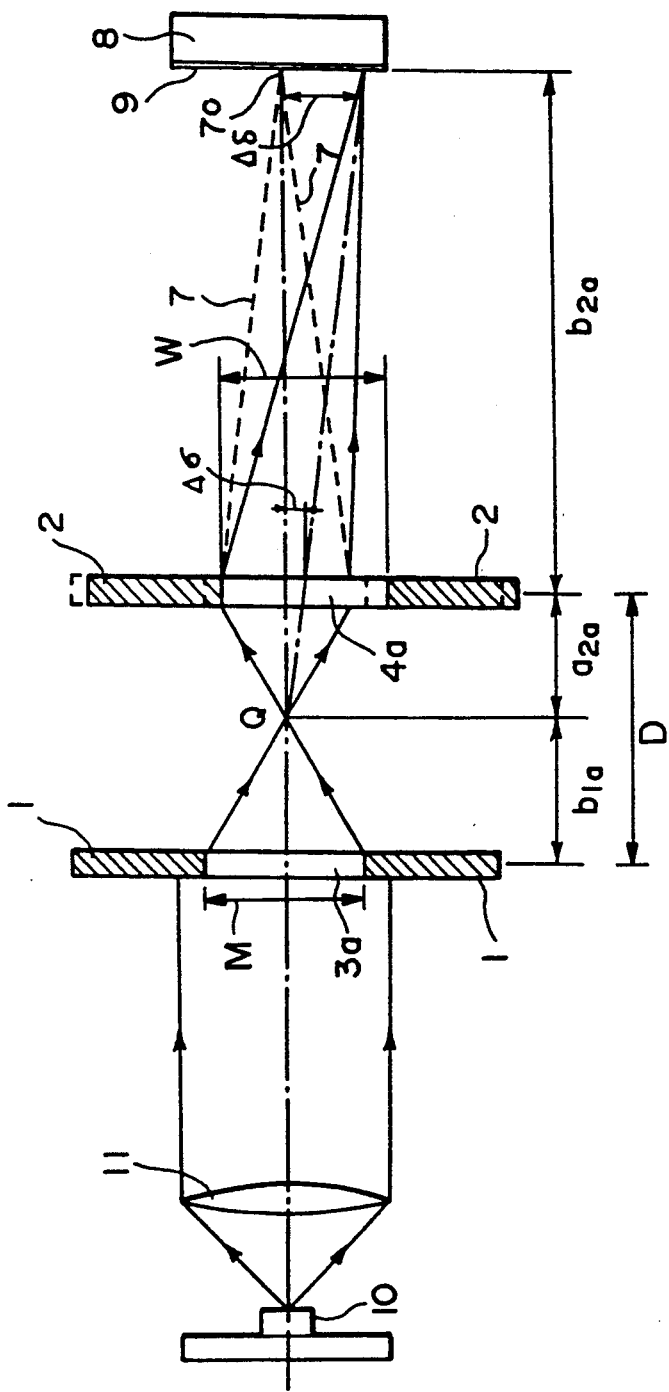
FIG. 3 is a principle view for explicating the principle of position detection used in the present invention.
Figure 4:
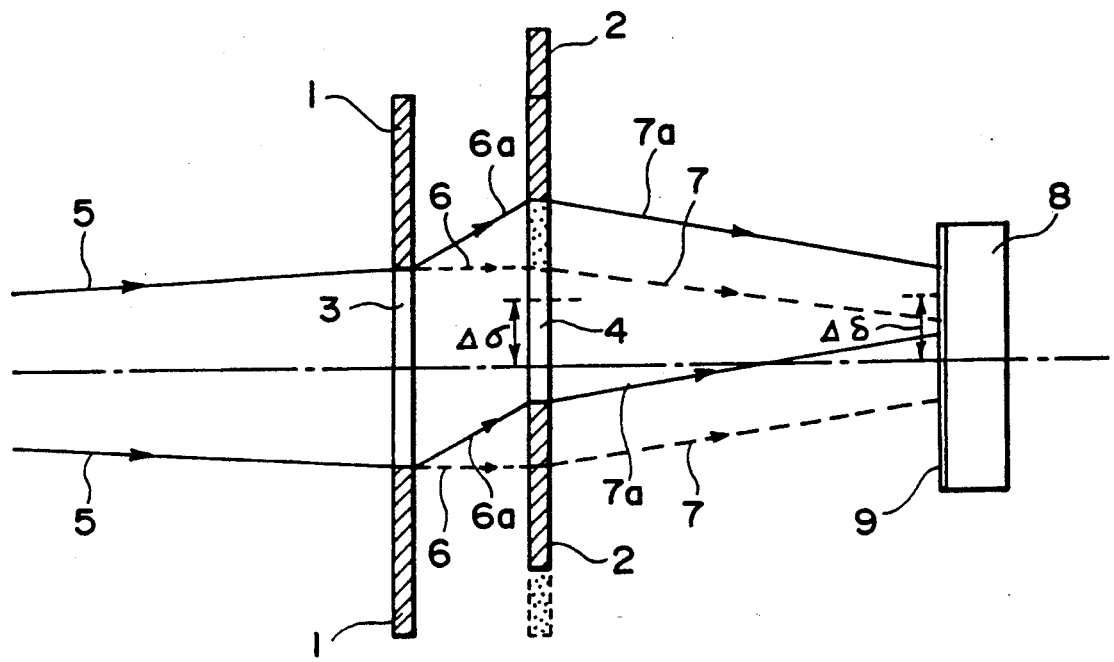
FIG. 4 illustrates the action of an optical arrangement of the FIG. 3 example.

FIG. 4 illustrates the fundamental principle of the optical arrangement shown in FIG. 3. In FIG. 4, first and second physical optic elements 3 and 4 such as zone plates, for example, are provided on first and second objects 1 and 2 with respect to which any relative positional deviation is to be evaluated. Light 5 is projected upon the first physical optic element 3 and light 6 (6a) emanating therefrom impinges on the second physical optic element 4. Light 7 (7a) emanating from the second physical optic element 4 is converged upon a light detecting surface 9 of a detector 8 which may be a position sensor, for example. The detector 8, in this example, comprises a line or linear sensor having sensor elements arrayed in a direction corresponding to the direction with respect to which any positional deviation is to be measured. However, the detector 8 may comprise a two-dimensional or area sensor.

In the FIG. 4 example, there occurs upon the detecting surface 9 a deviation $\Delta\delta$ of the center of gravity of light, corresponding to the amount $\Delta\sigma$ of relative positional deviation of the first and second objects 1 and 2.

The term "center of gravity of light" means such a point that, when in the cross-section of the light a position vector of each point in the section is multiplied by the light intensity of that point and the thus obtained products are integrated over the entire section, the integrated value has a "zero vector".

In the FIG. 4 example, the position on the detecting surface 9 of the center of gravity of light as depicted by broken lines 7 is used as a reference, and the deviation $\Delta\delta$ of the light depicted by solid lines 7a, upon the detecting surface 9 is detected to thereby determine the relative positional deviation $\Delta\sigma$ of the first and second objects 1 and 2.

The reference position described above can be predetermined. For example, where the first and second objects are a mask and a wafer to be used with a proximity type exposure apparatus and having first and second physical optic elements 3a and 4a, respectively, first the mask having the first physical optic element 3a is held fixed at a suitable position. Then, the wafer having the second physical optic element 4a is placed and roughly aligned with respect to the mask by using suitable means. Thereafter, light is projected upon the first and second physical optic elements, and the position of the center of gravity of light upon the detecting surface 9 in that state is detected. Subsequently, while retaining that state, a pattern of the mask is transferred onto the wafer with suitable radiation energy. The thus transferred pattern is observed by use of a microscope or otherwise, and any pattern overlay error is measured. On the basis of the measured error, the wafer is moved so that it is accurately aligned with the mask. Light is again projected upon the first and second physical optic elements of the thus aligned mask and wafer, and the position of the center of gravity of the light upon the detecting surface 9, as defined at that time, is determined as the reference position.

The output signal from the detector 8 is processed so that it is standardized with respect to the total light intensity on the whole light-receiving region. Accordingly, even when the output power of the light source changes slightly, the measured value as outputted from the sensor system correctly represents the position of center of gravity.

Figure 5:
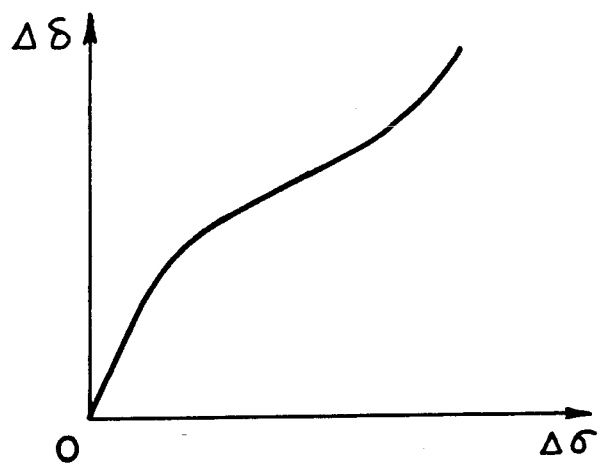
FIG. 5 is a graph showing the relationship between a relative positional deviation and a corresponding shift of the center of gravity of light, in the optical system shown in FIG. 3.

FIG. 5 illustrates the relationship between the relative position deviation $\Delta\sigma$ of the first and second objects 1 and 2 and a deviation or displacement $\Delta\delta$ of the center of gravity of light upon the detecting surface 9.

In an embodiment of the present invention which will be described later, the above-described fundamental principle is utilized to detect the relative position of a first and second objects.

Referring back to FIG. 3, where the first and second physical optical elements 3a and 4a and the detecting surface 9 are parallel to each other, a general equation regarding the displacement $\Delta\delta$ corresponding to the positional deviation $\Delta\sigma$ between the first and second objects can be written as below, provided that the position 7c of the center of gravity of the light defined on the detecting surface 9 by a focused light as depicted by broken lines 7 is just in a reference state having no positional error:

$$\Delta\delta = (b_{2a}/a_{2a})(\Delta\sigma 1 + \Delta\sigma 2) + \Delta\sigma 2 \qquad (a)$$

wherein $\Delta\sigma 1$: positional deviation of the first physical optic element 3a from a reference position; and $\Delta\sigma 2$: positional deviation of the second physical optic element 4a from a reference position.

The signs of $a_{2a}$ and $b_{2a}$ are determined in the following manner:

$a_{2a}$: The distance from the element 4a to the point light source at the light entrance side (including a case where it is imaginary defined at the left-hand side of the element 3a) is positive. It is negative when the light source is a virtual light source; and $b_{2a}$: The distance from the element 4a to the point of convergence of light at the light entrance side is positive.

Also, the focal length f is $f > 0$, where the lens is a convex lens, while it is $f < 0$ where the lens is a concave lens.

Where the first physical optic element $3a$ is taken as a reference and when the second physical optic element $4a$ is deviated by an amount $\Delta\sigma$ in a direction parallel to the first physical optic element $3a$, then the deviation $\Delta\delta$ of the center of gravity of the light spot upon the detecting surface 9 can be given by the following equation:

$$\Delta\delta = \Delta\sigma \times (b_{2a}/a_{2a} + 1) \tag{1}$$

Namely, the deviation $\Delta\delta$ of the center of gravity is magnified at an enlarging magnification $\delta$ which is equal to "$b_{2a}/a_{2a} + 1$".

When $a_{2a}$ in this equation is rewritten by using the distance $b_{1a}$ from the first physical optic element to the point Q of convergence and the spacing d between the first and second physical optic elements, it follows that:

$$\delta = [b_{2a}/(d-b_{1a}) + 1]$$

At this time, the focal lengths $f_1$ and $f_2$ of the physical optic elements satisfy the following relations: where $a_{1a}$ denotes the distance between the first physical optic element and an object point for the light impinging on the first physical optical element.

$$1/f_1 = 1/a_{1a} + 1/b_{1a}$$

$$1/f_2 = 1/(d-b_{1a}) + 1/b_{2a}$$

When a parallel light is incident, then:

$$a_{1a} = \infty$$

$$\therefore 1/a_{1a} = 0$$

$$\therefore f_1 = b_{1a}$$

Therefore, the enlarging magnification $\beta$ is:

$$\delta = [b_{2a}/(d-f_1) + 1].$$

If, as an example, $a_{2a} = 0.5$ mm and $b_{2a} = 50$ mm, the deviation $\Delta\delta$ of the center of gravity is magnified by 101 (one hundred and one) times larger, in accordance with equation (1).

Figure 6A:
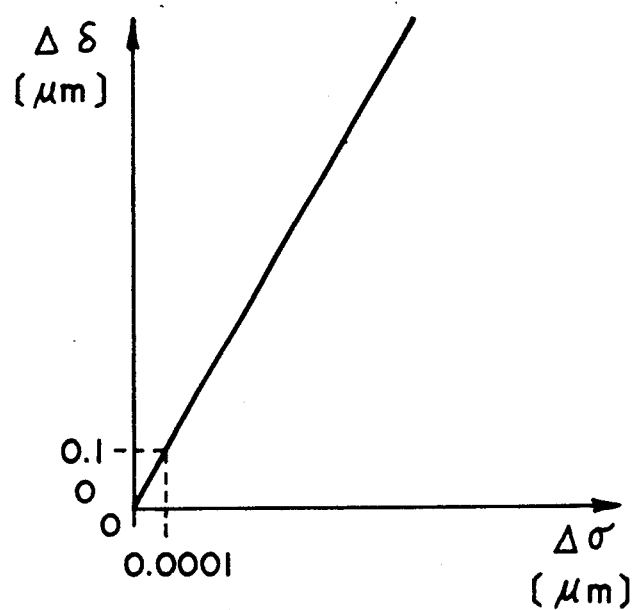
FIGS. 6A and 6B are graphs for explicating the concept of detecting relative positional deviation, on the basis of a shift of the center of gravity of light.

It will be readily understood from equation (1) that the deviation $\Delta\delta$ of the center of gravity and the positional deviation $\Delta\sigma$ at that time are in a proportional relationship such as depicted in FIG. 6A. If the detector 8 has a resolution of 0.1 micron, a position resolution of the order of 0.001 micron is obtainable with regard to the positional deviation $\Delta\sigma$.

By moving the second object on the basis of the thus determined positional deviation $\Delta\sigma$, the first and second object can be aligned with high precision.

In an embodiment of the present invention, which will be described later, a phase type physical optic element is used as one provided on a first object. By this means, the light emanating from that physical optic element can be directed with high efficiency to a physical optic element on a second object. Additionally, the position of center of gravity of the light, upon a predetermined plane, can be detected with high precision.

An alignment process to be adopted in an embodiment of the present invention, which will be described later, may be as follows.

The relationship of a deviation signal $\Delta\delta s$ representing the deviation of the center of the gravity of light on the detecting surface of the detector 8, with respect to the positional deviation $\Delta\sigma$ between two objects, is predetected and a curve showing that relationship is determined preparatorily. Then, from the value of the deviation signal $\Delta\delta s$, the positional deviation $\Delta\sigma$ between these objects is detected and, thereafter, the first or second object is displaced by an amount corresponding to the detected positional deviation $\Delta\sigma$.

In a second example, from a deviation signal $\Delta\delta s$ representing the deviation of the center of gravity and outputted from the detector 8, the direction that cancels the positional deviation $\Delta\sigma$ is detected. In this direction, the first or second object is displaced, and the above-described process is repeated until the positional deviation $\Delta\sigma$ comes into a tolerable range.

The relationship of the spacing between the first and second physical optic elements $3a$ and $4a$ with respect to the deviation $\Delta\delta$ of the center of gravity, in the case where the spacing is deviated from a predetermined spacing is as follows.

When the distance $a_{2a}$ changes due to a deviation or error $\Delta a$ of the spacing, the deviation $\Delta\delta\Delta a$ of the center of gravity is given by:

$$\Delta\delta\Delta a = \Delta\sigma \times [b_{2a}/(a_{2a} + \Delta a) + 1]$$

Figure 6B:
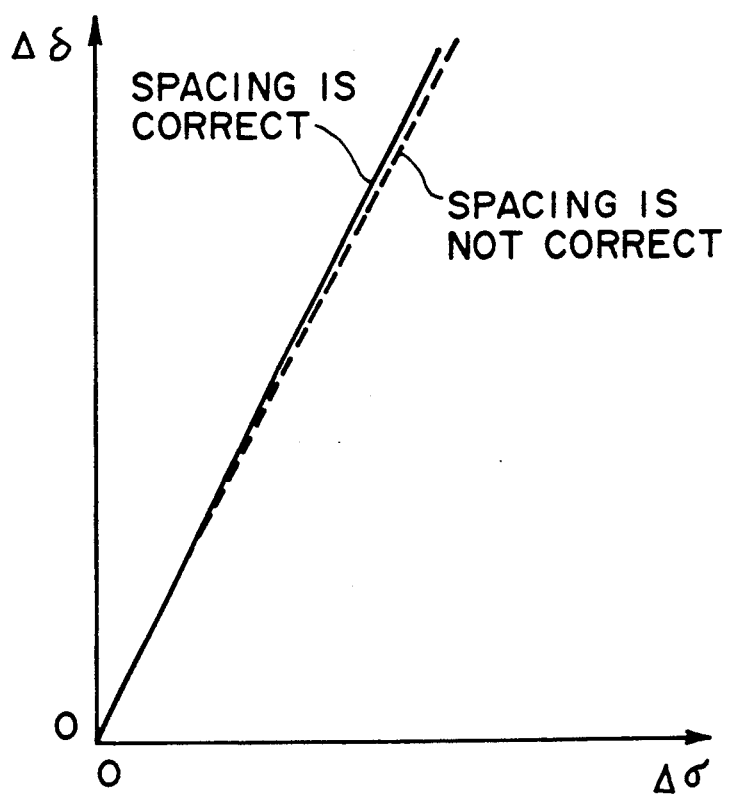

This is illustrated in FIG. 6B, wherein, to the positional deviation $\Delta\sigma$, the deviation $\Delta\delta$ of the center of gravity is depicted by a slightly shifted straight line that passes through the origin.

This means that, by using the above-described second example of the alignment process, in principle the error in the spacing does not substantially influence the alignment accuracies.

Further, this implies that, with the first example in the alignment process described above, the error in the spacing has a small effect upon the alignment accuracies, provided that the positional deviation $\Delta\sigma$ is small.

By way of example, it is now assumed that $a_{2a} = 0.5$ mm, $b_{2a} = 50$ mm, $f = 0.495$ mm and the error $\Delta a$ in the spacing is equal to 5 microns.

Where the spacing does not change, the deviation $\Delta\delta_0$ of the center of gravity of light upon the detecting surface 9 resulting from the positional deviation $\Delta\sigma$, is given by:

$$\Delta\delta_0 = \Delta\sigma \times (50/0.5 + 1) = 101 \cdot \Delta\sigma$$

If, to the contrary, the spacing changes, the deviation $\Delta\delta\Delta a$ of the center of gravity of light is given by:
$$\Delta\delta\Delta a = \Delta\sigma[50/(0.5+0.005)+1] \div 100 \cdot \Delta\sigma.$$

Assuming now that there is a positional deviation $\Delta\sigma = 0.01$ micron, the deviation of the center of gravity of light upon the detecting surface 9, in the case where the spacing has changed and in the case where the spacing has not changed, is written as follows:

$$\Delta\delta_0 = 101 \times 0.01 = 1.01 \text{ (micron)}$$

$$\Delta\delta\Delta a = 100 \times 0.01 = 1 \text{ (micron)}$$

Namely, the deviation of the center of gravity of light on the detecting surface 9 due to the error in the spacing is given by:

$$\{\Delta\delta_0 - \Delta\delta\Delta a| = 0.01 \text{ (micron)}.$$

Converting this into the amount of deviation of the physical optic element, it results therefrom that an alignment error is 0.0001 (micron) because the enlarging magnification is ×100. Similarly, if the positional deviation $\Delta\sigma=1$ micron, the alignment error is 0.01 (micron).

In the case where a physical optic element having the function described above is to be provided by an amplitude type zone plate, for example, the configuration of its pattern may be such as described below.

In FIG. 7A, parallel light is projected upon a zone plate 51 having a focal length f and zones (bands) of a number mI and, in this case, the wavelength of light inputted to a zone plate is denoted by $\lambda$ while the aperture diameter is denoted by D while the angle of emission of each light ray with respect to the optical axis, as shown in FIG. 7A is denoted by $\sigma$. Then, it follows that:

$$f/\cos\theta - f = mI \cdot \lambda \quad (2)$$
$$(D/2)/f = \tan\theta$$

Therefore, the relationship between the mI-th zone with respect to the radius D/2 from the center of the aperture is given by:

$$mI = f/\lambda(\sqrt{(D/2f)^2 + 1} - 1) \quad (2a)$$

For a zone plate which is provided on a second object 2 (FIG. 1), such as a zone plate 51 shown in FIG. 7B by which a light from a point light source 52 where a is the distance between the object point and the zone plate 51, b is the distance between the zone plate 51 and the image point, $\theta a$ is the angle that each light ray emanating from the object point and impinging on the zone plate 51 makes with respect to the optical axis, and $\theta b$ is the angle that each light ray emanating from the zone late 51 and impinging on the image point makes with the optical axis is focused, the following relations are established:

$$a(1/\cos\theta a - 1) + b(1/\cos\theta b - 1) = mII \cdot \lambda \quad (3)$$
$$D/2a = \tan\theta a$$
$$D/2b = \tan\theta b$$

It follows therefrom that the relationship of the "mII-th" zone with respect to the radius D/2 from the center of the aperture is represented as follows:

$$mII = a/\lambda(\sqrt{(D/2a)^2 + 1} - 1) + b/\lambda(\sqrt{(D/2b)^2 + 1} - 1) \quad (3a)$$

If, as an example, a light source 10 is a semiconductor laser which supplies light of a wavelength $\lambda=0.83$ micron, $f=1000$ microns, $a=500$ microns and $b=50000$ microns, then, the number mI of zones of a zone plate 3a to be provided on the first object 1 is equal to 4.9, whereas the number mII of zones of a zone plate 4a to be provided on the second object 2 is equal to 10.4.

Namely, these zone plates may have patterns such as shown in FIGS. 8A.1 and 8B.1, of which FIG. 8A.1 shows a zone plates the physical optic element 3 while FIG. 8B.1 shows a zone plate as the physical optic element 4.

In an embodiment of the present invention which will be described later, in place of amplitude type zone plates shown in FIGS. 8A.1 and 8B.1, the first and second objects are provided with phase type zone plates having similar optical functions and, by using such zone plates, the position of the center of gravity of light on a predetermined plane can be detected with high precision.

In case of a phase type zone plate, bands (zones) may be set in a similar manner as in the case of the amplitude type zone plate, so as to produce a phase difference corresponding to the quantity of light being transmitted. For example, the thickness of a portion between adjacent bands (painted regions in FIG. 8A.1 or 8B.1 example) of an amplitude type zone plate may be modified so that a light beam passing through this portion has a phase difference, shifted by an amount $\pi$ as compared with that of light passing through the band. Examples are shown in FIGS. 8A.2 and 8B.2.

A phase type grating may be formed in a variety of ways. Examples are as follows.

As a first Example, by using silver salt, an amplitude type grating may be subjected to a bleaching treatment to form surface steps (recesses and protrusions). A method using photoresist is well known. There is a method in which a transparent resist is used to form stripe patterns, having an optical path difference of $\lambda/2$ between an area on which resist is present and an area on which no resist is present. Another method is an etching treatment using resist to provide surface steps on a substrate. Further, since which is required is to formation of a pattern having an optical path difference, such a pattern may be formed by ion doping to change the refractive index of a doped region.

Basically, a phase type grating has a phase difference 7L between adjacent regions. Where the grating is of transmission type, chief rays P1 and P2 for adjacent regions have a phase difference $\Delta\phi$, which can be expressed by an equation set forth below, and the refractive indices n and $n_0$ and thicknesses $d_1$ of the adjacent regions and $d_2$ of the adjacent regions are set to satisfy the relation "$\Delta\phi=\pi$"

Phase Difference: $\Delta\phi=(n-n_0)(d_1-d_2)/\lambda \times 2\pi(rad)$

Figure 8C:
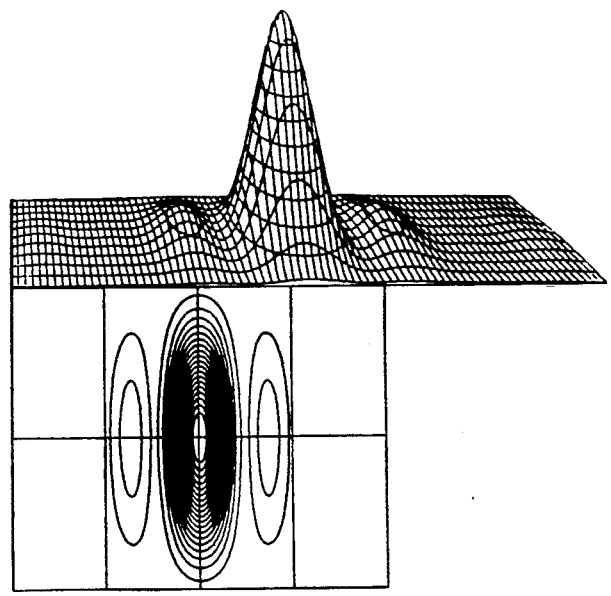
FIGS. 8C and 8D each illustrates a light intensity distribution on a detecting surface.
Figure 8D:
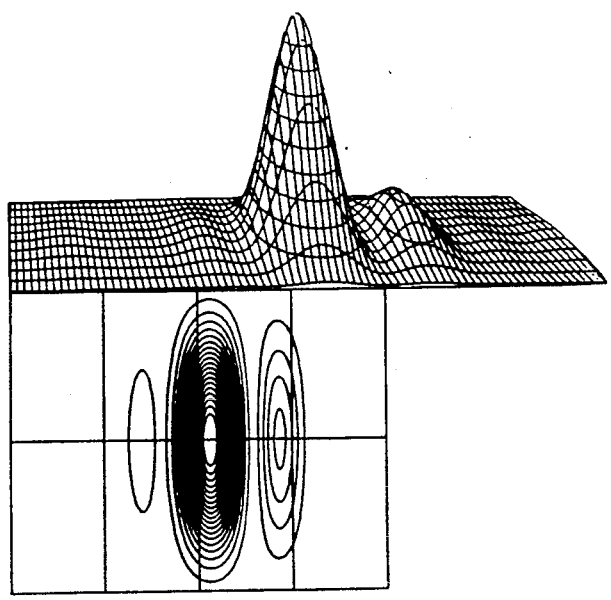
Figure 8E:
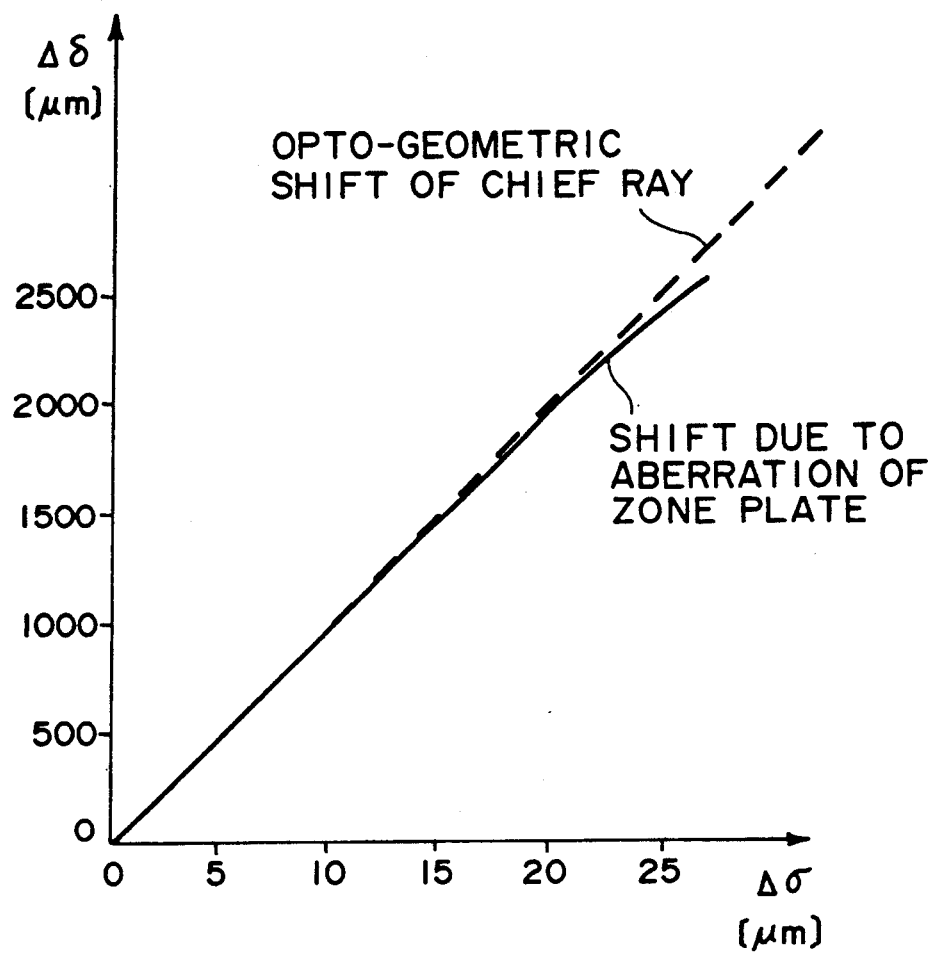
FIG. 8E is a graph which exemplifies the relationship between the relative positional deviation and the shift of the center of gravity of light.
Figure 8F:
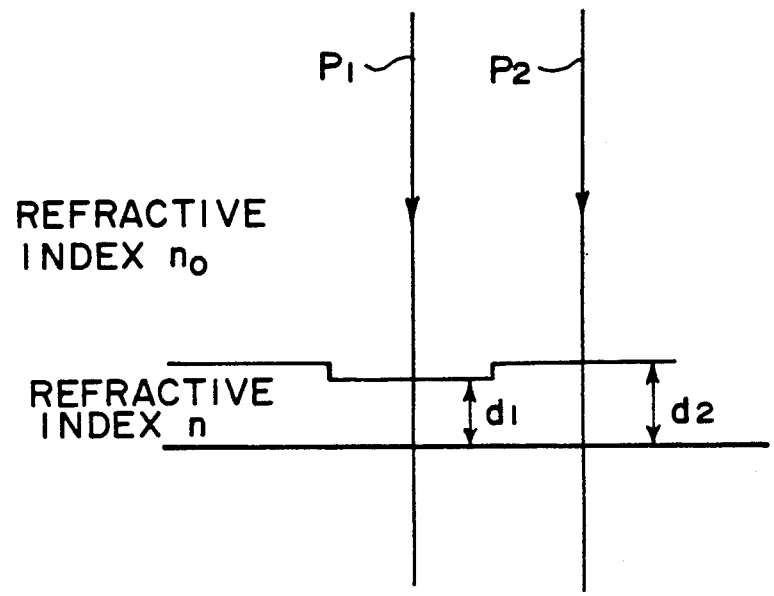
FIGS. 8F and 8G are principle views explicating a transmission type phase grating and a reflection type phase grating.
Figure 8G:
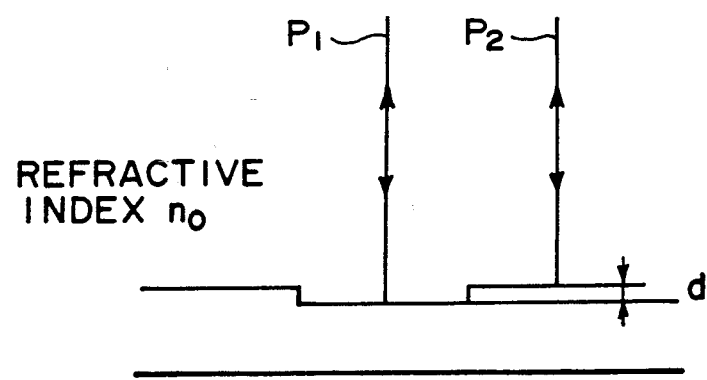

In a case of reflection type grating, on the other hand, chief rays P1 and P2 for adjacent regions, as shown in FIG. 8G, have a phase difference $\phi$ which can be expressed by an equation set forth below, and the refractive index $n_0$ and the thickness d are set to satisfy "$\Delta\phi=\pi$".

Phase Difference: $\Delta\phi=2n_0d/\lambda \times 2\pi(rad)$

With a phase type grating, as compared with an amplitude type grating, usually a signal light of an intensity about two times larger than that by the latter is obtainable. For better understanding, reference may be made to FIGS. 8H and 8I.

Figure 8H:
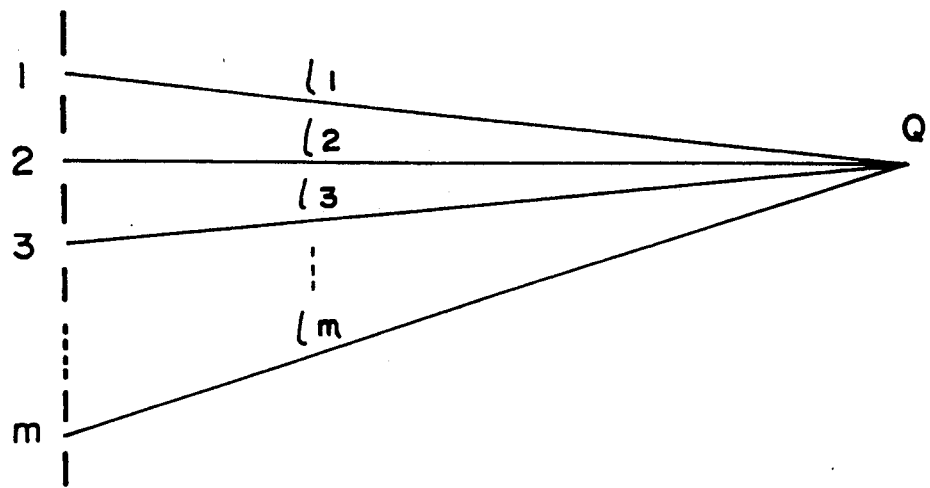
FIGS. 8H and 8I are principle views for explicating an amplitude type grating and a phase type grating, respectively.

When only chief rays from respective apertures are considered, in considering the phase, if the grating is of the amplitude type, the rays from the apertures of respective bands are diffracted in the manner as shown in FIG. 8H and are focused at a point Q. At this time, each ray rom a band has an optical path difference which is equal to $\lambda$, and there are phase differences of the same amount of $2\pi$. As a result, they are of th same phase. In FIG. 8H, for th ray from band 1:

$$u_1 = A_1 e^{j2\pi \cdot \frac{l_1}{\lambda}}$$

For the ray from band 2:

$$u_2 = A_2 e^{j2\pi \cdot \frac{l_2}{\lambda}}$$
$$= A_2 e^{j2\pi \cdot \frac{(l_1+\lambda)}{\lambda}}$$

For the ray from band m:

$$u_m = A_m e^{j2\pi \cdot \frac{(l_1+m\lambda)}{\lambda}}$$

Thus, at point Q, all the rays form the bands are of the same phase and are summed, that is:

$$u = \sum_{i=1}^{n} u_m = \left( \sum_{i=1}^{n} A_m \right) e^{j2\pi \cdot \frac{l_1}{\lambda}}$$

Namely, light from an aperture which is approximately one half of the whole irradiation region of the surface of the element is utilized as a signal light.

Figure 8I:
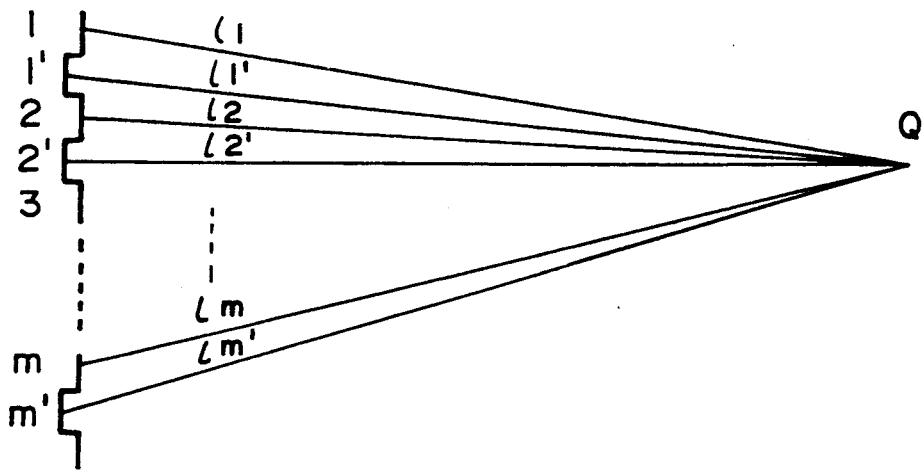

As compared therewith, in a phase type grating, as shown in FIG. 8I, all the lights from the whole element are utilized as a signal light. Diffraction lights from adjacent regions have an optical path difference of λ/2, and thus there are phase differences of the same amount of π. As a result, they are finally of the same phase and are summed. In FIG. 8I, for the ray from band 1:

$$u_1 = A_1 e^{j2\pi \cdot \frac{l_1}{\lambda}}$$

For the ray from band 1':

$$u_1' = A_1' e^{j2\pi \cdot \frac{(l_1'+\lambda/2)}{\lambda}}$$
$$= A_1' e^{j2\pi \cdot \frac{(l_1+\lambda/2+\lambda/2)}{\lambda}}$$

For the ray from band 2

$$u_2 = A_2 e^{j2\pi \cdot \frac{l_2}{\lambda}}$$
$$= A_2 e^{j2\pi \cdot \frac{(l_1+\lambda)}{\lambda}}$$

For the ray from band m:

$$u_m = A_m e^{j2\pi \cdot \frac{(l_1+m\lambda)}{\lambda}}$$

For the ray from band m':

$$u_m' = A_m' e^{j2\pi \cdot \frac{(l_1+\lambda/2+\lambda/2+m\lambda)}{\lambda}}$$

Thus, at point Q, all the rays from the bands are of the same phase and are summed, that is:

$$u = \sum_{i=1}^{n} (u_m + u_m')$$
$$= \left( \sum_{i=1}^{n} A_m + \sum_{i=1}^{n} A_m' \right)$$

Namely, all the lights from the whole irradiated region on the surface of the element are utilized to provide a signal. Therefore, as compared with an amplitude type grating, phase type grating can provide a signal light of increased intensity. There does not occur any noise due to the provision of a transmissible portion having a phase difference, in place of a light blocking portion of an amplitude type grating. Therefore, the signal-to-noise ratio can be improved.

FIGS. 8C and 8D each schematically illustrate a light intensity distribution defined on the detecting surface 9 in the case where the aperture of the Fresnel zone plate has a size of 180×50 microns and the direction of positional deviation lies in the widthwise direction (in the direction of 180-micron side) of the aperture, and a positional deviation of an amount 25 microns is provided. In each of these figures the upper half is a birdseye view and the lower half is a contour map. FIG. 8C represents the case where there is no positional deviation, whereas FIG. 8D represents the case where a positional deviation of an amount 25 microns is presented.

As will be seen from FIG. 8C, where no positional deviation is present, the light intensity distribution is like a Fraunhofer diffraction image caused by a substantially rectangular aperture. If there occurs a positional deviation, the distribution is deformed into a slightly asymmetrical pattern, as shown in FIG. 8D, in accordance with the amount of deviation.

While in the foregoing examples the amount of shift or deviation of a chief ray, caused opto-geometrically, is magnified one hundred times larger than an actual positional deviation. Actually, however, because of the aberration of a Fresnel zone plate, the amount of deviation of the center of gravity of light, upon the detecting surface 9 is of a magnitude about ninety-six (96) times larger.

If the positional deviation is large, the positional deviation Δσ and the deviation Δδ of the center of gravity of light on the detecting surface 9 do not show linearity, and the rectilinear relationship therebetween is damaged slightly.

In consideration of this, the relationship between the positional deviation Δσ and the deviation Δδ of the center of gravity of light (an example of which relationship is illustrated in FIG. 8E) may be stored preparatorily into a suitable storing means, and the thus stored relationship may be referred to as required. By doing so, it is possible to detect the positional deviation Δσ at high accuracies and in a wide dynamic range.

Figure 9:
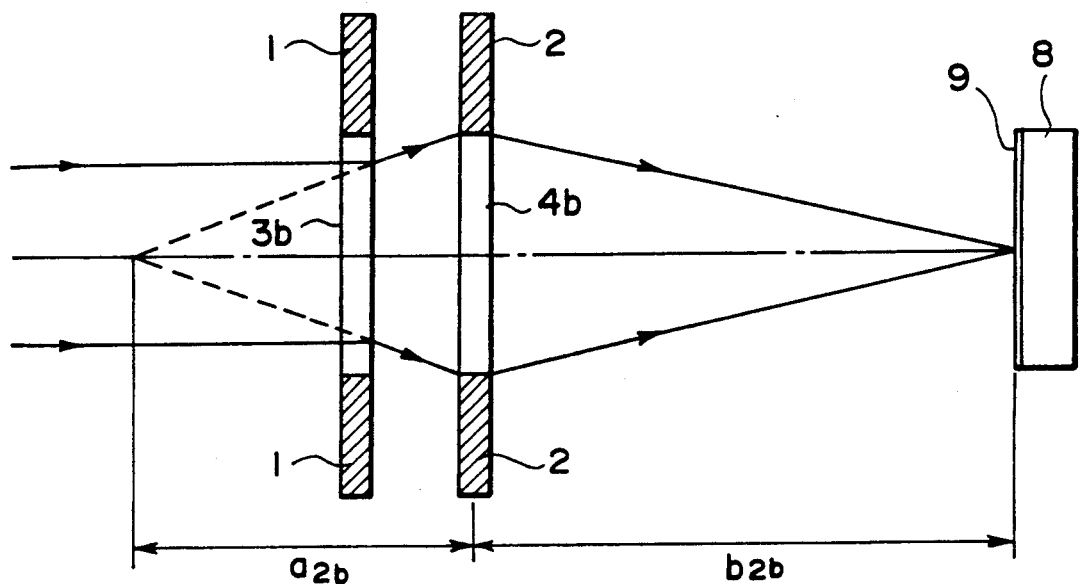
FIG. 9 is a schematic view showing a major portion of a position detecting device according to an embodiment of the present invention.

Referring now to FIG. 9, a description will be provided of an embodiment of the present invention. This embodiment corresponds to a case where the above-described spacing d satisfies the relationship: "d ≧ 5F$_1$·W", and a first optic element 3b has a light diverging function whereas a second physical optic element 4b has a light converging function. Namely, they provide what can be called a "concave-convex system".

In this embodiment, where the positional deviations of the first and second objects 1 and 2 from respective reference positions are denoted by $\Delta\sigma b_1$ and $\Delta\sigma b_2$, the relative positional deviation $\Delta\sigma b$ can be expressed by:

$$\Delta\sigma b = \Delta\sigma b_1 + \Delta\sigma b_2$$

The deviation $\Delta\delta b$ of the center of gravity of light upon a detecting surface 9, resulting from the positional deviation $\Delta\sigma b$, can be given by:

$$\Delta\delta b'(b_{2b}/a_{2b})\Delta\sigma b + \Delta\sigma b_2$$

Where the first physical optic element 3b is taken as a reference and when the second physical optic element 4b is deviated by an amount $\Delta\sigma$ in a direction parallel to the first physical optic element 3b, then the deviation $\Delta\delta$ of the center of gravity of the light spot upon the detecting surface 9 can be given by the following equation:

$$\Delta\delta = \Delta\sigma \times (b_{2b}/a_{2b} + 1)$$

Namely, the deviation $\Delta\delta$ of the center of gravity is magnified at an enlarging magnification which is equal to "$b_{2b}/a_{2b}+1$".

When $a_{2b}$ in this equation is rewritten by using the distance $b_{1b}$ from the first physical optic element to the point Q of convergence and the spacing d between the first and second physical optic elements, it follows that:

$$\delta = [b_{2b}/(d - b_{1b}) + 1]$$

At this time, the focal lengths $f_1$ and $f_2$ of the physical optic elements satisfy the following relations:

$$1/f_1 = 1/a_{1b} + 1/b_{1b}$$

$$1/f_2 = 1/(d - b_{1b}) + 1/b_{2b}$$

When a parallel light is incident, then:

$$a_{1b} = \infty$$

$$\therefore f_1 = b_{1b}$$

Therefore, the enlarging magnification $\delta$ is:

$$\delta = [b_{2b}/(d - f_1) + 1].$$

Figure 10:
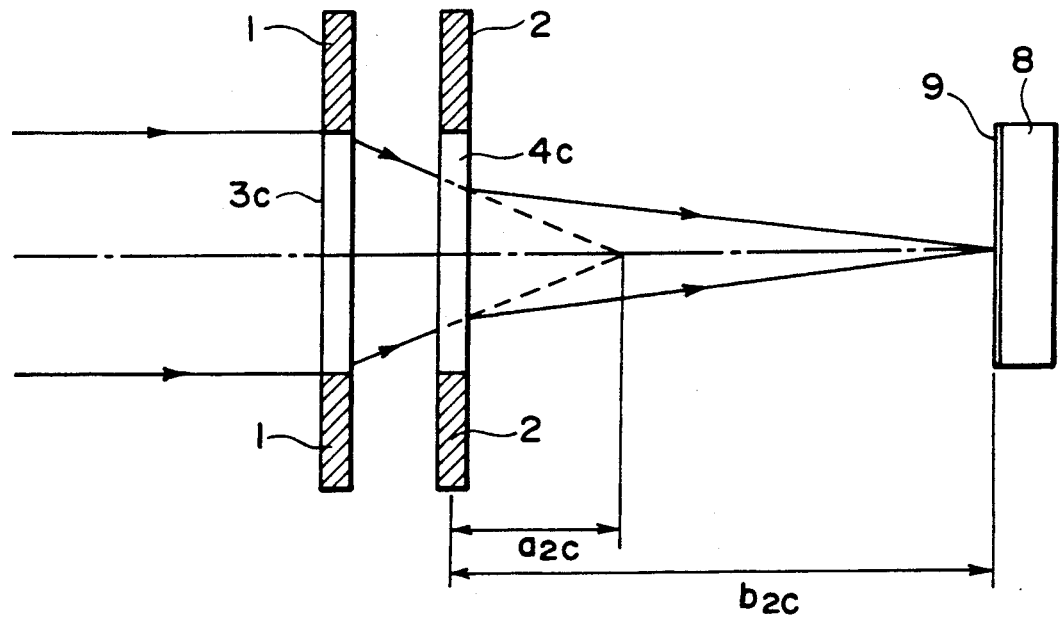
FIG. 10 is similar to FIG. 9 but shows another embodiment of the present invention.

FIG. 10 shows another embodiment of the present invention. This embodiment corresponds to a case where the above-described spacing d satisfies the relationship: "$d \leq 5F_1 \cdot W$", and a first physical optic element 3c has a light converging function while a second physical optic element 4c has a light diverging function. Thus, they provide what can be called a "convex-concave system".

In this embodiment, where the positional deviations of a first and second objects 1 and 2 from respective reference positions are denoted by $\Delta\sigma c_1$ and $\Delta\sigma c_2$, the relative positional deviation $\Delta\sigma c_1$ can be expressed by:

$$\Delta\sigma c = \Delta\sigma c_1 - \Delta\sigma c_2$$

The deviation $\Delta\delta c$ of the center of gravity of light upon a detecting surface 9, resulting from the positional deviation $\Delta\sigma c$ can be given by:

$$\Delta\delta c = (b_{2b}/a_{2c})\Delta\sigma c - \Delta\sigma c_2$$

Where the first physical optic element 3c is taken as a reference and when the second physical optic element 4c is deviated by an amount $-\Delta\sigma c$ in a direction parallel to the first physical optic element 3c, then the deviation $\Delta\delta$ of the center of gravity of the light spot upon the detecting surface 9 can be given by the following equation:

$$\Delta\delta = (-\Delta\sigma c) \times (b_{2c}/a_{2c} + 1)$$

Namely, the deviation $\Delta\delta$ of the center of gravity is magnified at an enlarging magnification $\beta$ which is equal to "$b_{2c}/a_{2c}+1$".

When $a_{2c}$ in this equation is rewritten by using the distance $b_{1c}$ from the first physical optic element to the point Q of convergence and the spacing d between the first and second physical optic elements, it follows that:

$$\beta = [b_{2c}/(d - b_{1c}) + 1]$$

At this time, the focal lengths $f_1$ and $f_2$ of the physical optic elements satisfy the following relations:

$$1/f_1 = 1/a_{1c} + 1/b_{1c}$$

$$1/f_2 = 1/(d - b_{1c}) + 1/b_{2c}$$

When a parallel light is incident, then:

$$a_{1c} = \infty$$

$$\therefore f_1 = b_{1c}$$

Therefore, the enlarging magnification $\beta$ is:

$$\beta = [b_{2c}/(d - f_1) + 1].$$

The optical arrangement may be appropriately selected, in accordance with the spacing between the first and second objects 1 and 2 and the magnitude of the apertures of the first and second physical optic element. For example, where the spacing is sufficiently large as compared with the apertures of the first and second physical optic elements, the "convex-convex system" such as shown in FIG. 3 or a "convex-concave system" such as shown in FIG. 10 is preferable. On the other hand, where the spacing is not sufficiently large as compared with the apertures (typically in a case of a mask and a wafer to be used in a proximity type exposure apparatus), a "concave-convex system" such as shown in FIG. 9 or a "convex-concave system" such as shown in FIG. 10 is preferable.

Further, in the case where the aperture of a second physical optic element can be made larger than that of a first physical optic element, as in the FIG. 9 example, a "concave-convex system" such as shown in the same figure is preferable. On the other hand, where the aperture of a first physical optic element can be made larger than that of a second physical optic element, as in the FIG. 10 example, a "convex-concave system" such as shown in the same figure is preferable.

While the foregoing embodiments use transmission type physical optic elements, the objects and advantageous features of the present invention can be accomplished as a matter of course by using reflection type physical optic elements.

Referring now to FIG. 11A, a description will be provided of an embodiment of the present invention. In this embodiment, the invention is applied to an alignment system incorporated into a semiconductor device manufacturing exposure apparatus of proximity exposure type, for aligning a mask M and a wafer W.

In FIG. 11A, same reference numerals as used in FIG. 3 are assigned to similar or corresponding elements. In FIG. 11A, reference character M denotes a mask and reference character W denotes a wafer, which correspond respectively to a first and second objects to be relatively aligned. Reference character 3M denotes a mask alignment pattern which is formed on the mask M and which corresponds to a first physical optic element. Reference character 4W denotes a wafer alignment pattern provided on the wafer W and it corresponds to a second physical optic element of reflection type.

The embodiment shown in FIG. 11A provides what can be called a "concave-convex system" which corresponds to an optical arrangement having a concave lens and a concave-surface mirror. The mask M is attached to a membrane 17 which is supported through a mask chuck 16 by a main frame member 15 of the exposure apparatus. Disposed above the frame member 15 is a mask-to-wafer alignment head 14. For alignment of the M and the wafer W, a mask alignment pattern 3M and a wafer alignment pattern 4W are provided on the mask M and the wafer W, by lithographic technique, for example.

The wafer W is supported by a wafer chuck 20. Detector 8 is provided, which produces an output signal that is applied to a signal detecting circuit 24. In this signal detecting circuit 24, the position of the center of gravity of light is detected, and a signal corresponding to any positional deviation is supplied to a control device 23. In response to the supplied signal, the control device 23 produces and applies an instruction signal to a wafer stage controller 22 to cause the same to controllably move, in an appropriate direction or directions, a wafer stage 21 together with the wafer chuck 20 fixedly mounted thereto. The position of the wafer stage 21 is measured and monitored constantly by use of a laser interferometer measuring system, not shown.

Light emanating from a light source 10 is collimated into a parallel light by a lens system 11, and after passing through a half mirror 12 the parallel light impinges upon the mask alignment pattern 3M. The mask alignment pattern 3M is provided, in this embodiment, by a zone plate of transmission type and is adapted to transform a received light into a diverging light like a beam as divergingly emitted from a point Q. Thus, the mask alignment pattern 3M has a function of a concave lens, for divergingly projecting light upon the wafer alignment pattern 4W. The wafer alignment pattern 4W is provided, in this embodiment, by a zone plate of the reflection type and has a function of a concave mirror for imaging, upon the detecting surface 9, the light as emanating from the point Q.

Where, in such arrangement, the wafer W is positionally deviated by an amount $\Delta\sigma w$ with respect to the mask M, the displacement or positional deviation $\Delta\delta w$ of the center of gravity of light upon the detecting surface 9 can be written as follows:

$$\Delta\delta w = \Delta\sigma w \times (bw/aw + 1)$$

Rewriting aw in this equation by using the distance $b_{1b}$ from the first physical optic element to the point of convergence and the spacing d between the first and second physical optic elements, then, $$\delta = [bw/(d - {}_{1b}) + 1]$$

At this time, the focal lengths $f_1$ and $f_2$ of these physical optic elements satisfy the following relations:

$$1/f_1 = 1/a_{1b} + 1/b_{1b}$$

$$1/f_2 = 1/(d - b_{1b}) + 1/bw$$

Where a parallel light is used for illumination, $$a_{1b} = \infty$$

$$\therefore f_1 = b_{1b}$$

Thus, the enlarging magnification $\beta$ is $$\beta = [bw/(d - f_1) + 1]$$

Details of the alignment procedure in this embodiment will now be explained.

(1−1) First, a reference point for accomplishment of alignment is set. As for such a reference point, a particular position on the detecting surface 9 can be determined preparatorily, for example, in the manner described hereinbefore. The following some steps are for the mask alignment.

(1)-(a) A reference mark 25 which may be formed by a grating lens similar to the wafer pattern, is formed on the wafer chuck 20 which is mounted to the wafer stage 21.

(1)-(b) Control device 23 applies a moving signal to the wafer stage controller 22 to move the wafer stage 21 so as to bring the reference mark 25 to an alignment evaluation station. The reference mark 25 is thus moved to and stopped at such a position at which, when the alignment pattern 3M of the mask is correctly positioned at a set position, the position of the center of gravity of light projected upon these marks is exactly coincident with the reference point.

(1)-(c) Then, the light from the light source 10 is projected upon the mask alignment pattern 3M and the reference pattern 25, the light passing through these patterns being concentrated upon the detecting surface 9.

(1)-(d) The position detecting circuit 24 detects the position of the center of gravity of the thus focused light, and supplies a position signal to the control device 23. Based on the thus supplied position signal, the control device 23 actuates a driving mechanism (not shown) to move and correctly position the mask.

(1-2) Subsequently, by moving the wafer stage 21, the position of the wafer W is set so that the wafer alignment pattern 4W is placed at the alignment evaluation station.

(1-3) Then, light is projected from the light source 10 upon the mask alignment pattern 3M and then upon the wafer alignment pattern 4W, the light passing these patterns being directed to the detecting surface 9. The signal detecting circuit 24 detects the position of the center of gravity of incident light, and supplies a wafer position signal to the control device 23.

(1-4) The control device evaluates the positional error or deviation of the wafer, on the basis of the reference point position and the wafer position signal, and supplies an alignment signal to the wafer stage controller 22.

(1-5) The wafer stage controller 22 operates to move the wafer stage 21 to correct the relative positional deviation between the mask and the wafer.

(1-6) Again, any positional deviation between the mask and the wafer is examined or checked.

(1-7) If necessary, the above-described steps (1-2) to (1-6) are repeated.

Figure 11B:
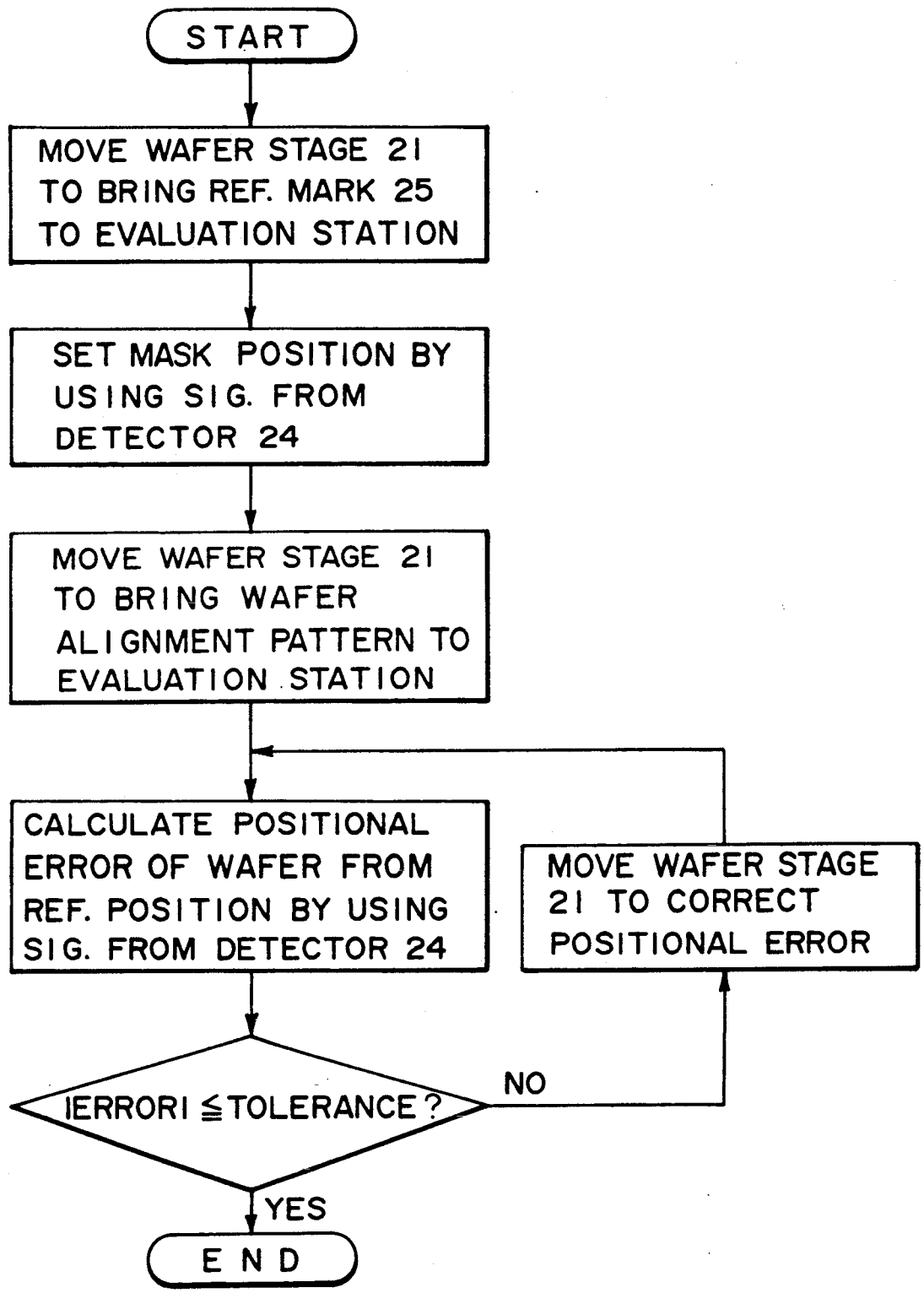
FIG. 11B is a flow chart showing the sequence of the alignment operation to be made in the apparatus of FIG. 11A.

The manner of control of the control device 23 according to the above-described alignment procedure is shown in FIG. 11B.

Figure 12:
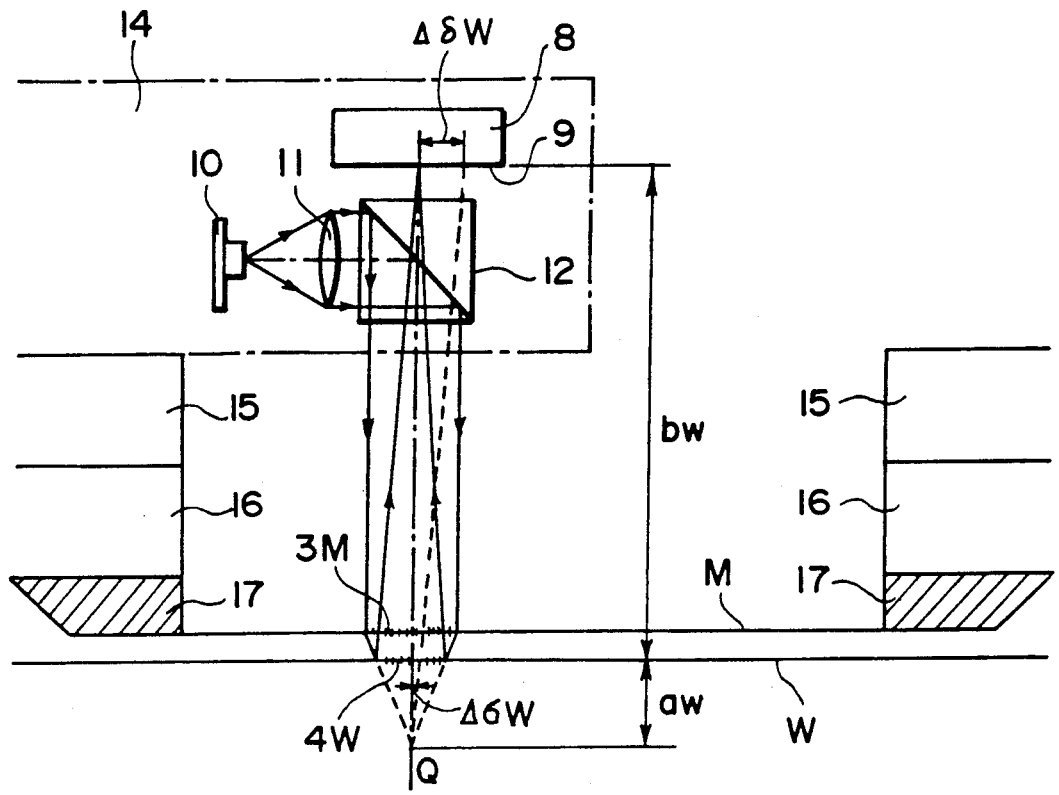
FIGS. 12–16 are schematic views each showing a major portion of an exposure apparatus according to an embodiment of the present invention.

FIG. 12 shows another embodiment of the present invention which is similar to the FIG. 11A embodiment but which uses what can be called a "convex-concave arrangement" corresponding to one as having a convex lens and a convex-surface mirror.

Mask M is attached to a membrane 17 which is supported through a mask chuck 16 by a main frame member 15 of the exposure apparatus. Disposed above the frame portion 15 is a mask-to-wafer alignment head 14. For alignment of the mask M and a wafer W, a mask alignment pattern 3M and a wafer alignment pattern 4M are provided on the mask M and the wafer W, respectively, by using lithographic technique, for example.

Light emanating from a light source 10 is collimated into a parallel light by a lens system 11, and after passing through a half mirror 12 the parallel light impinges upon the mask alignment pattern 3M. The mask alignment pattern 3M is provided, in this embodiment, by a zone plate of the transmission type and has the function of a concave lens for converging received light toward a point Q. The wafer alignment pattern 4W is provided, in this embodiment, by a zone plate of reflection type and has function of a convex mirror for imaging, upon the detecting surface 9, the light as coming thereto to be converged at the point Q.

Where, in such arrangement, the wafer W is positionally deviated by an amount $\Delta\sigma w$ with respect to the mask M, the displacement or positional deviation $\Delta\delta w$ of the center of gravity of light upon the detecting surface 9 can be written as follows:

$$\Delta\delta w = \Delta\sigma w \times (bw/aw - 1)$$
$$= (-\Delta\sigma w)[bw/(-aw) + 1]$$

Namely, the deviation $\Delta\delta w$ of the point of convergence is magnified by an enlarging magnification $\beta$ which can be given by:

$$\beta = [bw/(-aw) + 1]$$

Rewriting aw in this equation by using the distance $b_{1c}$ from the first physical optic element to the point of convergence and the spacing d between the first and second physical optic elements, then, $$\beta = [bw/(d - b_{1c}) + 1]$$

At this time, the focal lengths $f_1$, and $f_2$ of these physical optic elements satisfy the following relations:

$$1/f_1 = 1/a_{1c} + 1/b_{1c}$$

$$1/f_2 = 1/(d - b_{1c}) + 1/bw$$

Where a parallel light is used for illumination, $$a_{1c} = \infty$$

$$\therefore f_1 = b_{1c}$$

Thus, the enlarging magnification $\beta$ is $$\beta = [bw/(d - f_1) + 1]$$

Figure 13:
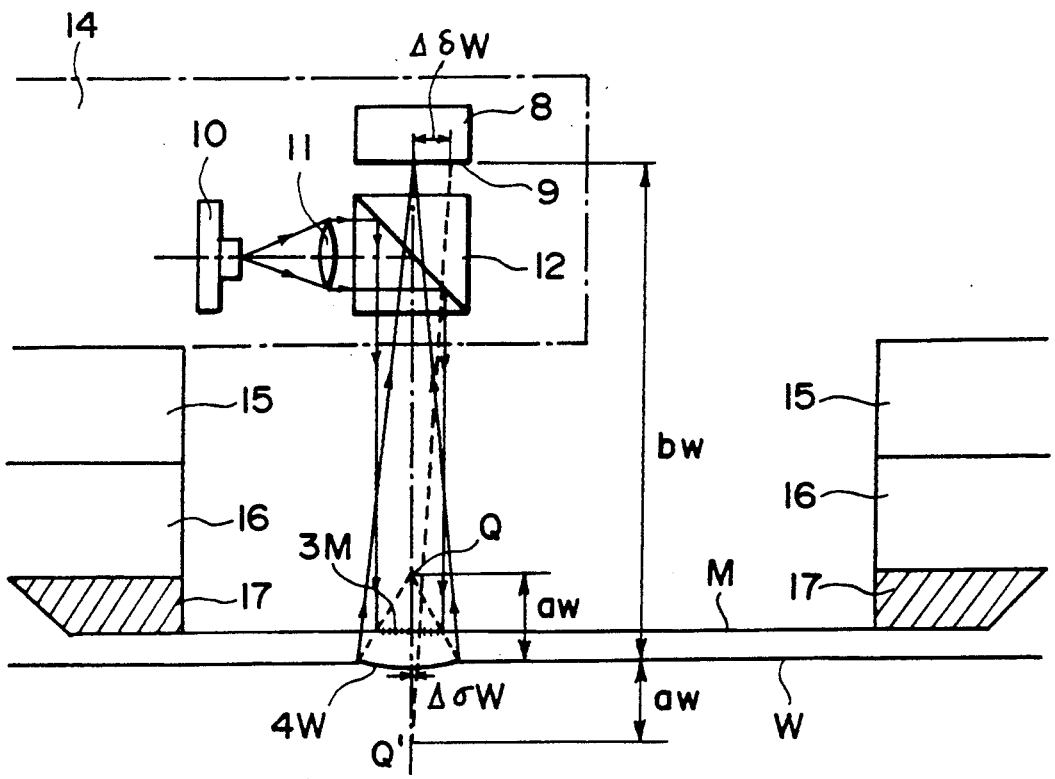

FIG. 13 shows a further embodiment, wherein like some of the foregoing embodiments the invention is applied to a proximity type exposure apparatus.

In this embodiment, in place of a reflection type zone plate which is used in the FIG. 11A embodiment as a wafer alignment pattern, a reflection type pattern 4W formed by shaping a surface portion into a concave surface is used. The function thereof is substantially the same as that of the reflection type zone plate used in the FIG. 11A embodiment.

Reference character 3M denotes a mask alignment pattern which is provided in this embodiment by a transmission type zone plate. The remaining structure is substantially the same as that of the FIG. 11A embodiment.

Figure 14:
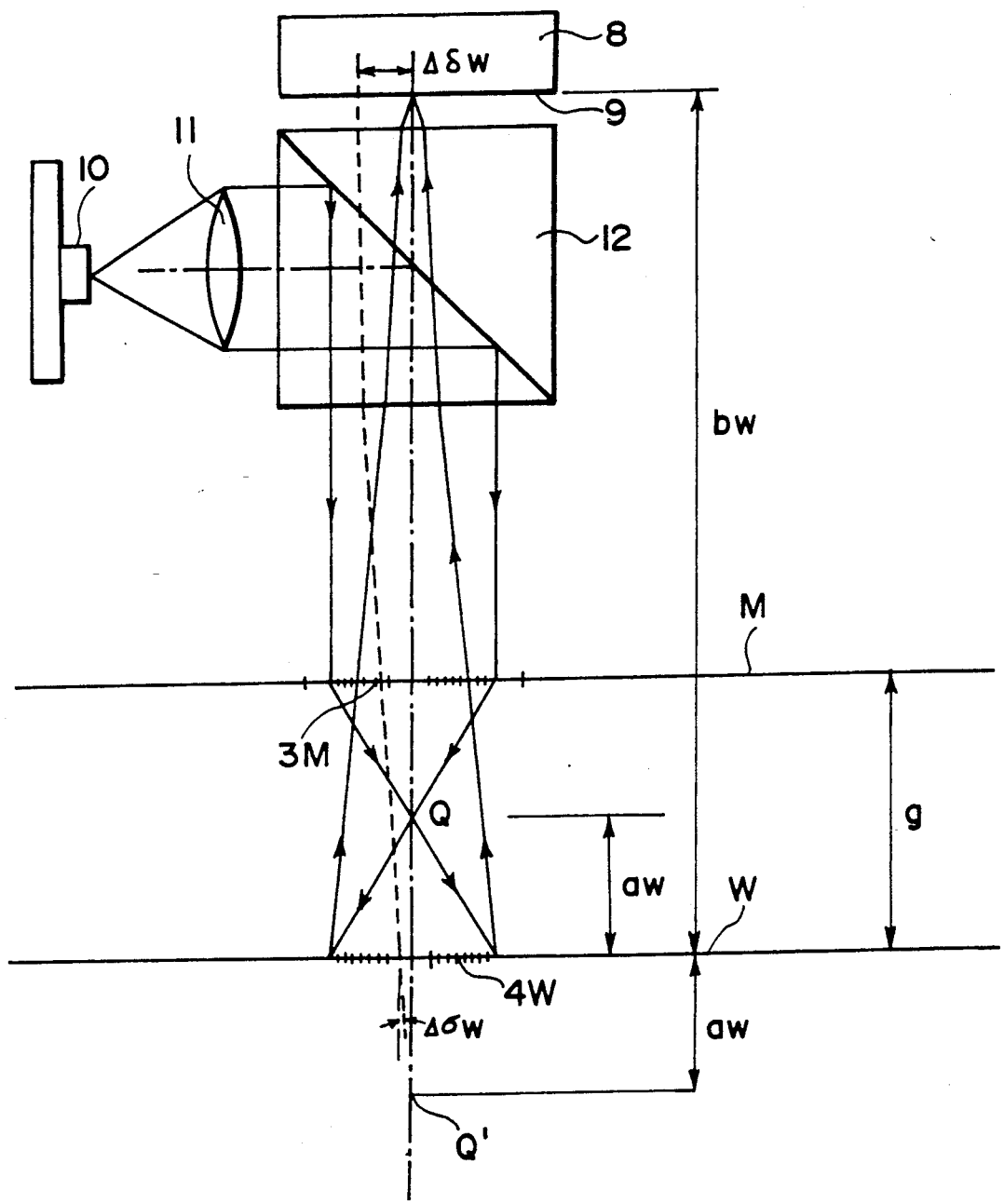

FIG. 14 shows a yet another embodiment, wherein like some of the foregoing embodiments the invention is applied to a proximity type exposure apparatus. This embodiment has a structure which corresponds to what can be called a "convex-convex arrangement" having a convex lens and a concave-surface mirror.

Light emanating from a light source 10 is collimated into a parallel light by a lens system 11, and after passing through a half mirror 12 the parallel light impinges upon the mask alignment pattern 3M. The mask alignment pattern 3M is provided, in this embodiment, by a zone plate having a function for focusing a received light at a point Q which is before a wafer W. The light once focused at the point Q advances divergently and impinges on a wafer alignment pattern 4W. The wafer alignment pattern 4W is provided, in this embodiment, by a zone plate of reflection type and has a function for reflecting a received light so that, after passing the mask M and the half mirror 12, it is imaged on a detecting surface 9.

In this embodiment, as discussed, the light focused at the point Q by the mask alignment pattern is then imaged upon the detecting surface 9. If in this case the wafer W is positionally deviated by an amount $\Delta\sigma w$ with respect to the mask M, the displacement or positional deviation $\Delta\delta w$ of the center of gravity of light upon the detecting surface 9 can be written (similarly to the case of the "convex-convex system" shown in FIG. 3) as follows:

$$\Delta\delta w = \Delta\sigma w \times (bw/aw + 1)$$

Rewriting aw in this equation by using the distance $b_{1a}$ from the first physical optic element to the point Q' of convergence and the spacing d between the first and second physical optic elements, then, $$\beta = [bw/(d - b_{1a}) + 1]$$

At this time, the focal lengths $f_1$, and $f_2$ of these physical optic elements satisfy the following relations:

$$1/f_1 = 1/a_{1a} + 1/b_{1a}$$

$$1/f_2 = 1/(d-b_{1a}) + 1/bw$$

Where a parallel light is used for illumination, $$a_{1a} = \infty$$

$$\therefore f_1 = b_{1a}$$

Thus, the enlarging magnification $\beta$ is expressed as follows:

$$\beta = [bw/(d-f_1) + 1]$$

Where the gap g between the mask M and the wafer W is 50 microns and where $$aw = 25 \text{ microns}$$

$$bw = 10000 \text{ microns,}$$

then a sensitivity of four hundred, and one (401) times higher is obtainable. Namely, if the measurement is attainable with a precision of $\Delta\sigma w$ to 0.1 micron, then, a least positional deviation $\Delta\sigma w$ to 0.00025 micron can be evaluated.

If, at this time, an alignment pattern of a diameter of 30 microns is used, the minimum pitch P is can be given by:

$$P = \lambda/\sin\theta = 0.83/\sin 30°$$
$$= 1.66 \text{ micron}$$

Thus, the minimum line width is 0.83 micron.

Also, if the effective diameter of the spot is determined by using $e^{-2}$, the spot diameter S on the detecting surface 9 can be given by:

$$S = 1.64 \times \lambda \cdot F_{NO.}$$
$$= 1.64 \times 0.83 \times 10000/30$$
$$= 454 \text{ (microns)}$$

Figure 15:
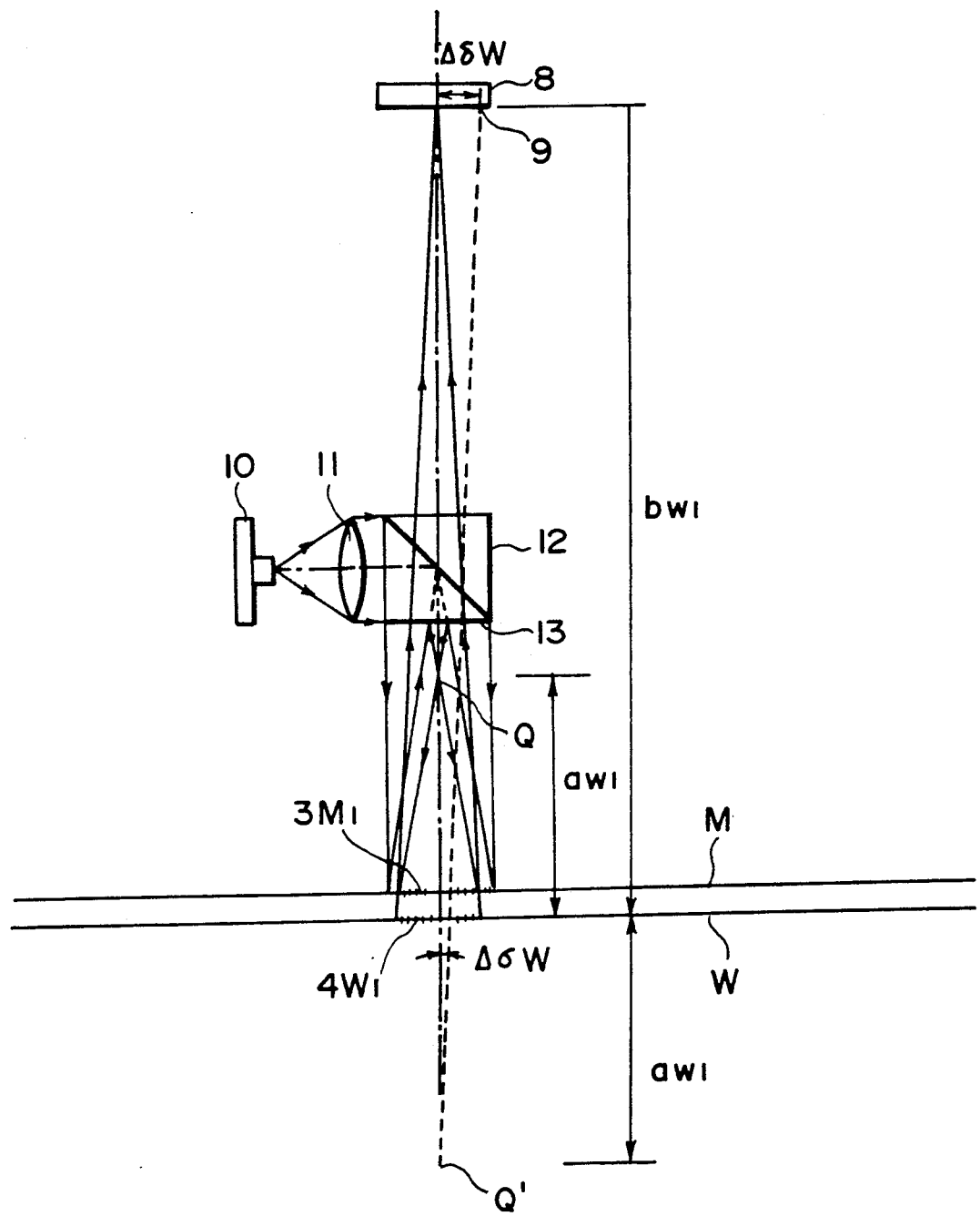

FIG. 15 shows a still further embodiment of the present invention, wherein like some of the foregoing embodiments the invention is applied to an exposure apparatus of proximity type. This embodiment has a structure which corresponds to what can be called a "convex-convex arrangement" having two concave-surface mirrors.

Light emanating from a light source 10 is collimated into a parallel light by a lens system 11, and after passing through half mirrors 12 and 13 the parallel light impinges upon a mask alignment pattern 3M1. The mask alignment pattern 3M1 is provided, in this embodiment, by a grating lens of reflection type and is adapted to reflect a received light so that, after being reflected again by the half mirror 13, the light is focused at a point Q. The light emanating from the point Q is further reflected by a wafer alignment pattern 4W provided on a wafer W. After passing the half mirrors 12 and 13, the reflected light from the wafer alignment pattern is focused upon a detecting surface 9.

Where, in such arrangement, the wafer W is positionally deviated by an amount $\Delta\sigma w$ with respect to the mask M, the displacement or positional deviation $\Delta\delta w$ of the center of gravity of light upon the detecting surface 9 can be written as follows:

$$\Delta\delta w = \Delta\sigma w \times (bw1/aw1 + 1)$$

Assuming now that aw1=0.5 mm and bw1=50 mm, then $\Delta\delta w = 101 \Delta\sigma w$. Namely, if the measurement can be made at a precision of $\Delta\delta w = 0.1$ micron, at least positional deviation $\Delta\sigma w$ to 0.001 micron can be evaluated.

Also, if the aperture of the wafer alignment pattern 4W is sized to 100 microns, the spot diameter $\phi$ on the detecting surface 9 becomes equal to 680 microns, provided that the evaluation is made to the extent of such a diameter at which, due to the diffraction effect, the light quantity decreases to $e^{-2}$ on condition that $\lambda = 0.83$ micron and on condition that an image formed at the point Q is a point image. Since actually there is a substantial expansion in an image formed by the mask alignment pattern 3M1, this effect is more significant If the expansion at this time is 10 microns, then $\phi = 1000$ microns.

Figure 16:
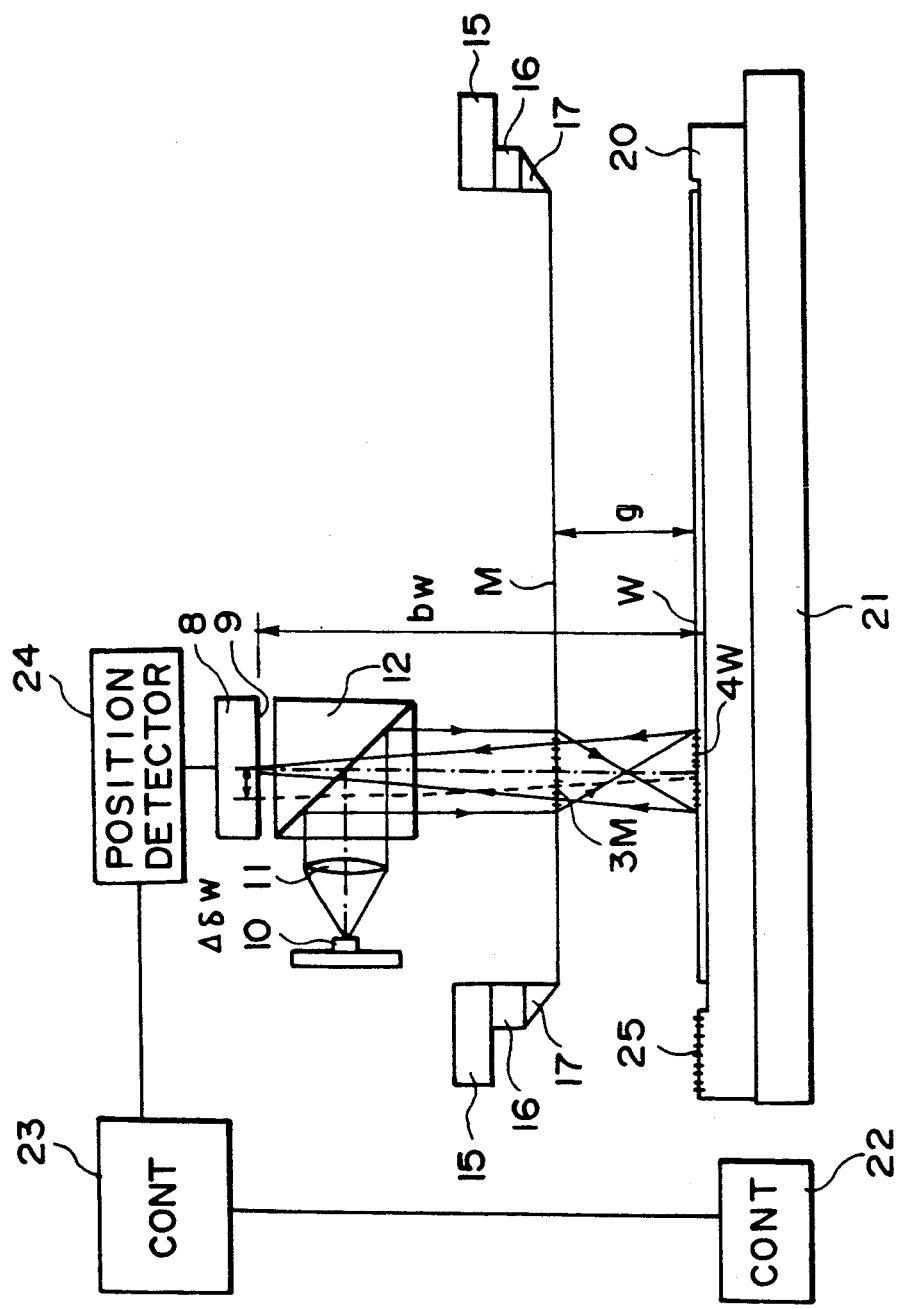

FIG. 16 shows a yet another embodiment of the present invention, wherein the invention is applied to an alignment system in a proximity type exposure. apparatus, for aligning a mask and a wafer.

Details of the alignment procedure in this embodiment will now be explained.

(1-1) First, a reference point for accomplishment of alignment is set. As for such a reference point, a particular position on the detecting surface 9 can be determined preparatorily, for example, in the manner described hereinbefore. The following some steps are for the mask alignment.

(1)-(a) A reference mark 25 which may be formed by a grating lens similar to the wafer pattern, is formed on the wafer chuck 20 which is mounted to the wafer stage 21.

(1)-(b) Control device 23 applies a moving signal to the wafer stage controller 22 to move the wafer stage 21 so as to bring the reference mark 25 to an alignment evaluation station. The reference mark 25 is thus moved to and stopped at such a position at which, when the alignment pattern 3M of the mask is correctly positioned at a set position, the position of the center of gravity of light projected upon these marks is exactly coincident with the reference point.

(1)-(c) Then, the light from the light source 10 is projected upon the mask alignment pattern 3M and the reference pattern 25, the light passing through these patterns being concentrated upon the detecting surface 9.

(1)-(d) The position detecting circuit 24 detects the position of the center of gravity of the thus focused light, and supplies a position signal to the control device 23. Based on the thus supplied position signal, the control device 23 actuates a driving mechanism (not shown) to move and correctly position the mask.

(1-2) Subsequently, by moving the wafer stage 21, the position of the wafer W is set so that the wafer alignment pattern 4W is placed at the alignment evaluation station.

(1-3) Then, light is projected from the light source 10 upon the mask alignment pattern 3M and then upon the wafer alignment pattern 4W, the light passing through these patterns being directed to the detecting surface 9. The signal detecting circuit 24 detects the position of the center of gravity of incident light, and supplies a wafer position signal to the control device 23.

(1-4) The control device evaluates the positional error or deviation of the wafer, on the basis of the reference point position and the wafer position signal, and supplies an alignment signal to the wafer stage controller 22.

(1-5) The wafer stage controller 22 operates to move the wafer stage 21 to correct the relative positional deviation between the mask and the wafer.

(1-6) Again, any positional deviation between the mask and the wafer is examined or checked.

(1-7) If necessary, the above-described steps (1-2) to (1-6) are repeated.

Figure 17:
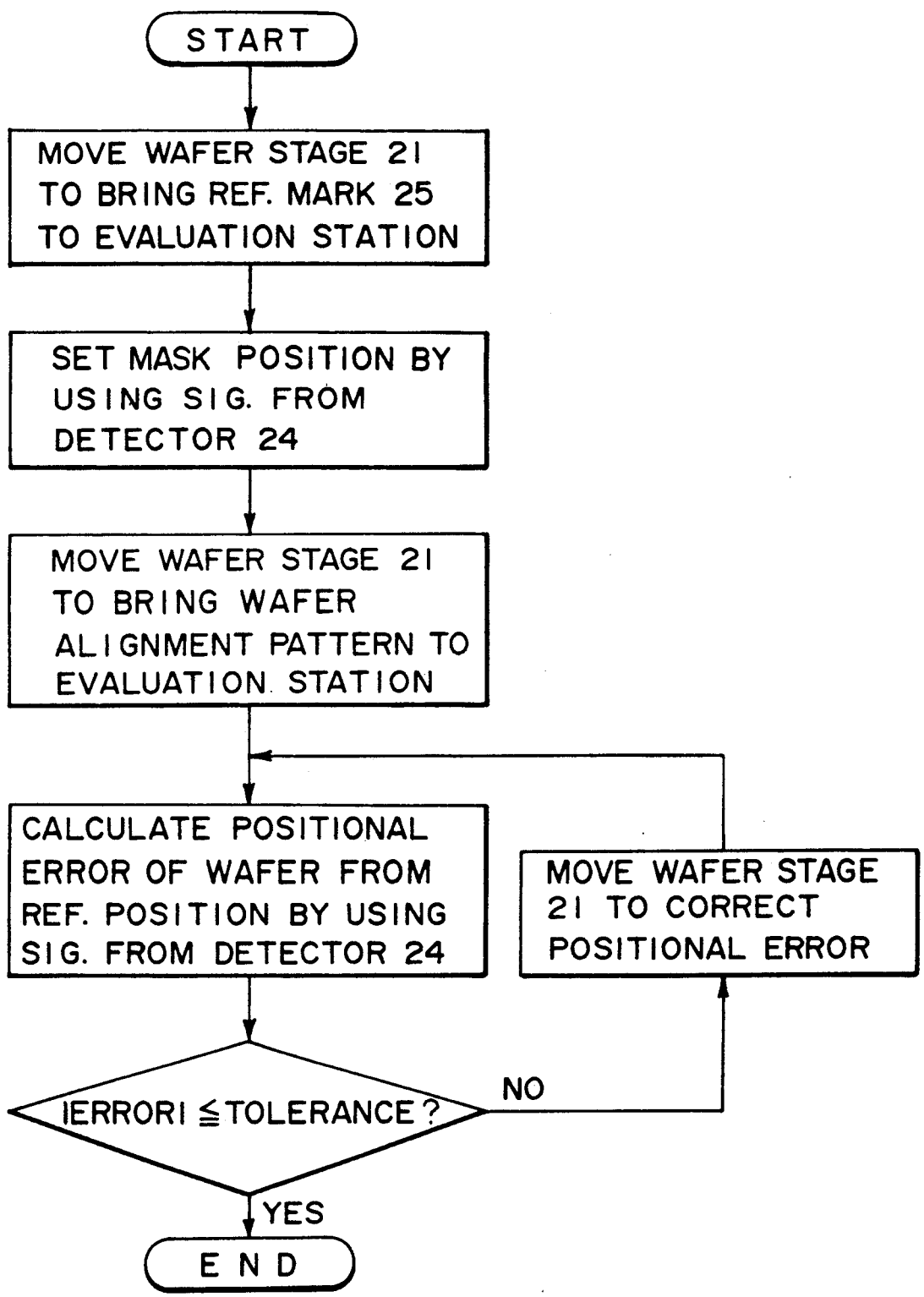
FIG. 17 is a flow chart showing the sequence of alignment operation to be made in the exposure apparatus of FIG. 16.

The manner of control of the control device 23 according to the above-described alignment procedure is shown in FIG. 17.

FIG. 18 shows a still further embodiment of the present invention, wherein the invention is applied to a semiconductor device manufacturing exposure apparatus of reduction projection type.

In FIG. 18, light emanating from a light source 10 is collimated into a parallel light by a lens system 11, and the parallel light illuminates a reticle alignment pattern 3L provided on a reticle L. In this embodiment, the reticle alignment pattern 3L constitutes a transmission type physical optic element having a lens function for focusing the light passing therethrough at a point Qo. The light from the point Qo is directed by a reduction lens system 18 to be focused at a point Q which is spaced by a distance aw from a wafer W.

The wafer W is provided with a wafer alignment pattern 4W which constitutes, in this embodiment, a reflection type physical optic element having a function, like that of a convex-surface mirror, for reflecting the light, coming thereto so as to be focused at the point Q, so that with the cooperation of a half mirror 19 the reflected light is focused on a detecting surface 9.

On the basis of any deviation $\Delta\delta$ of the center of gravity of light incident on the detecting surface 9, any relative positional deviation $\Delta\sigma$ between the reticle L and the wafer W is detected.

Where the distance from the wafer W to the detecting surface 9 via the half mirror 19 is denoted by bw, the deviation $\Delta\delta$ of the center of gravity of light can be given by:

$$\Delta\delta = \Delta\sigma \times (bw/aw - 1)$$

By suitably selecting the distances aw and bw, the relative positional deviation $\Delta\sigma$ of the reticle L and the wafer W can be detected with high precision.

In this embodiment, the position of the point Q is located at a side of the wafer W remote from the reticle L and the wafer alignment pattern 4W used is of a convex-surface mirror type, though the invention is not limited to this. Namely, as shown in FIGS. 11A and 14, the point Q may be defined on another side of the wafer, close to the reticle L, and the wafer alignment pattern 4W may be of a concave-surface mirror type. Substantially the same results are obtainable in that case.

FIG. 19 shows a further embodiment of the present invention, which is similar to the FIG. 14 embodiment. In this embodiment, the alignment patterns of the mask and the wafer of the FIG. 14 embodiment are modified. More specifically, a mask alignment pattern 3M and a wafer alignment pattern 4W each is formed by a two-dimensional grating having the same refracting power both in the direction of scribe line and in the direction perpendicular thereto.

Detector 8 comprises a two-dimensional or area sensor and functions to detect the position of the center of gravity of light incident thereupon. Reference numeral 9' denotes a light-receiving surface of the detector 8, and reference numeral 9a denotes the spot formed by the light incident on the detector 8. In this embodiment, the detector 8 is adapted to detect any positional deviation between the mask M and the wafer W, two-dimensionally and at a magnification which is defined by the grating system. By using such a two-dimensional grating lens system and such a two-dimensional sensor, the direction and the amount of the positional deviation between the mask and the wafer can be detected at a time and with high precision.

In the sensor system, as has been described with reference to FIG. 3, the signal is processed to be standardized with the total light intensity over the whole light-receiving region. As a result, even if the output power of the light source changes slightly, the measured value as outputted from the sensor system exactly represents the position of the center of gravity.

Figure 20:
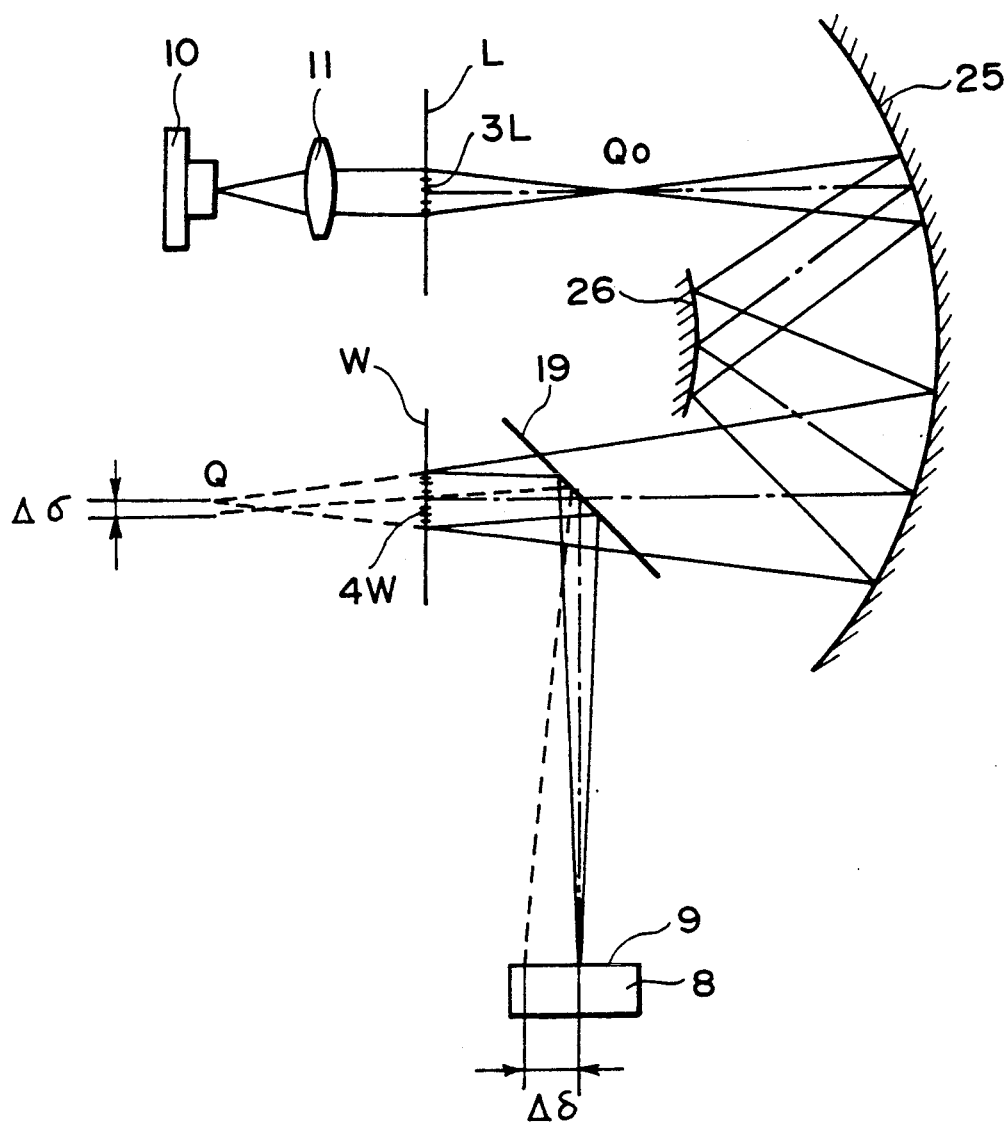

FIG. 20 shows a yet further embodiment of the present invention, wherein the invention is applied to a semiconductor device manufacturing exposure apparatus of unit-magnification imaging type using two reflection mirrors 25 and 26. In this embodiment, a pattern (circuit pattern) formed on a reticle L is imaged by the reflection mirrors 25 and 26 upon a wafer W surface and, for this purpose, a printing light or radiation energy emitted from an exposure system (not shown in this drawing) is used to print the reticle pattern on the wafer W surface.

On the other hand, an alignment system is arranged so that light emanating from a light source 10 is collimated into a parallel light by a lens 11 and the collimated light, after passing through a reticle alignment pattern 3L on the reticle L, is directed by the reflection mirrors 25 and 26 to illuminate a wafer alignment pattern 4W. Then, it is reflected by the wafer alignment pattern 4W and is again reflected by a half mirror 19. Thereafter, the light is directed to a detecting surface 9 of a detector 8. In this embodiment, the reticle alignment pattern 3L and the wafer alignment pattern 4W each is formed by a physical optic element having optical characteristics suitable to or according to the present invention. More specifically, the reticle alignment pattern has a function of a convex lens, so that the light which is focused once at a point Qo is focused again at a point Q by the action of the reflection mirrors 25 and 26. On the other hand, the wafer alignment pattern 4W has a function of a convex-surface mirror and operates to reflect the light, coming thereto so as to be focused at the point Q, and focus the light upon the detecting surface 9.

On the basis of any deviation $\Delta\delta$ of the center of gravity of light incident upon and detected by the detecting surface 9, any relative positional deviation $\Delta\sigma$ of the reticle L and the wafer W is detected essentially in the same manner as in the foregoing embodiments.

Figure 21:
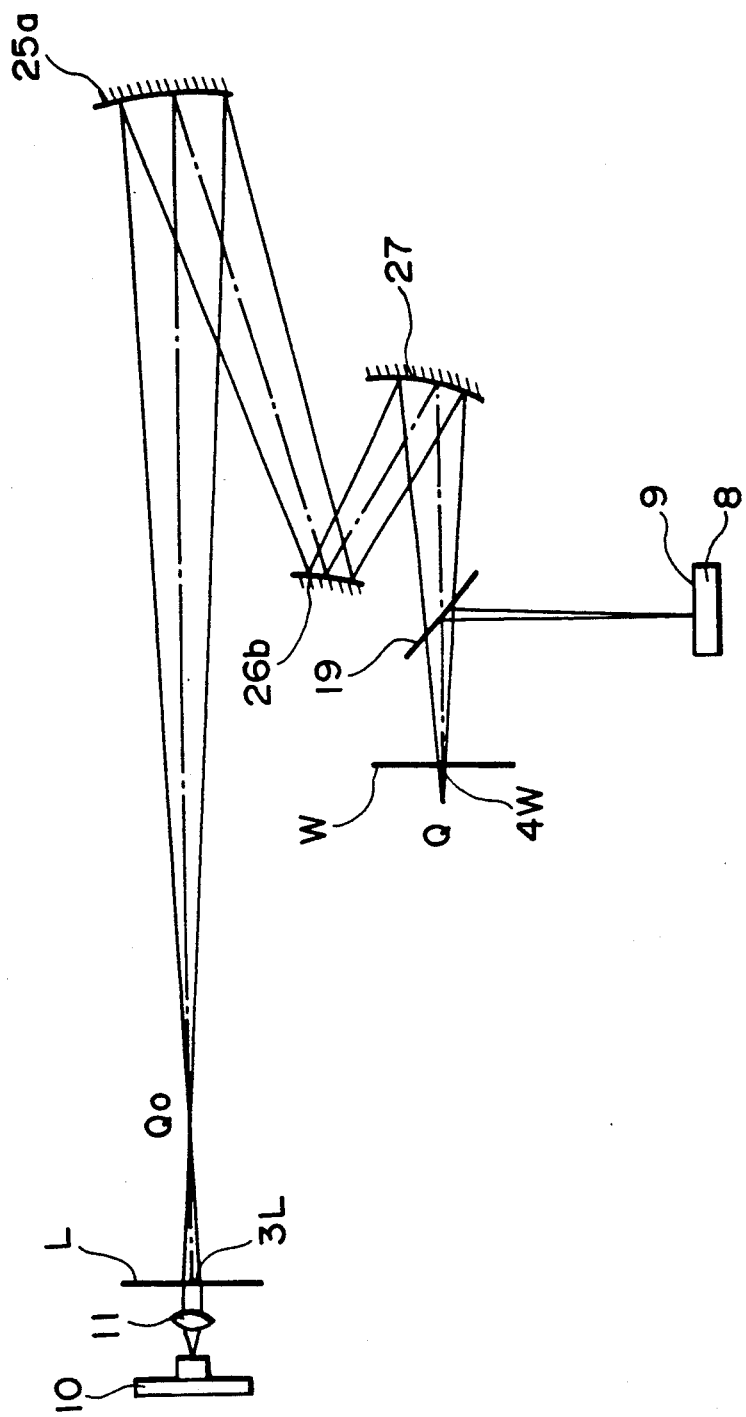

FIG. 21 shows another embodiment, wherein the invention is applied to a semiconductor device manufacturing exposure apparatus of reduction imaging type, using three reflection mirrors 25a, 26a and 27.

In this embodiment, a pattern (circuit pattern) formed on a reticle L is imaged in a reduced scale of 1:4 upon the surface of a wafer W, by means of the reflection mirrors 25a, 26a and 27. At this time, a printing light or radiation energy supplied by an exposure system (not shown in this drawing) is used to print the reticle pattern on the wafer W surface.

On the other hand, an alignment system is arranged so that light emanating from a light source 10 is collimated into a parallel light by a lens 11, and the reflected light, after passing through a reticle alignment pattern 3L provided on the reticle L, is directed by the reflection mirrors 25a, 26a and 27 to illuminate a wafer alignment pattern 4W. The light is reflected by the wafer alignment pattern 4W and is reflected again by a half mirror 19. Thereafter, it is directed to a detecting surface 9 of a detector 8. In this embodiment, the reticle alignment pattern 3L and the wafer alignment pattern 4W each is provided by a physical optic element having optical characteristics suitable to or according to the present invention. More specifically, the reticle alignment pattern 3L has a function of a convex lens, so that the light which is focused once at a point $Q_0$ is focused again at a point Q by the action of the reflection mirrors 25a, 26a and 27. The wafer alignment pattern 4W has a function of a convex-surface mirror and reflects the light, coming thereto so as to be focused at the point Q, and focuses it upon the detecting surface 9.

On the basis of any deviation $\Delta\delta$ of the center of gravity of light incident on and detected by the detecting surface 9, any relative positional deviation $\Delta\sigma$ of the reticle L and the wafer W is detected essentially in the same manner as in the foregoing embodiments.

Figure 22:
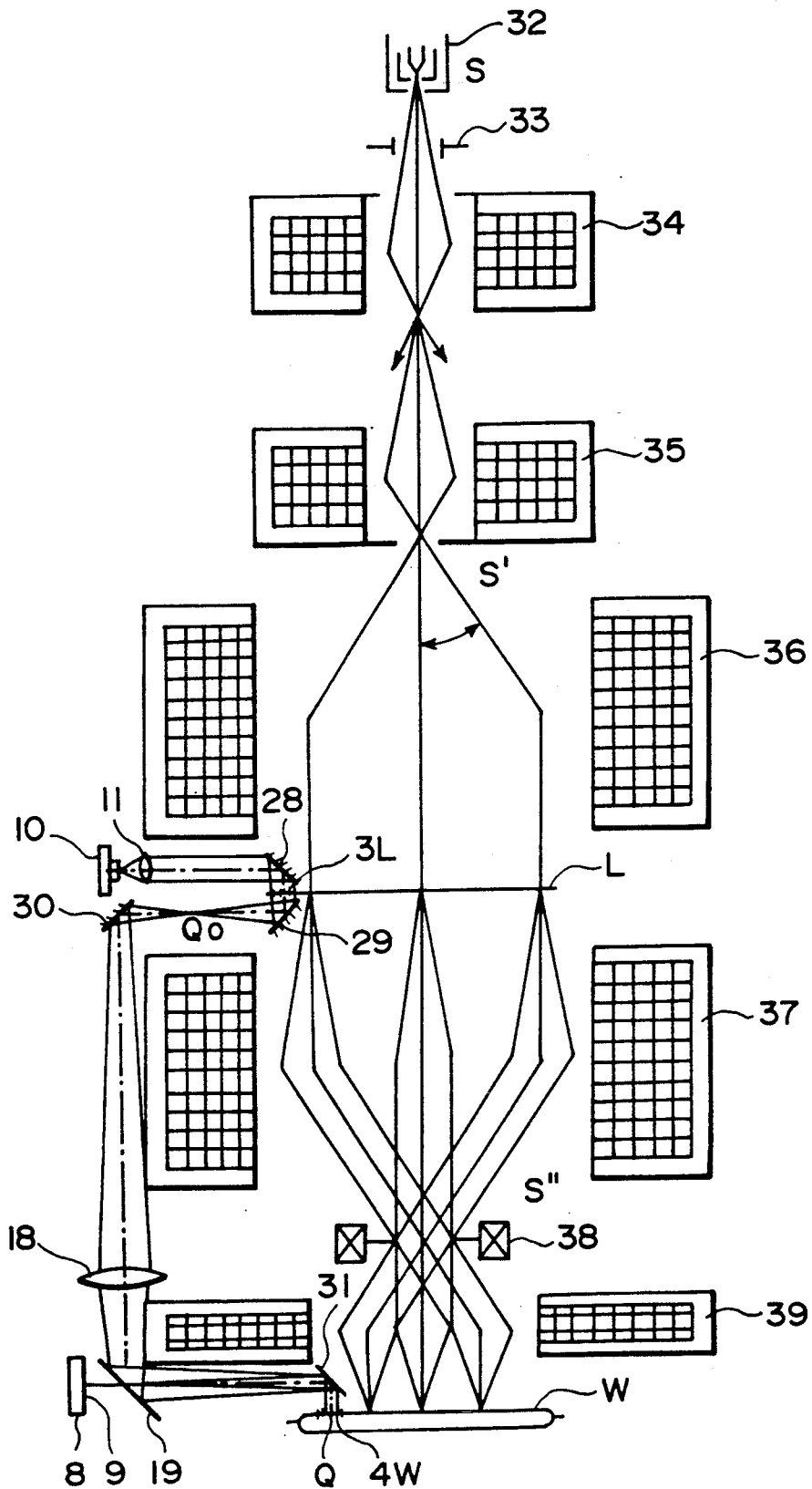

FIG. 22 shows a further embodiment of the present invention, wherein the invention is applied to an electron-beam irradiation apparatus of reduction projection type, for use in the manufacture of semiconductor devices.

In this embodiment, an electron beam projected by an electron gun 32 passes through a blanking plate 33 and then is transformed into a parallel beam by means of a first condenser lens 34, a second condenser lens 35 and a third condenser lens 36. Thus, a parallel electron beam irradiates a reticle L. The reticle L is provided by a pattern which can be prepared by forming shaped or patterned holes in a metallic foil. The electron beam passing through the reticle L forms, in cooperation with a first projection lens 37, an apertured alignment coil 38 and a second projection lens 39, an image of a mask pattern upon the surface of a wafer W in a reduced scale of 1:10, in this embodiment.

On the other hand, an alignment optical system is arranged so that light emanating from a light source 10, provided for the alignment purpose, is collimated into a parallel light by a lens 11, and the parallel light is projected by a mirror 28 upon an alignment pattern 3L provided on the reticle L. By this alignment pattern 3L, the parallel light is converged to and focused at a point $Q_0$, after once reflected by a mirror 29. Subsequently, the advancing direction of the light is changed by a mirror 30 and, by a lens 18, the light is again transformed into a convergent light. Then, while the advancing direction is changed successively by a half mirror 19 and a mirror 31, the light is converged toward a point Q. Alignment pattern 4W provided on the wafer W functions to reflect the light, converging toward the point Q, so that by way of the mirror 31 and the half mirror 19, the light is focused on a detecting surface 9 of a detector 8.

In this embodiment, the reticle alignment pattern is so sized that, by the lens 18, it is brought into a reduction projection relationship of a reduction scale of 10:1, as the same magnification of the electron beam exposure system. As a result, any lateral shift of the circuit pattern provided on the reticle corresponds, in a one-to-one relationship, to the lateral shift of the reticle alignment pattern 3L.

On the basis of any deviation $\Delta\delta$ of the center of gravity of light incident on and detected by the detecting surface 9, any relative positional deviation $\Delta\sigma$ of the reticle L and the wafer W is detected essentially in the same manner as in the foregoing embodiments.

Figure 23A:
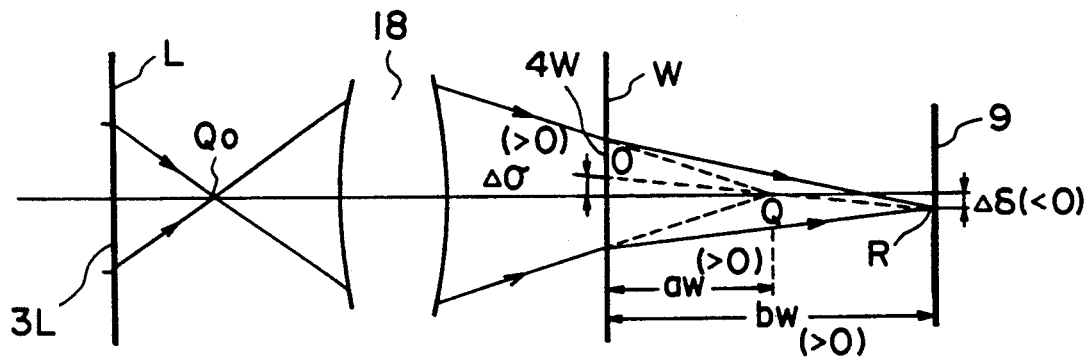
FIGS. 23A–23C, FIGS. 24A–24C, FIGS. 25A–25C and FIGS. 26A–26C, are principle views, respectively, for explicating the principle of alignment in some examples in which the invention is applied to a projection type exposure apparatus and in which the used alignment patterns have different powers.
Figure 23B:
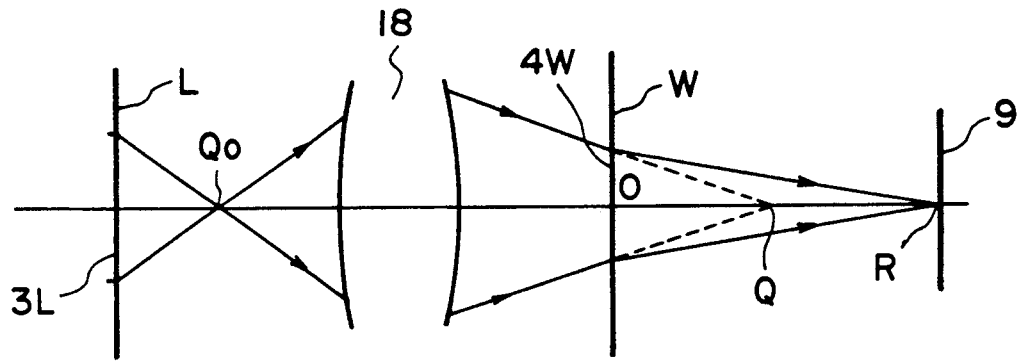
Figure 23C:
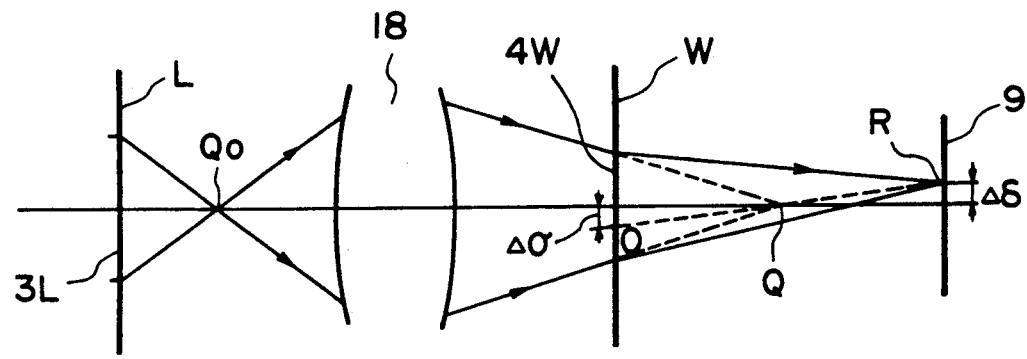

Referring now to FIGS. 23A-23C, the principle of alignment in an example where the invention is applied to a reticle-to-wafer alignment in a projection type exposure apparatus, like that shown in FIG. 18, will be explained in greater detail. Like numerals as of FIG. 18 are assigned to similar elements.

Of these drawings, FIGS. 23A and 23C depict occasions in each of which a first object (reticle) L and a second object (wafer) W are relatively deviated by an amount $\Delta\sigma$. FIG. 23B depicts a state in which the alignment of the first and second objects L and W is completed.

In this example, a parallel light from a collimator lens (not shown) is projected upon a first physical optic element 3L such as a Fresnel zone plate, for example, which is a first alignment pattern provided in a portion of the first object L (which represents a reticle). The first physical optic element 3L has a light converging function as of a convex lens, for example, so that the light emanating therefrom is focused at a focal point position $Q_0$ of the first physical optic element 3L. Such point $Q_0$ is relayed by means of a condensing optical system such as, for example, a projection lens system 18 provided for the reduction printing, whereby the focused light at the point $Q_0$ is re-imaged at a point Q.

In this example, the second object W such as a wafer which is a subject to be aligned, is disposed on the lens system 18 side of the point Q and at a distance aw from the point Q. Additionally, in such region of the second object W surface that can be irradiated with the light being converged toward the point Q, a second physical optic element 4W having a light diverging function such as of a concave lens, for example, is provided. The light incident on the second physical optic element 4W is reflected, whereby, through the reflection at an unshown half mirror, the point Q is re-imaged upon a detecting surface 9 as a point R.

Namely, the first physical optic element 3L, the lens system 18 and the second physical optic element 4W are arranged so as to provide a lens group of what can be called a "convex-convex-concave system" type, such that a projected light image is once imaged at a midway (point $Q_0$) and, thereafter, it is focused by the lens system 18 at a point Q spaced by a distance aw from the second physical optic element 4W, the point Q being re-imaged upon the detecting surface 9, as a point R, which is spaced by a distance bw from the second physical optic element 4W. Where, in this example, the center of the second physical optic element 4W is denoted by 0 and where the amount of shift of the positional relationship between the first and second objects L and W (as shown in FIG. 23A or 23C) from their positional relationship to be assumed at the time of completion of the alignment, namely, the amount of positional deviation between the first and second objects, is denoted by $\Delta\sigma$, then it is easily seen from the geometrical arrangement that the amount of displacement ($\Delta\delta$) of the imaging point R upon the detecting surface 9 from the position as assumed at the time of completion of the alignment, can be given by the following equation, provided that parameters are set as illustrated in the drawings:

$$\Delta\delta = (1 - bw/aw) \cdot \Delta\sigma \quad \quad (4)$$

wherein, in FIGS. 23A–23C, $\Delta\sigma > 0$, aw$>0$, bw$>0$ and $\Delta\delta < 0$. In equation (4), bw/aw corresponds to a lateral magnification $\beta$ (which can be called an imaging magnification) used in an ordinary optical imaging system. Thus, equation (4) can be rewritten as follows:

$$\Delta\delta = (1 - \beta) \cdot \Delta\sigma \quad \quad (5)$$

The position of the imaging point R as assumed at the time of alignment completion can b determined in preparation. For example, each time a fresh mask is introduced to the exposure apparatus, trial printing of a wafer or wafers may be made. From any deviation of a printed pattern, after the development, as well as the position of the imaging point as assumed at the time of trial printing, the reference position for the imaging point R can be detected by using equation (5).

It will be readily understood from equations (4) and (5) that, for high-precision detection of any displacement of the second object W, it is preferable to enlarge the amount of shift ($\Delta\delta$) of a light spot formed on the light receiving surface 9. For example, a magnification $\times 50$–$\times 200$, for example, may be preferably set for a positional deviation $\Delta\sigma$. This can be defined substantially only by the distance aw to the imaging point Q and the distance bw to the detecting surface 9, in combination with the imaging magnification of the lens system 18, while taking the focal length of the first physical optic element 3L as a parameter. Therefore, a desired magnification can be easily set in consideration of limitations determined in respect to the fabrication of the apparatus. For convenience in explanation, a description has been provided of an example wherein light from the second physical optic element 4W is directly imaged upon the detecting surface 9. However, if there is a difficulty in the disposition of the detecting surface 9 from some limitations due to the fabrication method, for example, a suitable lens system may of course be provided at a midway of the optical path so as to adjust the operative distance, to thereby adjust the magnification.

In the present embodiment, each alignment pattern comprises a physical optic element. This is advantageous because, as compared with a case where an alignment pattern comprises a traditional edged pattern, the alignment is less affected by any defect of the alignment pattern. Further, the focal length of the first physical optic element can be selected so as to be coordinated with a used lens system for the reduction pattern printing and, by such selection, it is possible to obtain a necessary deviation magnification ($=\Delta\delta/\Delta\sigma$) required for the detection. Further, since in principle the light intensity distribution upon a detector changes monotonously with the deviation of the second object, to be aligned, it is possible to set a wide detectable range within a limit a determined by the size of the detecting surface 9.

Figure 24A:
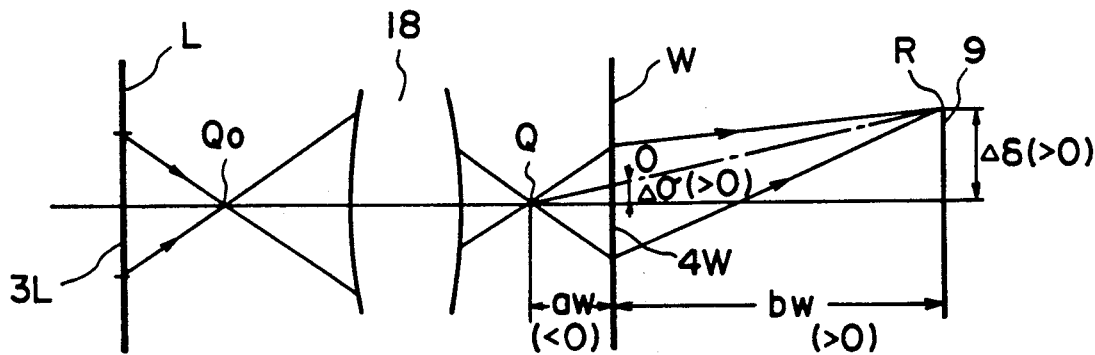
Figure 24B:
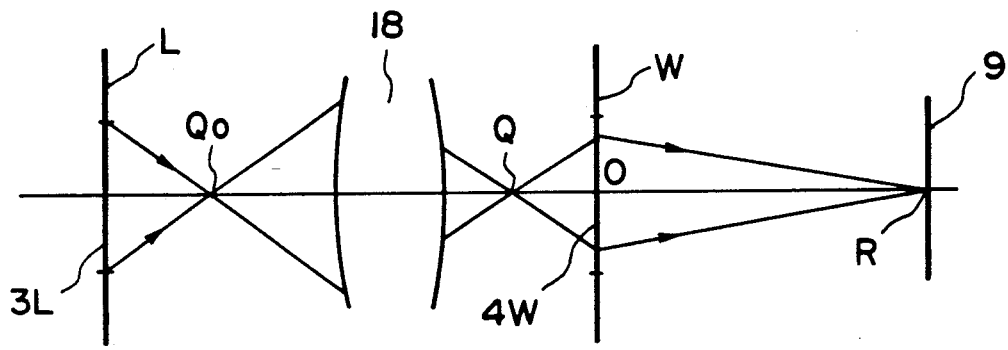
Figure 24C:
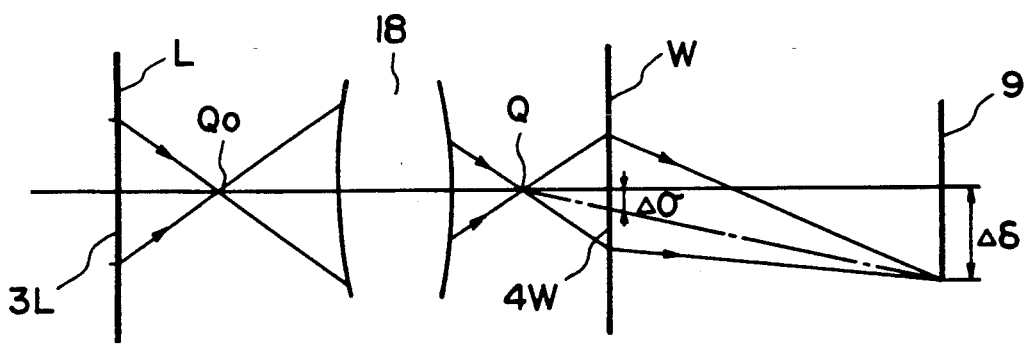
Figure 25A:
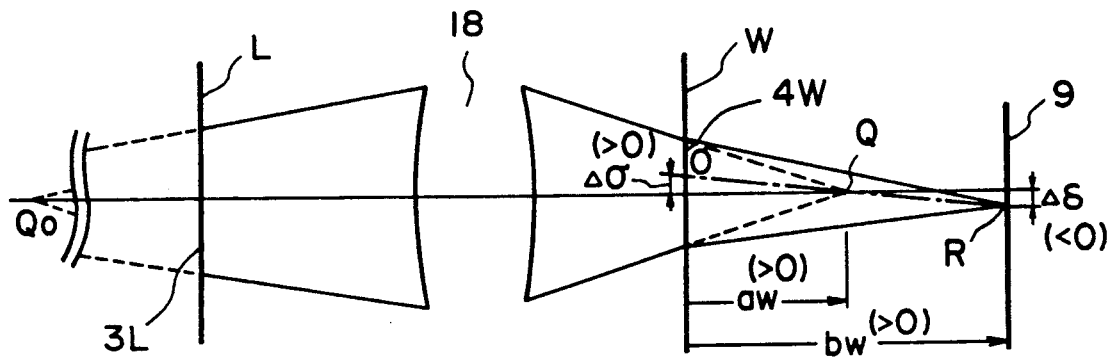
Figure 25B:
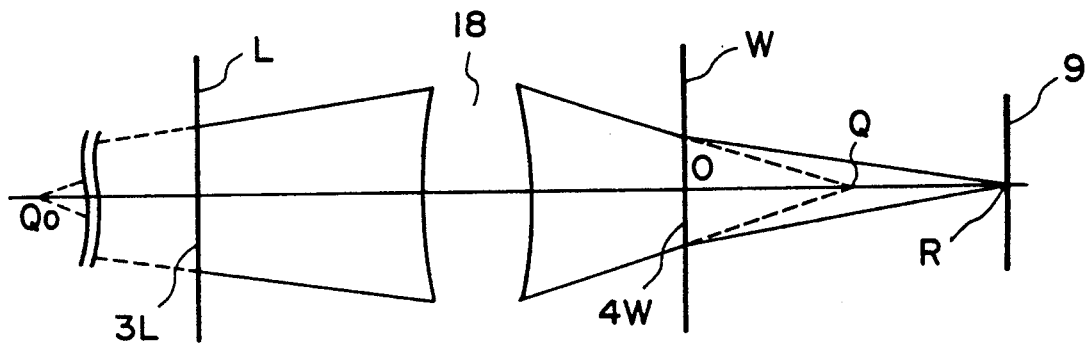
Figure 25C:
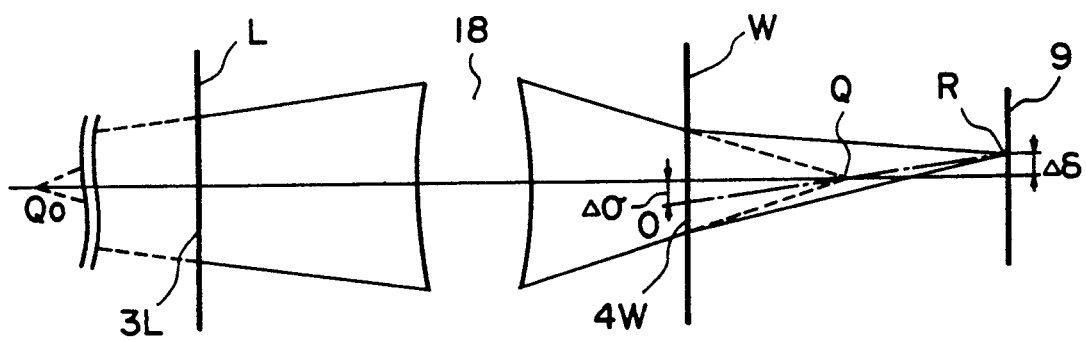
Figure 26A:
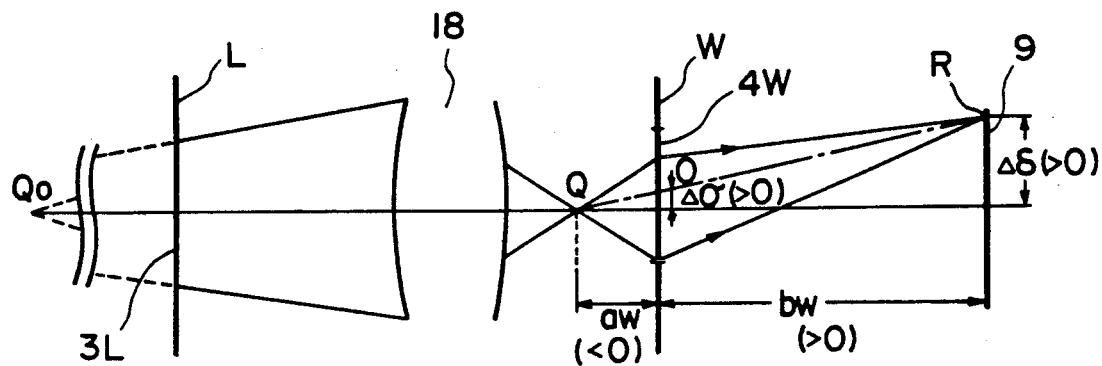
Figure 26B:
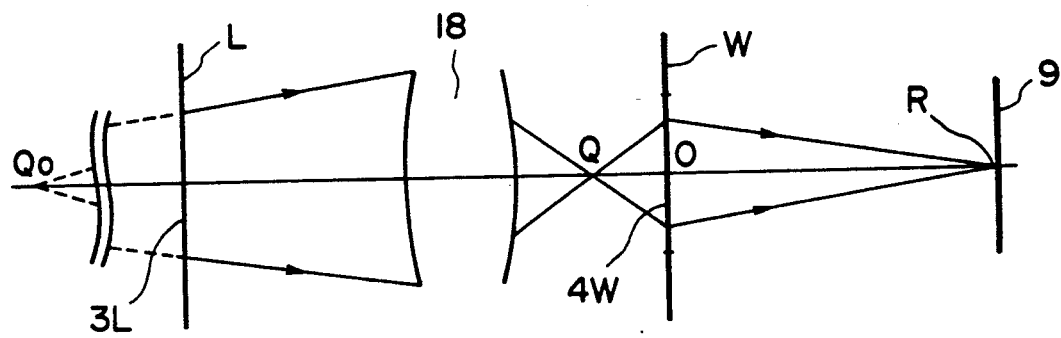
Figure 26C:
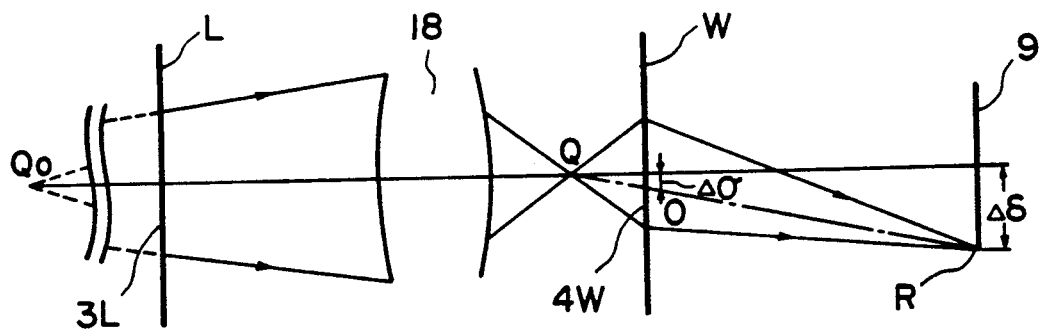

In the example shown in FIGS. 23A–23C, the first physical optic element 3L, the lens system 18 and the second physical optic element 4W cooperate to provide a lens system of what can be called a "convex-convex-concave system". However, the invention is not limited to this. For example, an arrangement of what can be called a "convex-convex-convex system" such as shown in FIGS. 24A–24C; an arrangement of what can be called a "concave-convex-concave system" such as illustrated in FIGS. 25A–25C; and an arrangement of what can be called a "concave-convex-convex system" such as illustrated in FIGS. 26A–26C are possible.

In these structure, the relationship between the relative positional deviation $\Delta\sigma$ between the first and second objects with the positional deviation $\Delta\delta$ of the center of gravity of light is, as described hereinbefore, such as follows:

$$\Delta\delta = (1 - bw/aw) \cdot \Delta\sigma$$

The lens structures described just above can be suitably and conveniently selected in accordance with the property of the lens system 18.

Similarly to FIGS. 23A–23C, each of FIGS. 24A, 24C, 25A, 25C, 26A and 26C depicts the case where the first and second objects L and W are relatively deviated by a certain amount $\Delta\sigma$, whereas each of FIGS. 24B, 25B and 26B depicts a state in which the first and second objects L and W are placed in alignment.

Figure 27:
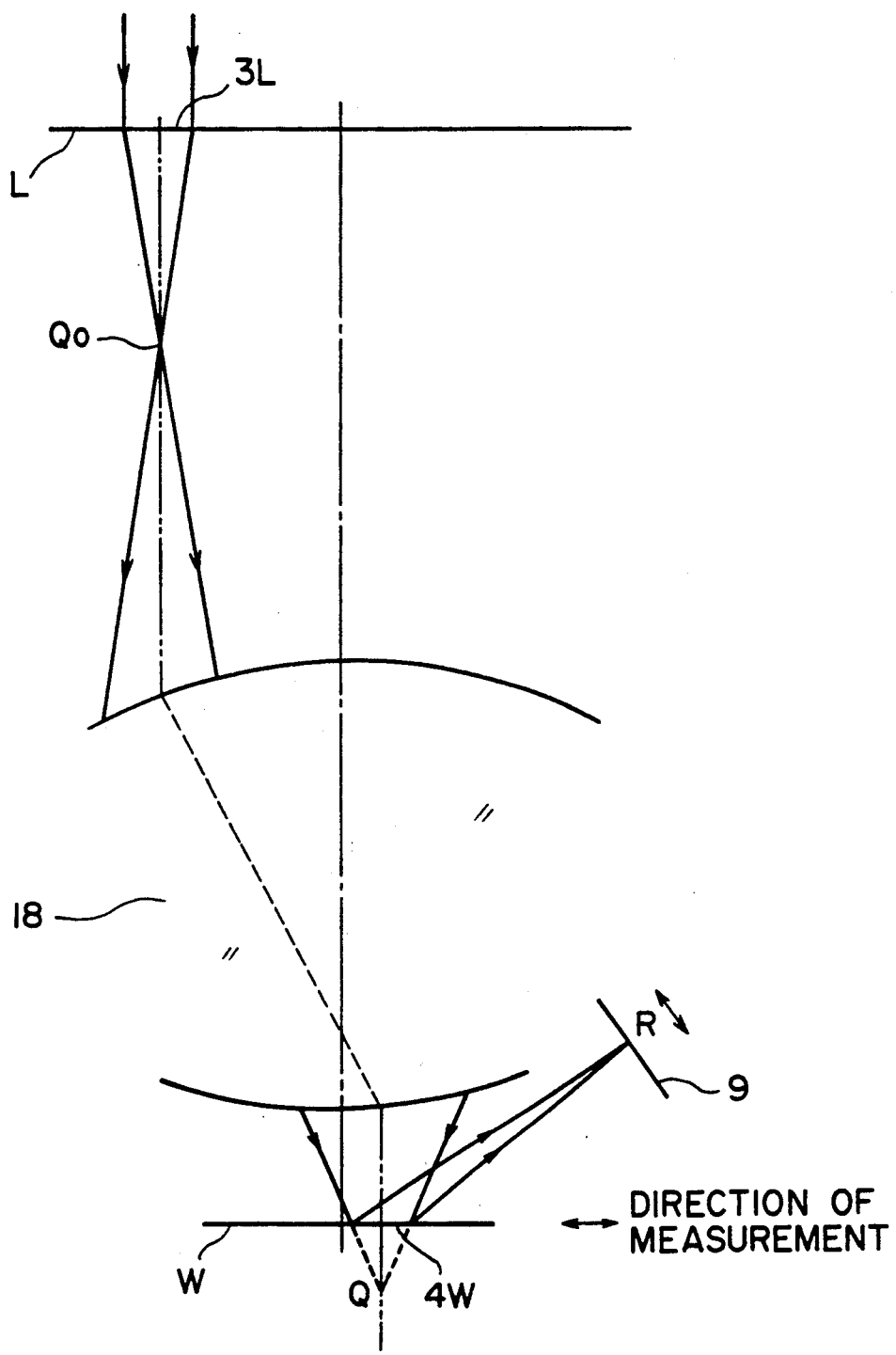
FIGS. 27–34 are schematic representations each illustrating a major portion of a lens projection type exposure apparatus according to a different embodiment of the present invention.

In these embodiments, for convenience in explanation, a description has been provided of examples in which the first physical optic element 3L and the lens system 18 are disposed on the same axis of a coaxial system. However, taking into account that the lens system 18 is a projection lens system for reduction exposure, the optical arrangement may be modified such as illustrated in FIG. 27. More specifically, the optical arrangement may be of a what is called "dual-telecentric system" in which, where in the structure shown in FIG. 27 a pattern on the reticle L surface is going to be imaged upon the wafer W surface by the lens system 18, chief rays at an arbitrary object point and a corresponding image point, both outside the optical axis, become substantially parallel to the optical axis of the lens system 18.

In the FIG. 27 embodiment, the second physical optic element 4W is provided not by a simple concentric type Fresnel zone plate but by an element having a deflecting function. As a result, a half mirror such as one (19) used in the FIG. 18 embodiment can be omitted.

In the FIG. 27 embodiment, particularly the chief ray on the wafer W side is made perpendicular to the wafer W. As a result, any error caused in setting the wafer in the direction of the optical axis causes, in principle, no shift of a component, in the direction of measurement, of the detecting system. Therefore, such an error does not result in deterioration in the precision.

When the invention is applied to an example where a used lens system 18 is not a dual-telecentric system as shown in FIG. 27 or, alternatively, the invention is applied to a case where a used lens system 18 shows aberration with respect to a light used for detection of positional deviation, it is preferable for improved precision that the angle of light emission of the first physical optic element 3L as well as the amount of aberration caused thereby are set such that (i) the chief ray of the light emanating from the lens system 18 and impinging on the second physical optic element 4W becomes perpendicular thereto; and that (ii) the expansion of the object point Q to the second physical optic element 4W due to the aberration is minimized, namely, the light is imaged at point Q with no aberration as a result of the combination of the lens system 18 having a certain aberration with the first physical optic element 3L arranged positively to present a specific aberration that cancels the aberration of the lens system 18.

Figure 28:
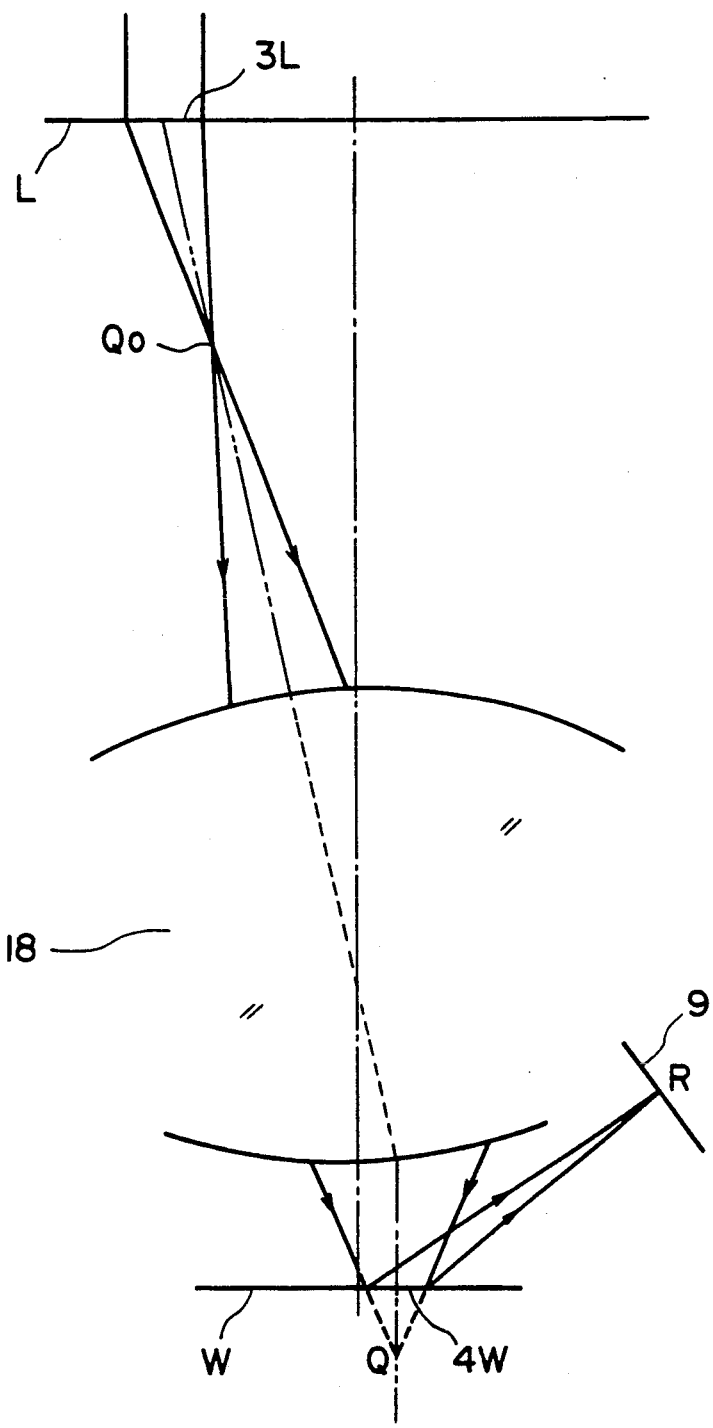
Figure 29:
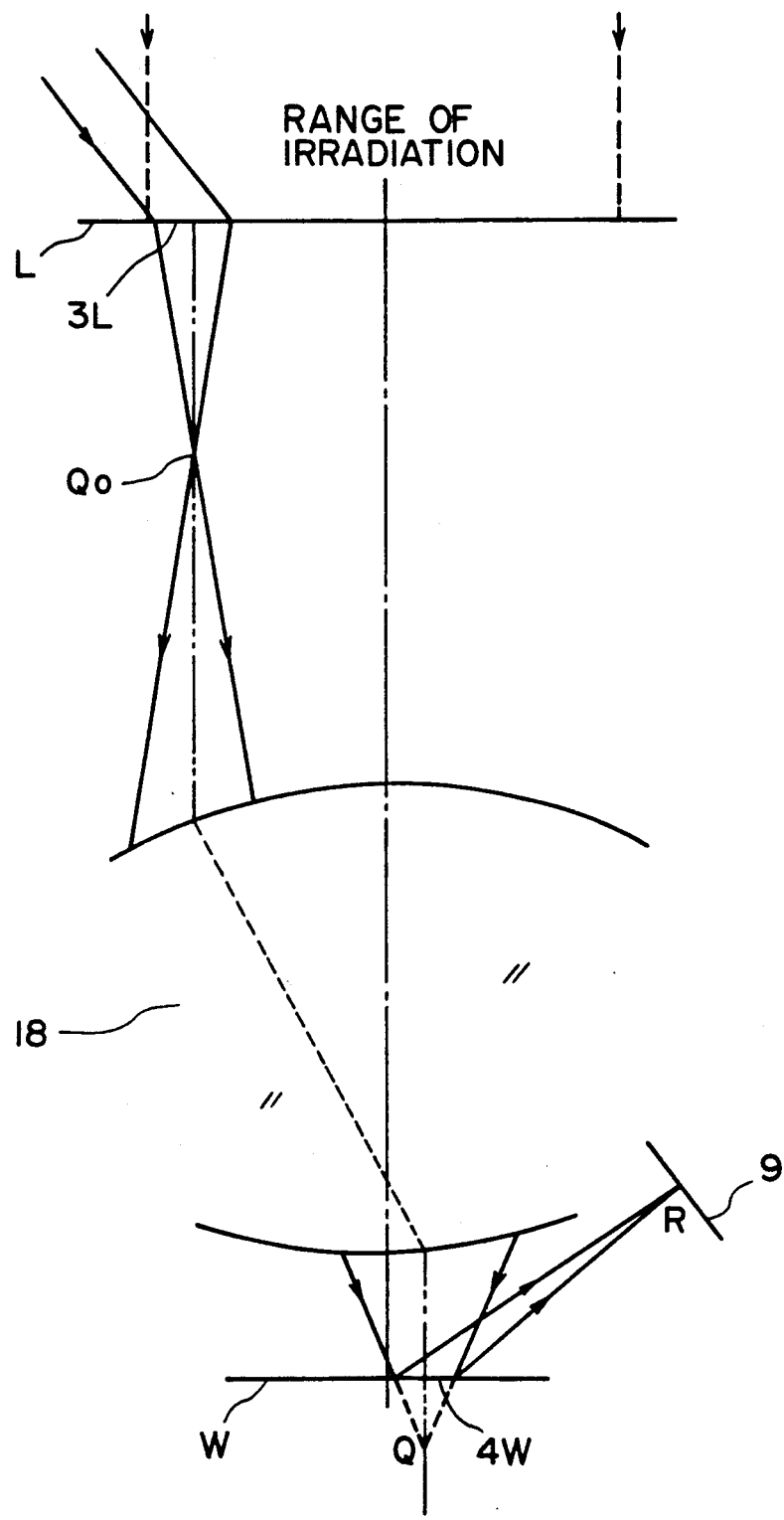

FIG. 29 shows another embodiment which is arranged so that a projection optical system of a first alignment pattern provided on a reticle L surface does not interfere with the path of exposure (range of irradiation) for the circuit pattern projection. To accomplish this, the light irradiating the first physical optic element 3L on the reticle L is projected thereupon at an incline as illustrated and, additionally, the first physical optic element 3L is provided by an element having a deflecting component as that used in the FIG. 28 embodiment. Thus, the chief ray emanating from the first physical optic element can advance substantially in parallel to an optical axis of the lens system 3. As a result, an arrangement similar to that shown in FIG. 27 is attainable.

Figure 30:
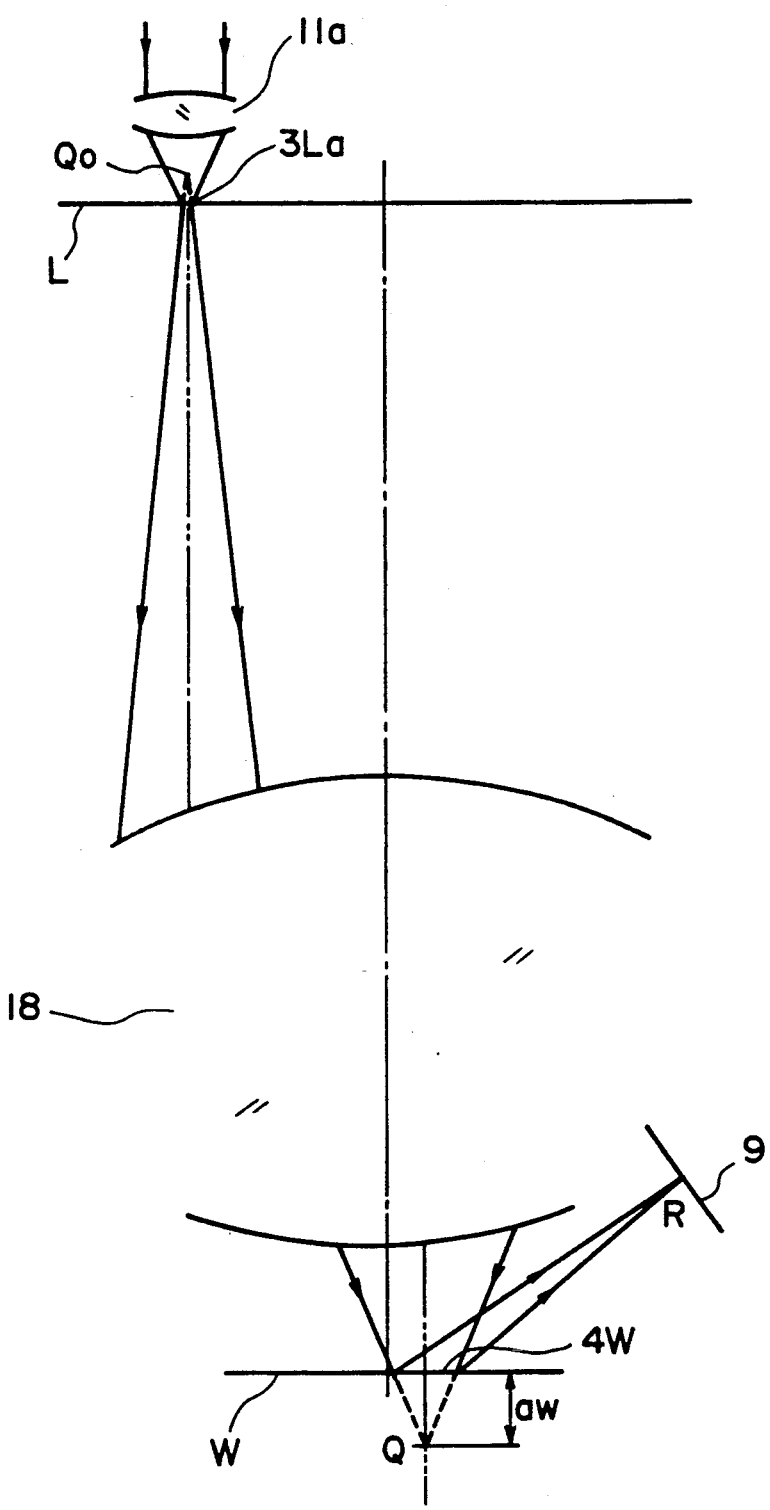

In the embodiments shown in FIGS. 24A-24C, 25A-25C, 26A-26C, and 27-29, a physical optic element such as a Fresnel zone plate is used as an alignment mark 3L provided in a portion of the reticle L surface. However, in another aspect of the present invention, it is possible to utilize on-axis chromatic aberration of a used lens system 18 which may remain in an occasion, for example, where a light used for the alignment and a light used for the exposure (pattern printing) have different wavelengths. For example, as shown in FIG. 30, a reticle L may be provided with a minute opening 3La. By projecting light to such opening, light can be focused at a point Q which is outside the wafer W surface. In this example, the minute opening functions as a concave lens for diverging the received light. In this example, a distance denoted at aw in FIG. 30 corresponds to the on-axis chromatic aberration. In this example, where the reduction lens system is such a lens system (called a "spheroachromat type") whose spherical aberration has been corrected both for the wavelength used for the pattern printing and for the wavelength used for the alignment, it is possible to obtain an aberration-free imaging point whose diameter (spot size) is substantially determined by the numerical aperture of the lens system 18 and whose position is determined by the position of the edge of the minute opening on the reticle L surface. The minute opening may be provided by patterning of the reticle or by forming a throughbore in the reticle.

If, as an example, the wavelength λ of the light used for the alignment is 0.83 micron; the numerical aperture (NA) of the lens system on the side facing the wafer is 0.5; and the imaging magnification is $-1/5$; then the size of the point image formed by the minute opening on the reticle surface is about 2 microns, in accordance with "1.22λ/NA" (Rayleigh's equation).

Therefore, by providing on the reticle L an aperture 3La of a size of about 1-5 microns, the minimum spot diameter as restricted by the expansion of the aperture can be reduced by the magnification of the lens system and, thus, it can be disregarded. As a result, the size of the spot Q can be made small to an order of about 2 microns. Also, the position of the point Q is defined at such position as determined by the imaging magnification of the lens system 18 which is determined in relation to the wavelength used for the alignment. As a result, similarly to the foregoing examples, the optical arrangement is such that the point Q is an object point which is re-imaged upon the detector 9 by means of the second physical optic element 4W on the wafer W surface.

Denoted at 11a in FIG. 30 is an illumination system which may be disposed, as required, for effectively projecting light upon the minute opening.

In these embodiments, provided that the angle of incidence of the projected light is determined and that the projected light has a substantially uniform illuminance distribution, basically the position of the point $Q_0$ (and thus the position of the point Q) is determined by the design specification of the first physical optic element, and it is not affected by a slight distribution change of the projected light. This is advantageous.

Figure 31:
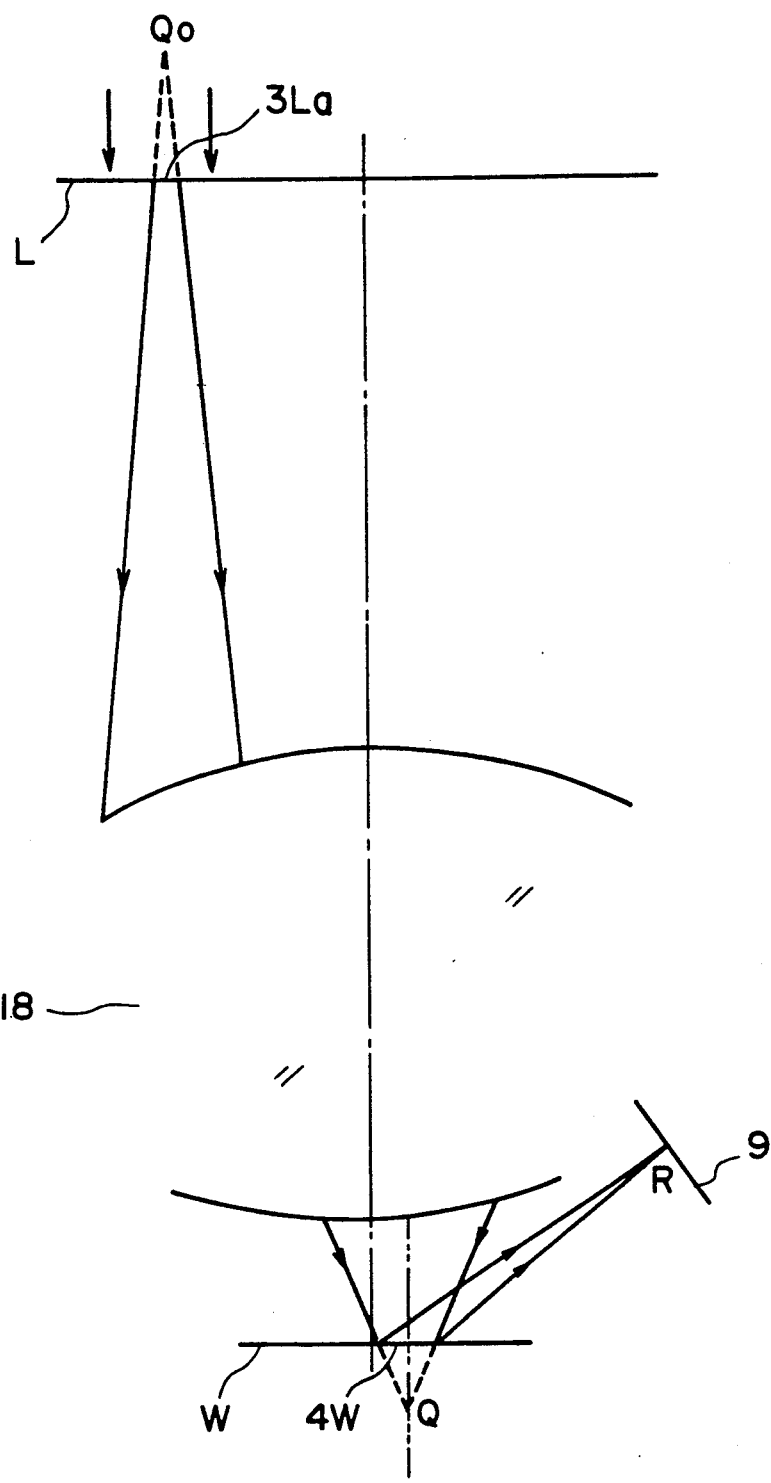

In the case where the alignment mark region of the first object surface can be constantly irradiated with a light of uniform illuminance distribution, it is possible to use, as alignment mark of the first object, such an aperture as having a slight expansion, as shown in FIG. 31. More specifically, similarly to the "concave-convex-concave system" or the "concave-convex-concave system" as illustrated in FIGS. 25A-25C and FIGS. 26A-26C, it is possible to define a light flux, with respect to a light flux diffracted by the edge of the aperture 3La, as if the point $Q_0$, which can be considered as an intersection of asymptote, exists. As a result, it is possible to form the point Q in a similar manner as in the foregoing examples and, for this reason, it is possible to form a point image R upon the detector 6 surface.

Figure 32:
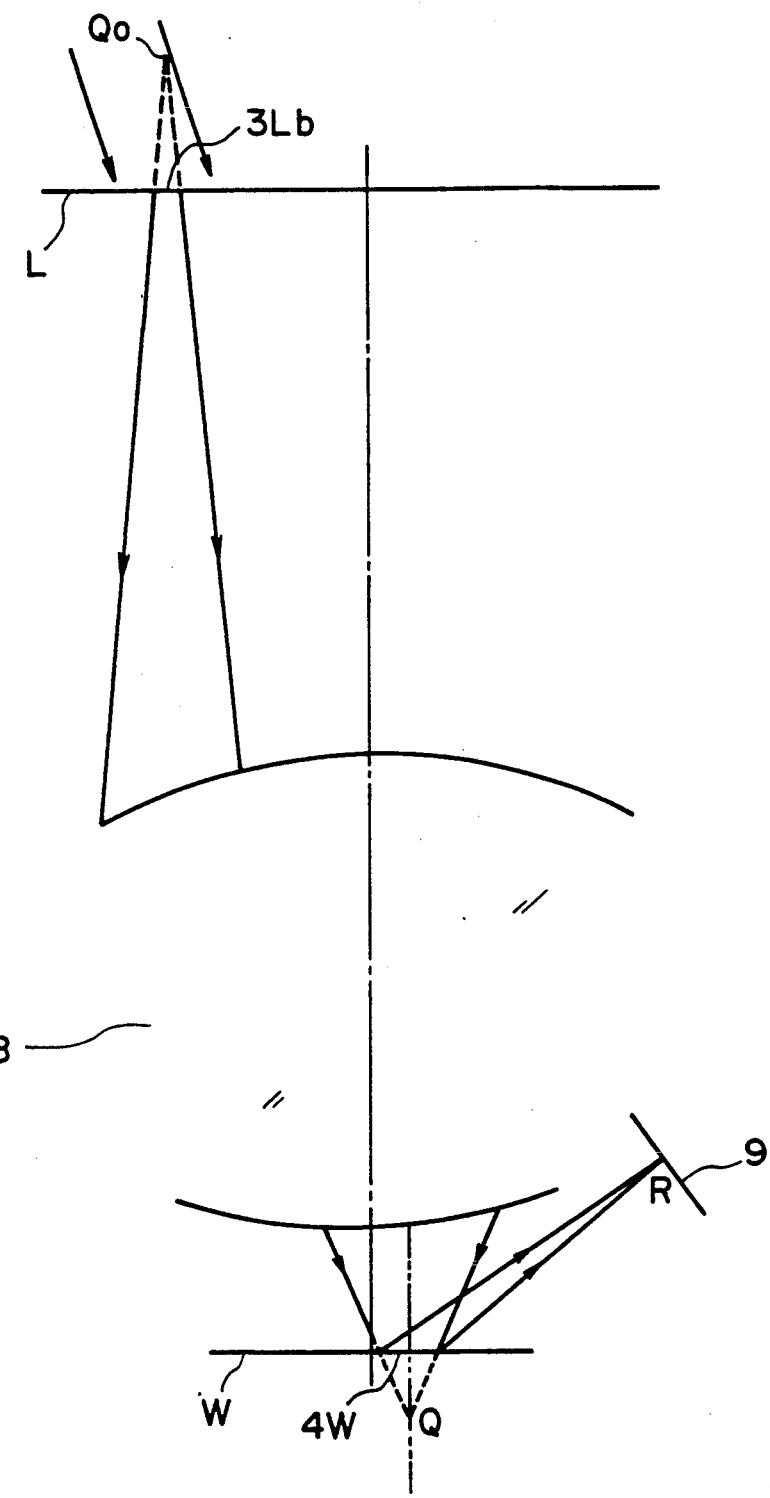

As a further alternative, as illustrated in FIG. 32, a diffraction grating having a light deflecting function may be used as a first alignment mark 3Lb on the first object L surface.

More specifically, in FIG. 32, reference character 3Lb denotes a diffraction grating formed by rectilinear patterns of regular intervals extending in a direction perpendicular to the sheet of the drawing. As illustrated, it functions to diffract a light, incident at an incline with respect to the optical axis of the lens system 18, in a direction parallel to the optical axis. In this example, the size of the diffraction grating 3Lb is sufficiently small, and it can function as a concave lens diverging a received light, similarly to the minute opening shown in FIG. 30. The remaining portion of this embodiment is substantially the same as the FIG. 30 embodiment.

In the embodiments shown in FIGS. 24A-32, a description has been made provided of an alignment system of what can be called a "TTL type" in which a pattern printing reduction projection lens system 18 is used as a condensing optical system 18. However, as exemplified in FIG. 33, separate lens portions 18a, 18b and 18c which can be considered as a unit with the lens system 18 (namely, no relative displacement of them to the lens system 18 occurs) may be used as a condensing optical system.

Figure 33:
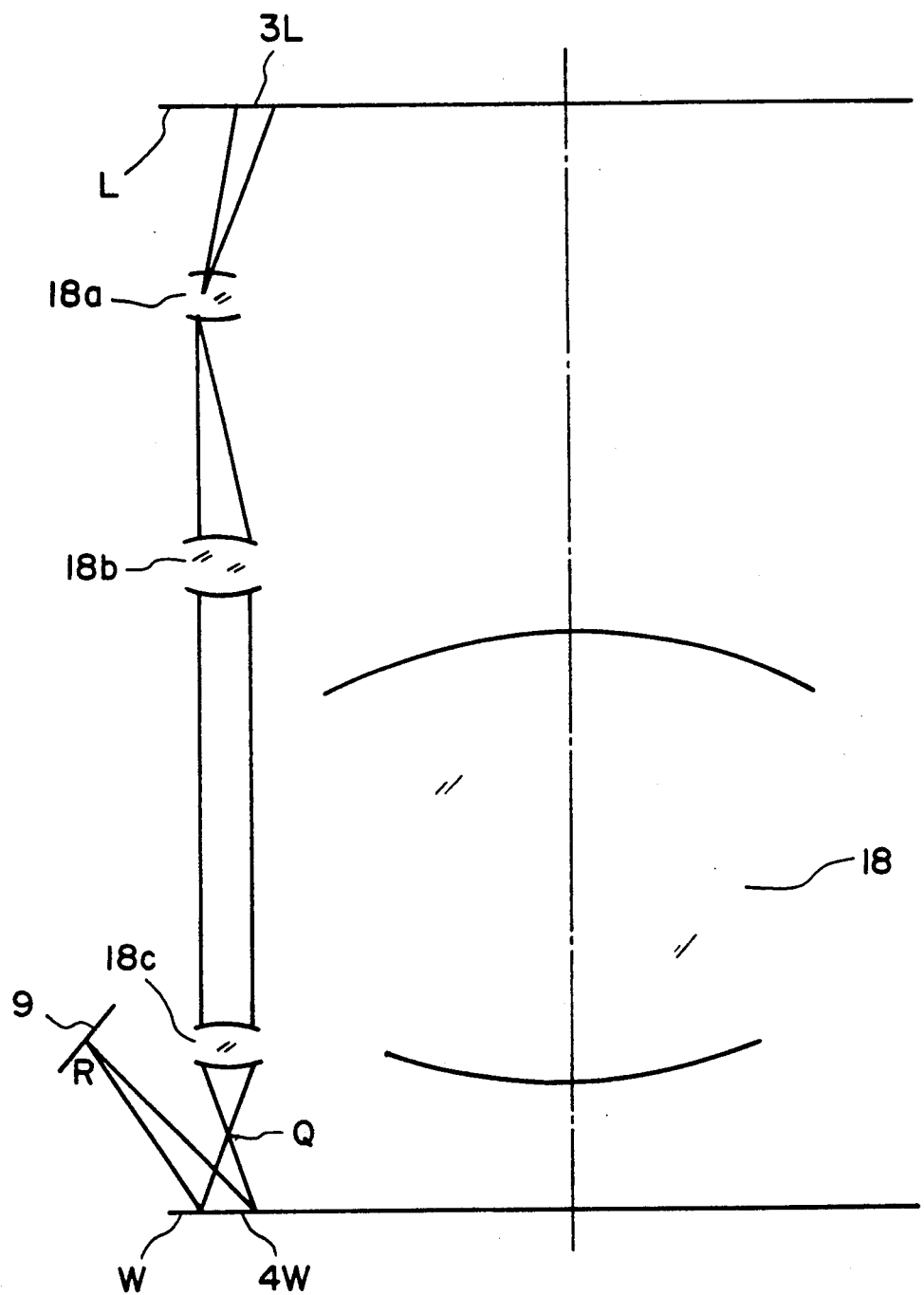

In the FIG. 33 embodiment, the light from an alignment pattern 3L of a reticle L is directed by way of these lens portions 18a, 18b and 18c to a second alignment pattern 4W on a wafer W.

By using the lens group 18a-18c which can be considered as a unit with the lens system 18, an image point Q of the point $Q_0$ is formed outside the wafer W, which point image is re-imaged by the second physical optic element 4W, with a result of similar advantageous effects.

Figure 34:
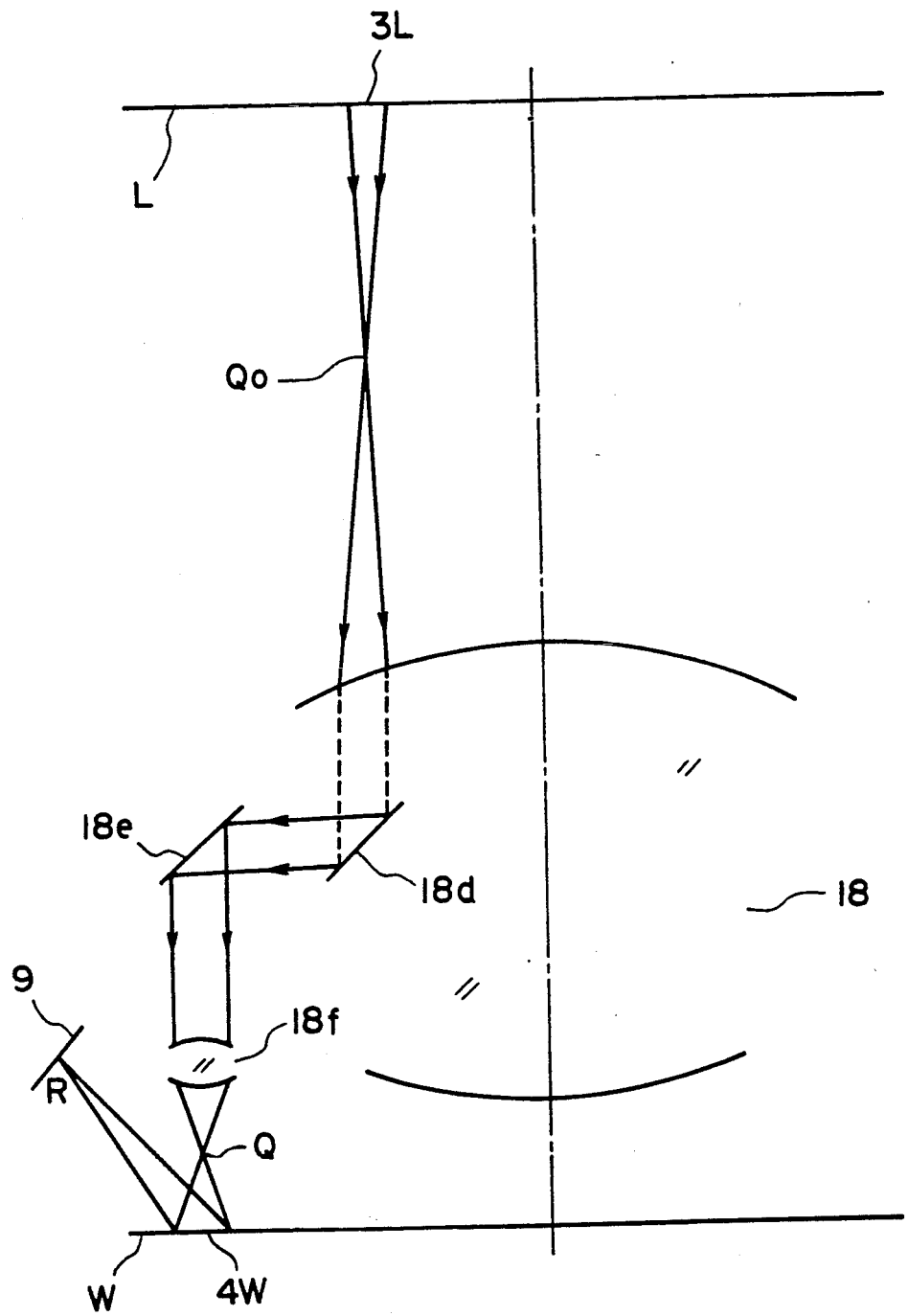

Further, as shown in FIG. 34, the optical arrangement may be modified so that a light from a first alignment pattern 3L of a reticle L first passes through a portion of a lens system 18 for the pattern printing and, subsequently, it is directed to a second alignment pattern 4W on a wafer W by way of separate optical components such as denoted at 18d, 18e and 18f.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting relative positional deviation between first and second objects, the method comprising the steps of:
    providing the first object with a first mark having an optical power;
    providing the second object with a second mark having an optical power;
    providing an optical system between the first and second objects;
    directing a radiation beam through the first mark and the optical system to the second mark; and
    detecting any shift of a radiation beam from the second mark irradiated with the radiation beam from the optical system, to detect the relative positional deviation of the first and second objects.

2. A method according to claim 1, wherein said detecting step comprises the step of detecting any shift of a radiation beam reflectively diffracted by the second mark to detect the relative positional deviation of the first and second objects.

3. A method according to claim 2, wherein said optical system providing step comprises the step of providing an optical system comprising a lens optical system.

4. A method according to claim 3, wherein said lens optical system providing step comprises the step of providing a lens optical system having a positive optical power.

5. A method according to claim 2, wherein said optical system providing step comprises the step of providing an optical system comprising a mirror optical system.

6. A method according to claim 5, wherein said mirror optical system providing step comprises the step of providing a mirror system having a positive optical power.

7. A method according to claim 2, wherein said first object providing step comprises the step of providing the first object with the first mark functioning as a convex lens, and wherein said second object providing step comprises the step of providing the second object with the second mark functioning as a concave lens.

8. A method according to claim 7, wherein said detecting step comprises the step of detecting any shift of a radiation beam reflectively diffracted by the second mark to detect the relative positional deviation of the first and second objects.

9. A method according to claim 8, wherein said optical system providing step comprises the step of providing an optical system comprising a lens optical system.

10. A method according to claim 9, wherein said lens optical system providing step comprises the step of providing as lens optical system having a positive optical power.

11. A method according to claim 7, wherein said optical system providing step comprises the step of providing an optical system comprising a lens optical system.

12. A method according to claim 11, wherein said lens optical system providing step comprises the step of providing a lens optical system having a positive optical power.

13. A method according to claim 7, wherein said optical system providing step comprises the step of providing an optical system comprising a mirror optical system.

14. A method according to claim 13, wherein said mirror optical system providing step comprises the step of providing a mirror optical system having a positive optical power.

15. A method according to claim 7, wherein said optical system providing step further comprises the step of providing an optical system having a positive optical power.

16. A method according to claim 1, wherein said optical system providing step comprises the step of providing an optical system comprising a lens optical system.

17. A method according to claim 16, wherein said lens optical system providing step comprises the step of providing a lens optical system having a positive optical power.

18. A method according to claim 1, wherein said optical system providing step comprises the step of providing an optical system comprising a mirror optical system.

19. A method according to claim 18, wherein said mirror optical system providing step comprises the step of providing a mirror optical system having a positive optical power.

20. A method according to claim 1, wherein said optical system providing step further comprises the step of providing an optical system having a positive optical power.

21. The method according to claim 1, wherein said first object providing step comprises the step of providing the first object with the first mark functioning as a concave lens, and wherein said second object providing step comprises the step of providing the second object with the second mark functioning as a convex lens.

22. A method according to claim 21, wherein said detecting step comprises the step of detecting any shift of a radiation beam reflectively diffracted by the second mark to detect the relative positional deviation of the first and second objects.

23. A method according to claim 22, wherein said optical system providing step comprises the step of providing an optical system comprising a lens optical system.

24. A method according to claim 23, wherein aid lens optical system providing step comprises the step of providing a lens optical system having a positive optical power.

25. A method according to claim 21, wherein said optical system providing step comprises the step of providing an optical system comprising a lens optical system.

26. A method according to claim 25, wherein said optical system providing step further comprises the step of providing an optical system having a positive optical power.

27. A method according to claim 21, wherein said optical system providing step further comprises the step of providing an optical system having a positive optical power.

28. A method according to claim 1, wherein said first and second providing steps comprise providing first and second objects, respectively, with first and second marks, respectively, both functioning as convex lenses.

29. A method according to claim 28, wherein said detecting step comprises the step of detecting any shift of a radiation beam reflectively diffracted by the second mark to detect the relative positional deviation of the first and second objects.

30. A method according to claim 29, wherein said optical system providing step comprises the step of providing an optical system comprising a lens optical system.

31. A method according to claim 30, wherein said lens optical system providing step comprises the step of providing a lens optical system having a positive optical power.

32. A method according to claim 28, wherein sad optical system providing step comprises the step of providing an optical system comprising a lens optical system.

33. A method according to claim 32, wherein said lens optical system providing step comprises the step of providing a lens optical system having a positive optical power.

34. A method according to claim 28, wherein said optical system providing step further comprises the step of providing an optical system having a positive optical power.

35. A method according to claim 1, wherein said first and second said object providing steps comprise the steps of providing the first and second objects, respectively, with first and second marks, respectively, both functioning as concave lenses.

36. A method according to claim 35, wherein said detecting step comprises the step of detecting any shift of a radiation beam reflectively diffracted by the second mark to detect the relative positional deviation of the first and second objects.

37. A method according to claim 36, wherein said optical system providing step comprises the step of providing an optical system comprising a lens optical system.

38. A method according to claim 37, wherein said lens optical system providing step comprises the step of providing a lens optical system having a positive optical power.

39. A method according to claim 35, wherein said optical system providing step comprises the step of providing an optical system comprising a lens optical system.

40. A method according to claim 39, wherein said lens optical system providing step comprises the step of providing a lens optical system having a positive optical power.

41. A method according to claim 35, wherein said optical system providing step further comprises the step of providing an optical system having a positive optical power.

42. A method usable in a proximity exposure apparatus for transferring a pattern provided on one of first and second objects onto the other, for detecting the relative position of the first and second objects, said method comprising:

a first step for providing on the first object a first physical optic element having a lens function;

a second step for providing on the second object a second physical optic element having a lens function;

a third step for irradiating the first physical optic element with light, the light irradiating the first physical optic element being influenced by the first physical optic element to be converged or diverged and the converging or diverging light entering the second physical optic element;

a fourth step for detecting light having been incident on the second physical optic element and having been influenced thereby to be converged or diverged, the detected light having been influenced by a convex-lens function by one of the first and second physical optic elements and having been influenced by a concave lens function by the other; ad a fifth step for detecting the relative position of the first and second objects, on the basis of the detection of the light.

43. A method according to claim 42, wherein the detected light is one having been influenced by a convex lens function by the first physical optic element and having been influenced by a concave lens function by the second physical optic element.

44. A method according to claim 42, wherein the detected light is one having been influenced by a concave lens function by the first physical optic element and having been influenced by a convex lens function by the second physical optic element.

45. A method according to claim 42, wherein at least one of the first and second physical optic elements comprises a Fresnel zone plate.

46. A method according to claim 42, wherein at least one of the first and second physical optic elements comprises a concave-surface mirror.

47. A device, usable in a proximity exposure apparatus for transferring a pattern formed on one of first and second objects onto the other, for detecting the relative position of the first and second objects in cooperation with first and second physical optic elements provided on the first and second objects, respectively, wherein each physical optic element has a lens function, said device comprising:

a holder for holding the first and second objects is proximity to each other;

light source means effective to project light upon the first physical optic element of the first object held b said holder, wherein the projected light is converged or diverged by the first physical optic element and impinges upon the second physical optic element of the second object held by said holder;

light detecting means for detecting the light converged or diverged as a result of the impingement upon the second physical optic element, said light detecting means being adapted to detect the light having been influenced by a convex lens function by one of the first and second physical optic elements and having been influenced by a concave lens function by the other; and position detecting means for detecting the relative position of the first and second objects on the basis of the detection by said light detecting means.

48. A device according to claim 47, wherein sad light detecting means detects a light having been influenced by a convex lens function by the first physical optic element and having been influenced by a concave lens function by the second physical optic element.

49. A device according to claim 47, wherein said light detecting means detects a light having been influenced by a concave lens function by the first physical optic element and having been influenced by a convex lens function by the second physical optic element.

50. A device according to claim 47, wherein displacement of light upon a light-receiving surface of said light detecting means has a magnification $\beta$ with respect to the amount of relative movement of the first and second objects, which magnification satisfies a relationship:

$$\beta = b_2/(d-b_1)+1$$

where $b_1$ is the distance to the first object from a point of convergence or an origin of divergence of light emanating from the first physical optic element, $b_2$ is the distance from the second object to the light-receiving surface of said light detecting means and d is the interval between the first and second objects held by said holder.

51. A method of detecting relative positional deviation between first and second objects, the method comprising the steps of:
providing the first object with a first mark which serves as a concave lens;
providing the second object with a second mark which serves as a convex lens;
directing a radiation beam through the first mark to the second mark; and
detecting any of the radiation beam from the second mark irradiated with the radiation beam, to detect the relative positional deviation of the first and second objects.

52. A method according to clam 51, wherein said detecting step for detecting any of the radiation beam comprises the step of detecting a beam reflected by the second mark.

53. A method according to claim 51, wherein said directing step comprises the step of directing a beam reflected by the first mark, to the second mark.

54. A method according to claim 51, wherein said directing step comprises the step of directing a substantially collimated beam to the first mark.

55. A method according to claim 51, wherein sad detecting step comprises the step of detecting a shift of the radiation beam.

56. A method of detecting relative positional deviation between first and second objects, the method comprising the steps of:
providing the first object with a first mark which serves as a convex lens;
providing the second object with a second mark which serves as a concave lens;
directing a radiation beam through the first mark to the second mark; and
detecting any of the radiation beams from the second mark irradiated with the radiation beam, to detect the relative positional deviation of the first and second objects.

57. A method according to calm 56, wherein said detecting step comprises the step of detecting a beam reflected by the second mark.

58. A method according to clam 56, wherein said directing step comprises the step of directing a beam reflected by the first mark, to the second mark.

59. A method according to claim 56, wherein said directing step comprises the step of directing a substantially collimated beam to the first mark.

60. A method according to claim 56, wherein said detecting step comprises the step of detecting a shift of the radiation beam.

61. An exposure apparatus for exposing a wafer to a pattern of a mask, wherein the mask and the wafer are provided with first and second alignment marks, respectively, each having an optical power, the first alignment mark having a positive optical power and the second alignment mark having a negative optical power, said apparatus comprising:
means for directing a radiation beam to the mask and the wafer;
means for detecting a shift of a portion of the radiation beam influenced by the positive and negative powers of the first and second alignment marks, respectively; and
means for adjusting the positional relationship between the mask and the wafer on the basis of the detecting by said detecting means.

62. An apparatus according to claim 61, wherein each of the first and second alignment marks comprises a Fresnel zone plate.

63. An apparatus according to claim 62, wherein the second alignment mark is adapted to reflectively diffract a received radiation beam.

64. An apparatus according o claim 61, wherein said detecting means includes a sensor for receiving a radiation beam from the marks and for producing a signal which corresponds to the position of incidence of the received radiation beam thereupon, and wherein said adjusting means adjusts the positional relationship in response to the signal.

65. An apparatus according to claim 64, wherein each of the first and second alignment marks comprises a Fresnel zone plate.

66. An apparatus according to claim 65, wherein the second alignment mark is adapted to reflectively diffract a received radiation beam.

67. An apparatus according to claim 64, wherein the second alignment mark is adapted to reflectively diffract a received radiation beam.

68. An apparatus according to claim 61, wherein said directing means directs a substantially collimated radiation beam to the mask.

69. An apparatus according to claim 68, wherein each of the first and second alignment marks comprises a Fresnel zone plate.

70. An apparatus according to claim 69, wherein the second alignment mark is adapted to reflectively diffract a received radiation beam.

71. An apparatus according to claim 68, wherein the second alignment mark is adapted to reflectively diffract a received radiation beam.

72. An apparatus according to claim 61, wherein said directing means and said detecting means comprise a common optical system.

73. An apparatus according to claim 72, wherein each of the first and second alignment marks comprises a Fresnel zone plate.

74. An apparatus according to claim 73, wherein the second alignment mark is adapted to reflectively diffract a received radiation beam.

75. An apparatus according to claim 72, wherein the second alignment mark is adapted to reflectively diffract a received radiation beam.

76. An apparatus according to claim 61, wherein the second alignment mark is adapted to reflectively diffract a received radiation beam.

77. An exposure apparatus for exposing a wafer to a pattern mask, wherein the mask and the wafer are provided with first and second alignment marks, respectively, each having an optical power, the first alignment mark having negative optical power, and the second alignment mark having a positive optical power, said apparatus comprising:

means for directing a radiation beam to the mask and the wafer;

means for detecting a shift of a potion of the beam influenced by the negative and positive powers of the first and second alignment marks, respectively; and means for adjusting the positional relationship between the mask and the wafer on the basis of the detecting by said detecting means.

78. An apparatus according to claim 77, wherein said each of the first and second alignment marks comprises a Fresnel zone plate.

79. An apparatus according to claim 78, wherein the second alignment mark is adapted to reflectively diffract a received radiation beam.

80. An apparatus according to claim 77, wherein the second alignment mark is adapted to reflectively diffract a received radiation beam.

81. An apparatus according to claim 77, wherein said detecting means includes a sensor for receiving a radiation beam from the marks and for producing a signal which corresponds to the position of incidence of the received radiation beam thereupon, and wherein said adjusting means adjusts the positional relationship in response to the signal.

82. An apparatus according to claim 81, wherein said each of the first and second alignment marks comprises a Fresnel zone plate.

83. An apparatus according to claim 82, wherein the second alignment mark is adapted to reflectively diffract a received radiation beam.

84. An apparatus according to claim 81, wherein the second alignment mark is adapted to reflectively diffract a received radiation beam.

85. An apparatus according to claim 77, wherein said directing means directs a substantially collimated radiation beam to the mask.

86. An apparatus according to clam 85, wherein said each of the first and second alignment marks comprises a Fresnel zone plate.

87. An apparatus according to claim 86, wherein the second alignment mark is adapted to reflectively diffract a received radiation beam.

88. An apparatus according to claim 85, wherein the second alignment mark is adapted to reflectively diffract a received radiation beam.

89. An apparatus according to claim 77, wherein said directing means and said detecting means comprise a common optical system.

90. An apparatus according to claim 89, wherein said each of the first and second alignment marks comprises a Fresnel zone plate.

91. An apparatus according to claim 90, wherein the second alignment mark is adapted to reflectively diffract a received radiation beam.

92. An apparatus according to claim 89, wherein the second alignment mark is adapted to reflectively diffract a received radiation beam.

93. A projection exposure apparatus for exposing a wafer to a pattern of a mask with radiation, wherein the mask has a first alignment mark having an optical power and the wafer has a second alignment mark having an optical power, said apparatus comprising:

a projection optical system for projecting an image of the pattern of the mask upon the wafer;

directing means for directing a radiation beam to the mask and the wafer, wherein the radiation beam advances between the mask and the wafer trough said projection optical system;

detecting means for detecting a shift of a portion of the radiation beam being influenced by the optical powers of the first and second alignment marks as well as a optical power of said projection optical system; and adjusting means for adjusting the positional relationship between the mask and the wafer on the basis of the detection by said detecting means.

94. An apparatus according to claim 93, wherein said detecting means includes a sensor for receiving said portion of the radiation beam and producing a signal corresponding to the position of incidence of said portion of the radiation beam upon said sensor, and wherein said adjusting means adjusts the positional relationship between the mask and the wafer in response to the produced signal.

95. An apparatus according to claim 93, wherein each of the first and second alignment marks comprises a zone plate pattern.

96. A semiconductor device manufacturing method based on exposing a wafer to a circuit pattern of a mask, said method comprising the steps of:

providing the mask and the wafer with first and second marks, respectively, each having an optical power;

illuminating the mask and the wafer whereby a beam is produced under the influence of a positive power of one of the first and second marks and a negative power of the other mark;

detecting a positional deviation between the mask and the wafer on the basis of the position of incidence of the produced beam upon a predetermined plane; and correcting the detected positional deviation and exposing the wafer to the circuit pattern of the mask.

97. A method according to claim 96, wherein each of the first and second marks comprises a zone plate pattern.

98. A method according to claim 96, wherein the first and second marks are so set as to produce a shift of the beam along said predetermined plane in response to a positional deviation between the mask and the wafer and at a predetermined magnification to the positional deviation.

99. A semiconductor device manufacturing method based on projection exposure for exposing a wafer to an image of a circuit pattern of a mask by using a projection optical system, said method comprising the steps of:

providing the mask and the wafer with first and second marks, respectively, each having an optical power;

illuminating the mask and the wafer whereby a beam is produced under the influence of the optical powers of the first and second marks as well as an optical power of the projection optical system;

detecting a positional deviation between the mask and the wafer on the basis of the position of incidence of the produced beam upon a predetermined plane; and correcting the detected positional deviation and exposing the wafer to the image of the circuit pattern of the mask.

100. A method according to claim 99, wherein each of the first and second marks comprises a zone plate pattern.

101. A method according to claim 99, wherein the first and second marks are so set as to produce a shift of the beam along said predetermined plane in response to a positional deviation between the mask and the wafer and at a predetermined magnification to the positional deviation.

102. A method of detecting the relative positional deviation between first and second objects, said method comprising the steps of:
providing the first object with a first mark having a negative optical power;
providing the second object with a second mark having a positive optical power;
directing a radiation beam through the first mark to the second mark; and
detecting a shift of a portion of the radiation beam influenced by the negative and positive powers of the fist and second marks, respectively, to detect the relative positional deviation of the first and second objects.

103. A method of detecting the relative positional deviation between first and second objects, said method comprising the steps of:
providing the first object with a first mark having a positive optical power;
providing the second object with a second mark having a negative optical power;
directing a radiation beam through the first mark to the negative optical power;
detecting a shift of a portion of the radiation beam influenced by the positive and negative powers of the first and second marks, respectively, to detect the relative positional deviation of the first and second objects.

104. A method of detecting the relative positional deviation between first and second objects, said method comprising the steps of:
providing the first object with a first mark having an optical power;
providing the second object with a second mark having an optical power;
providing an optical system between the first and second objects;
directing a radiation beam through the first mark and the optical system to the second mark; and
detecting any shift of a radiation beam from the second mark irradiated with the radiation beam from the optical system, to detect the relative positional deviation of the first and second objects.

105. A semiconductor device manufactured by a method of exposing a wafer to a circuit pattern of a mask, said method comprising the steps of:
providing the mask and the wafer with first and second marks, respectively, each having an optical power;
illuminating the mask and the wafer whereby a beam is produced under the influence of a positive power of one of the first and second marks and a negative power of the other of the first and second marks;
detecting the positional deviation between the mask and the wafer on the basis of the position of incidence of the produced beam upon a predetermined plane; and
correcting the detected positional deviation and exposing the wafer to the circuit pattern of the mask.

106. A semiconductor device manufactured by a method based on projection exposure for exposing a wafer to an image of a circuit pattern of a mask by using a projection optical system, said method comprising the steps of:
providing the mask and the wafer with first and second marks, respectively, each having an optical power;
illuminating the mask and the wafer whereby a beam is produced under the influence of the optical powers of the first and second marks as well as an optical power of the projection optical system;
detecting the positional deviation between the mask and the wafer on the basis of the position of incidence of the produced beam upon a predetermined plane; and
correcting the detected positional deviation and exposing the wafer to the circuit pattern of the mask.

107. A method of detecting the relative positional deviation between first and second objects in a predetermined direction perpendicular to the direction in which the first and second objects are opposed to each other, said method comprising the steps of:
providing the first object with a first lens having an optical power;
providing the second object with a second lens having an optical power;
directing a radiation beam through the first lens to the second lens; and
detecting any of the radiation beam from the second lens with a photoelectric sensor, and processing an electrical signal from the sensor to detect the relative positional deviation between the first and second objects in the predetermined direction.

108. A method according to claim 107, further comprising the step of aligning the first and second objects on the basis of the detected deviation.

109. A method according to claim 107, wherein at least one of the first and second lenses comprises a Fresnel zone plate.

110. A method according to claim 107, wherein at least one of the first and second lenses comprises a mirror having a concave mirror surface.

111. A method according to claim 107, further comprising the step of converging the radiation beam with the first lens at a point which is then imaged by the second lens upon one of the light receiving surface of the photoelectric sensor and a plane optically conjugate with the light receiving surface of the photoelectric sensor.

112. An exposure system, comprising;
holding means for holding a mask, having a first lens with an optical power, and a wafer having a second lens with an optical power, wherein the mask further has a pattern to be transferred to the wafer;
light source means for generating a radiation beam and directing the radiation beam through the first lens to the second lens;
detecting means having a photoelectric sensor for detecting any of the radiation beam from the second lens, and a signal processor communicating with the sensor to detect the relative positional deviation between the mask ad the wafer in a predetermined direction perpendicular to the direction in which the mask and the wafer are opposed to each other;

aligning means for aligning the mask and the wafer on the basis of the detected deviation between the mask and the wafer; and transferring means for transferring the pattern of the mask onto the wafer.

113. A system according to claim 112, wherein said transferring means is contributable to transfer, through exposure with radiation, the pattern of the mask to the wafer while the mask and the wafer are held in proximity to each other.

114. A system according to claim 112, wherein said transferring means includes a projection optical system through which the pattern of the mask is projected and transferred to the wafer.

115. A semiconductor device manufacturing method, comprising the steps of:

providing a mask with a first lens having an optical power;

providing a wafer with a second lens having an optical power;

directing a radiation beam through the first lens to the second lens;

detecting any of the radiation beam from the second lens by a photoelectric sensor, and processing an electrical signal from the sensor to detect the relative positional deviation between the mask and the wafer in a predetermined direction perpendicular to the direction in which the mask and the wafer are opposed to each other;

aligning the mask and the wafer on the basis of the detected deviation; and transferring the pattern of the mask onto the wafer.

* * * * *

UNITED STATES PATENT AND TRADEMARK OFFICE
CERTIFICATE OF CORRECTION

PATENT NO. : 5,319,444
DATED : June 7, 1994
INVENTOR(S) : KENJI SAITOH, et al.

It is certified that error appears in the above-indentified patent and that said Letters Patent is hereby corrected as shown below:

ON COVER PAGE:

At [56] Under Heading "OTHER PUBLICATIONS":
In the listing of the publication "Moire Pattern Resulting From Superposition of Two Zone Plates,", the author's name "Chau," should read --H. Chau,--.

COLUMN 3:
Line 1, "said" should read --the--.
Line 66, "of" should read --of the--.

COLUMN 7:
Line 5, "physical," should read --physical--.
Line 25, "$F_1=b_{1a}/m$" should read --$F_1=b_{1a}/M$--.

COLUMN 9:
Line 11, "$\delta$" should read --$\beta$--.
Line 18, "$\delta=[b_{2a}/(d-b_{1a})+1]$" should read --$\beta=[b_{2a}/(d-b_{1a})+1]$--.
Line 21, "where $a_{1a}$" should be deleted;
Lines 22-24, should be deleted.
Line 28, "$1/f_2=1/(d-b_{1a})+1/b_{2a}$" should read --$1/f_2=1/(d-b_{1a})+1/b_{2a}$ where $a_{1a}$ denotes the distance between the first physical optic element and an object point for the light impinging on the first physical optical element.--.
Line 35, "$\therefore f_1=b_{1a}$" should read --$\therefore f_1=b_{1a}$--.
Line 39, "$\delta=[b_{2a}/(d-f_1)+1].$" should read --$\beta=[b_{2a}/(d-f_1)+1].$--.

UNITED STATES PATENT AND TRADEMARK OFFICE
CERTIFICATE OF CORRECTION

PATENT NO. : 5,319,444
DATED : June 7, 1994
INVENTOR(S) : KENJI SAITOH, et al.

It is certified that error appears in the above-indentified patent and that said Letters Patent is hereby corrected as shown below:

COLUMN 10:
    Line 20, "spacing" should read --spacing,--.

COLUMN 11:
    Line 17, "$\sigma$." should read --$\theta$.--.
    Line 33, "where a is the" should be deleted.
    Lines 34-40, should be deleted.
    Line 41, "optical axis" should be deleted.
    Line 45, "$D/2b = tan\theta b$" should read
--$D/2b = tan\theta b$
        where a is the distance between the object point and the zone plate 51, b is the distance between the zone plate 51 and the image point, $\theta a$ is the angle that each light ray emanating from the object point and impinging on the zone plate 51 makes with respect to the optical axis, and $\theta b$ is the angle that each light ray emanating from the zone plate 51 and impinging on the image point makes with the optical axis.--.
    Line 66, "plates the" should read --plate as--.

COLUMN 12:
    Line 36, "7L" should read --$\pi$--.
    Line 42, "$\Delta\phi=\pi$" should read --"$\Delta\phi=\pi$".--.
    Line 65, "rom" should read --from--.
    Line 68, "th" should read --the--.

COLUMN 13:
    Line 50, "band 2" should read --band 2:--.

UNITED STATES PATENT AND TRADEMARK OFFICE
CERTIFICATE OF CORRECTION

PATENT NO. : 5,319,444
DATED : June 7, 1994
INVENTOR(S) : KENJI SAITOH, et al.

It is certified that error appears in the above-indentified patent and that said Letters Patent is hereby corrected as shown below:

COLUMN 15:
    Line 14, "$\Delta\delta b'(b_{2b}/a_{2b})\Delta\sigma b+\Delta\sigma b_2$" should read
        --$\Delta\delta b=(b_{2b}/a_{2b})\Delta\sigma b+\Delta\sigma b_2$--.
    Line 27, "magnification" should read --magnification $\beta$--.
    Line 47, "$\therefore f_1=b_{1b}$" should read --$\therefore f_1=b_{1b}$--.
    Line 49, "$\delta$" should read --$\beta$--.
    Line 50, "$\delta=[b_{2b}/(d-f_1)+1]$" should read
        --$\beta=[b_{2b}/(d-f_1)+1]$--.
    Line 64, "$\Delta\sigma c_1$" should read --$\Delta\sigma c$--.

COLUMN 16:
    Line 36, "$\therefore f_1=b_{1c}$" should read --$\therefore f_1=b_{1c}$--.

COLUMN 18:
    Line 19, "$\therefore f_1=b_{1b}$" should read --$\therefore f_1=b_{1b}$--.
    Line 64, "passing" should read --passing through--.

COLUMN 19:
    Line 38, "has" should read --has the--.

COLUMN 20:
    Line 5, "$\therefore f_1=b_{1c}$" should read --$\therefore f_1=b_{1c}$--.
    Line 44, "passing" should read --passing through--.

COLUMN 21:
    Line 9, "$\therefore f_1=b_{1a}$" should read --$\therefore f_1=b_{1a}$--.
    Line 28, "is" (2nd occurrence) should be deleted.

UNITED STATES PATENT AND TRADEMARK OFFICE
CERTIFICATE OF CORRECTION

PATENT NO. : 5,319,444
DATED : June 7, 1994
INVENTOR(S) : KENJI SAITOH, et al.

It is certified that error appears in the above-indentified patent and that said Letters Patent is hereby corrected as shown below:

COLUMN 22:
    Line 20, "significant" should read --significant.--.
    Line 25, "exposure." should read --exposure--.

COLUMN 27:
    Line 16, "can b" should read --can be--.

COLUMN 31:
    Line 61, "as" should read --a--.

COLUMN 32:
    Line 51, "aid" should read --said--.

COLUMN 33:
    Line 16, "sad" should read --said--.

COLUMN 34:
    Line 14, "ad" should read --and--.
    Line 42, "is" should read --in--.
    Line 46, "b" should read --by--.

COLUMN 35:
    Line 41, "sad" should read --said--.

UNITED STATES PATENT AND TRADEMARK OFFICE
CERTIFICATE OF CORRECTION

PATENT NO. : 5,319,444
DATED : June 7, 1994
INVENTOR(S) : KENJI SAITOH, et al.

It is certified that error appears in the above-indentified patent and that said Letters Patent is hereby corrected as shown below:

COLUMN 36:
    Line 67, "pattern" should read --pattern of a--.

COLUMN 38:
    Line 5, "trough" should read --through--.
    Line 10, "a" should read --an--.

COLUMN 39:
    Line 35, "the negative optical power;" should read --the second mark; and--.

COLUMN 40:
    Line 67, "ad" should read --and--.

Signed and Sealed this

Thirteenth Day of December, 1994

Attest:

BRUCE LEHMAN

*Attesting Officer*       *Commissioner of Patents and Trademarks*